(12) United States Patent
Sakakibara et al.

(10) Patent No.: US 11,838,672 B2
(45) Date of Patent: *Dec. 5, 2023

(54) SOLID-STATE IMAGING ELEMENT, IMAGING APPARATUS, AND CONTROL METHOD OF SOLID-STATE IMAGING ELEMENT

(71) Applicant: SONY SEMICONDUCTOR SOLUTIONS CORPORATION, Kanagawa (JP)

(72) Inventors: Masaki Sakakibara, Kanagawa (JP); Ryohei Kawasaki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/474,920

(22) Filed: Sep. 14, 2021

(65) Prior Publication Data

US 2021/0409637 A1    Dec. 30, 2021

Related U.S. Application Data

(63) Continuation of application No. 16/605,400, filed as application No. PCT/JP2018/014227 on Apr. 3, 2018, now Pat. No. 11,146,751.

(30) Foreign Application Priority Data

Apr. 25, 2017  (JP) ................................. 2017-086006
Jul. 19, 2017  (JP) ................................. 2017-139567

(51) Int. Cl.
*H04N 25/778*  (2023.01)
*H04N 25/48*   (2023.01)
(Continued)

(52) U.S. Cl.
CPC ........... *H04N 25/778* (2023.01); *H04N 25/48* (2023.01); *H04N 25/50* (2023.01); *H04N 25/772* (2023.01)

(58) Field of Classification Search
CPC .... H04N 5/37457; H04N 5/349; H04N 5/351; H04N 5/37455; H04N 5/345; H03M 1/56
See application file for complete search history.

(56) References Cited

U.S. PATENT DOCUMENTS 11,146,751 B2 * 10/2021 Sakakibara ............ H04N 25/50
2011/0134267 A1 *  6/2011 Ohya ...................... H04N 23/76
                                                           348/222.1

(Continued)

FOREIGN PATENT DOCUMENTS

CN    101562707 A    10/2009
CN    101998066 A    3/2011
(Continued)

OTHER PUBLICATIONS

International Search Report and Written Opinion of PCT Application No. PCT/JP2018/014227, dated Jun. 19, 2018, 08 pages of English Translation and 07 pages of ISRWO.

(Continued)

*Primary Examiner* — Lin Ye
*Assistant Examiner* — John H Morehead, III
(74) *Attorney, Agent, or Firm* — CHIP LAW GROUP

(57) ABSTRACT

A solid-state imaging element that detects address events captures high-quality images. The solid-state imaging element includes a pixel array section that has a plurality of pixels including a specific pixel arranged in a two-dimensional lattice pattern. The specific pixel includes a pixel circuit and two analog-digital converters. The pixel circuit outputs two analog signals proportional to an amount of charge produced by photoelectric conversion. The analog- (Continued)

digital converters convert the respective two analog signals into digital signals with different resolutions.

15 Claims, 42 Drawing Sheets

(51) Int. Cl.
*H04N 25/50* (2023.01)
*H04N 25/772* (2023.01)

(56) References Cited

U.S. PATENT DOCUMENTS

| | | | | |
|---|---|---|---|---|
| 2013/0308031 | A1* | 11/2013 | Theuwissen | H04N 25/75 |
| | | | | 348/308 |
| 2014/0160334 | A1* | 6/2014 | Wakabayashi | H04N 25/75 |
| | | | | 348/308 |
| 2014/0320712 | A1* | 10/2014 | Kobayashi | H04N 25/771 |
| | | | | 348/301 |
| 2015/0076325 | A1* | 3/2015 | Higuchi | H04N 25/60 |
| | | | | 327/134 |
| 2015/0181149 | A1* | 6/2015 | Awatani | H04N 23/667 |
| | | | | 348/308 |
| 2015/0194973 | A1* | 7/2015 | Furuta | H04N 25/767 |
| | | | | 341/122 |
| 2015/0350585 | A1* | 12/2015 | Kim | H04N 25/75 |
| | | | | 348/308 |
| 2018/0013412 | A1 | 1/2018 | Kikuchi et al. | |
| 2018/0027192 | A1 | 1/2018 | Morisaki | |
| 2019/0273883 | A1* | 9/2019 | Sakakibara | H04N 25/533 |

FOREIGN PATENT DOCUMENTS

| | | |
|---|---|---|
| CN | 103782587 A | 5/2014 |
| CN | 104767525 A | 7/2015 |
| CN | 110546945 A | 12/2019 |
| JP | 2011-120087 A | 6/2011 |
| WO | 2016/129408 A1 | 8/2016 |
| WO | 2016/136448 A1 | 9/2016 |

OTHER PUBLICATIONS

International Preliminary Report on Patentability of PCT Application No. PCT/JP2018/014227, dated Nov. 7, 2019, 09 pages of English Translation and 05 pages of IPRP.
Non-Final Office Action for U.S. Appl. No. 16/605,400, dated Feb. 19, 2021, 08 pages.
Notice of Allowance for U.S. Appl. No. 16/605,400, dated Jun. 14, 2021, 10 pages.
Office Action for CN Patent Application No. 201880025947.4, dated Aug. 2, 2021, 06 pages of Office Action and 07 pages of English Translation.

* cited by examiner

FIG.11
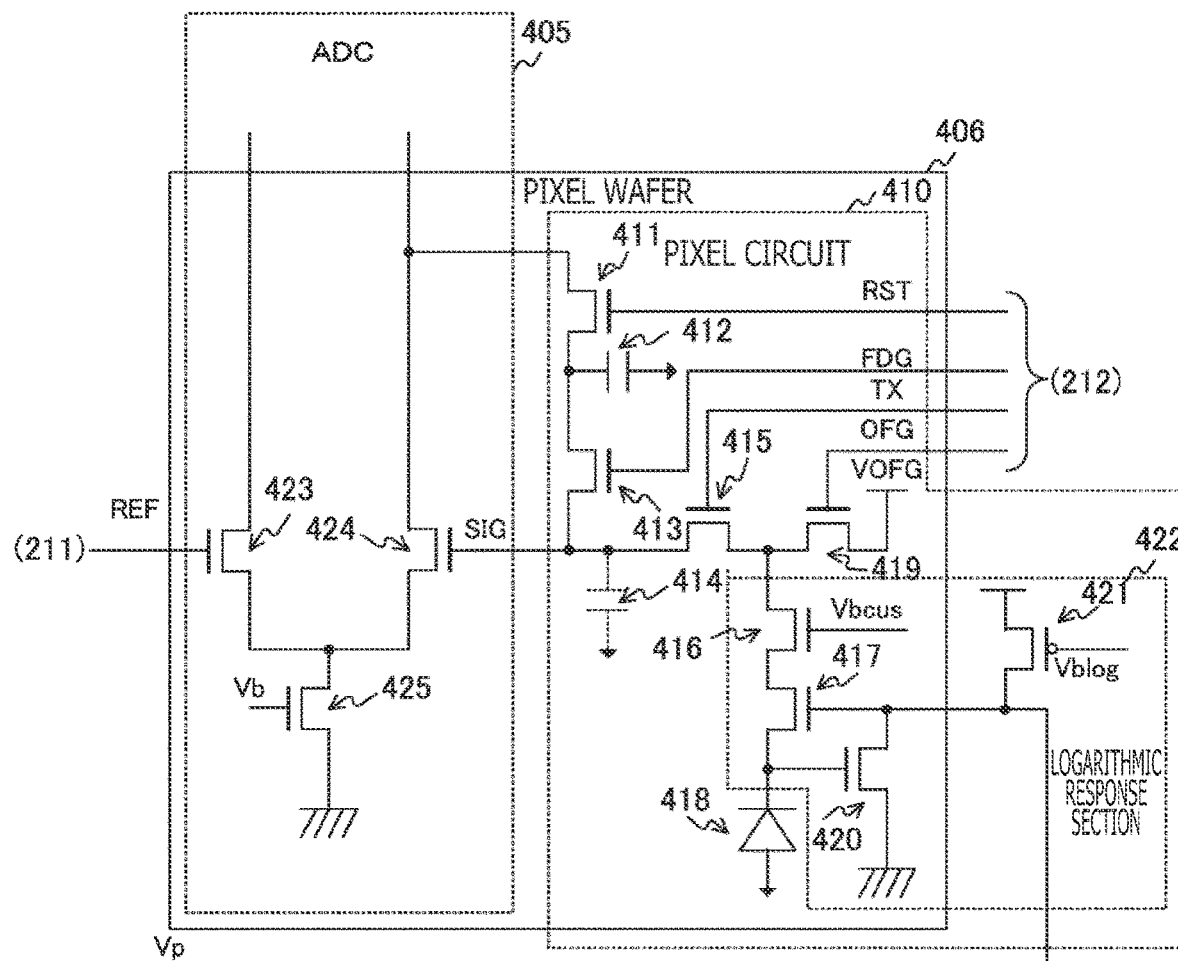
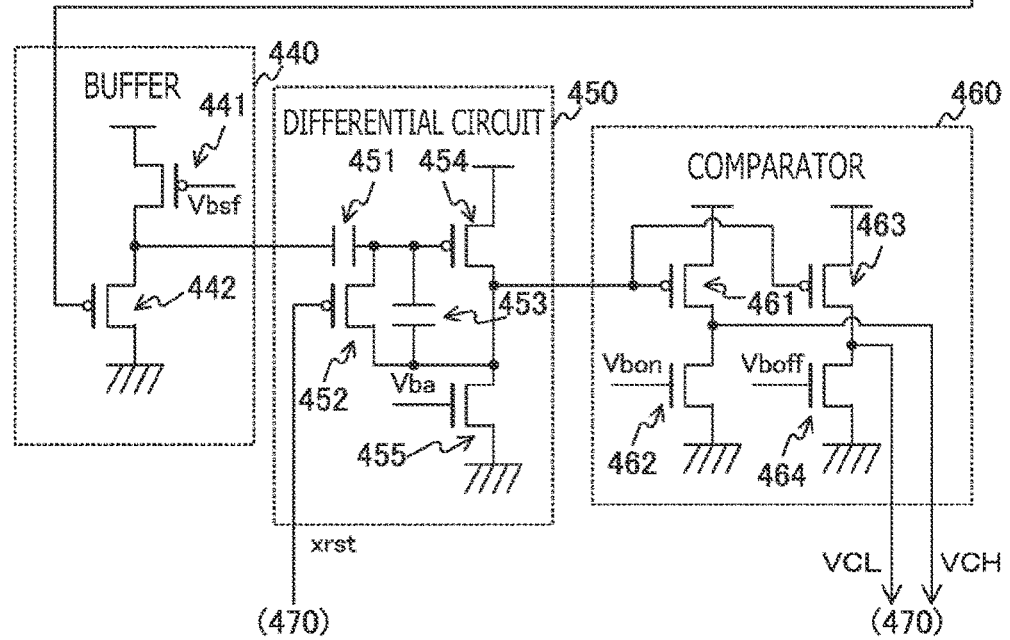

SOLID-STATE IMAGING ELEMENT, IMAGING APPARATUS, AND CONTROL METHOD OF SOLID-STATE IMAGING ELEMENT

CROSS REFERENCE TO RELATED APPLICATIONS

This application is a continuation application of U.S. patent application Ser. No. 16/605,400, filed Oct. 15, 2019, which is a U.S. National Phase of International Patent Application No. PCT/JP2018/014227 filed Apr. 3, 2018, which claims priority benefit of Japanese Patent Application No. JP 2017-139567 filed in the Japan Patent Office on Jul. 19, 2017 and also claims priority benefit of Japanese Patent Application No. JP 2017-086006 filed in the Japan Patent Office on Apr. 25, 2017. Each of the above-referenced applications is hereby incorporated herein by reference in its entirety.

TECHNICAL FIELD

The present technology relates to a solid-state imaging element, an imaging apparatus, and a control method of the solid-state imaging element. More specifically, the present technology relates to a solid-state imaging element, an imaging apparatus, and a control method of the solid-state imaging element that detects address events.

BACKGROUND ART

In the past, synchronous solid-state imaging elements that capture image data (frames) in synchronism with a synchronizing signal such as vertical synchronizing signal have found common application in imaging apparatuses. Such common synchronous solid-state imaging apparatuses can acquire image data only at intervals of a synchronizing signal (e.g., every 1/60 of a second). This makes it difficult to respond to cases requiring faster processing in fields related to traffic, robotics, and so on. For this reason, an asynchronous solid-state imaging element has been proposed that includes an address event representation (AER) circuit for detecting address events (refer, for example, to NPL 1). Here, an address event refers to the fact that an amount of light of a pixel varies at a certain pixel address and the variation thereof exceeds a threshold. This address event includes an ON event that indicates that the amount of light of the pixel has changed and exceeded a given upper limit and an OFF event indicating that the amount of light thereof has changed and fallen below a given lower limit. In the asynchronous solid-state imaging element, two-bit data including a one-bit ON event detection result and a one-bit OFF event detection result is generated for each pixel. An image data format representing the presence or absence of each of an ON event and an OFF event for each pixel using two-bit data as described above is called AER format.

CITATION LIST

Non Patent Literature

[NPL 1]
Patrick Lichtsteiner, et al., A 128 128 120 dB 15 μs Latency Asynchronous Temporal Contrast Vision Sensor, IEEE JOURNAL OF SOLID-STATE CIRCUITS, VOL. 43, NO. 2, FEBRUARY 2008.

SUMMARY

Technical Problem

The above asynchronous solid-state imaging element is capable of generating and outputting data significantly faster than synchronous solid-state imaging elements. For example, in the field of traffic, therefore, a process of recognizing humans and obstacles through image recognition can be carried out fast to enhance safety. However, the above address event representation circuit is capable of generating only two-bit data for each pixel, thus resulting in degraded image quality as compared with synchronous solid-state imaging elements. In order to generate image data at higher quality while detecting address events, both an asynchronous solid-state imaging element and a synchronous solid-state imaging element should be provided. However, it is not desirable to do so due to increase in size, parts count, and cost. Thus, a solid-state imaging element that detects address events has a problem in that it is difficult to acquire a high-quality image.

The present technology has been devised in light of the foregoing, and it is an object of the present technology to capture high-quality images with a solid-state imaging element that detects address events.

Solution to Problem

The present technology has been devised to solve the above problem, and a first aspect thereof is a solid-state imaging element and a control method thereof. The solid-state imaging element includes a pixel array section. The pixel array section has a plurality of pixels including a specific pixel arranged in a two-dimensional lattice pattern. The specific pixel includes a pixel circuit and two analog-digital converters. The pixel circuit outputs two analog signals proportional to an amount of charge produced by photoelectric conversion. The analog-digital converters convert the respective two analog signals into digital signals with different resolutions. This provides an advantageous effect of converting each of the two analog signals into a digital signal with a different resolution.

Also, in the first aspect, the analog-digital converter with a lower resolution of the two analog-digital converters may detect, as an address event, that a variation in the above amount of charge has exceeded a given threshold on the basis of the analog signals. This provides an advantageous effect of detecting an address event.

Also, in the first aspect, only one analog-digital converter may be provided in each of the pixels of the above pixel array section not corresponding to the specific pixel. This provides an advantageous effect of detecting an address event in the specific pixel of the plurality of pixels.

Also, the above pixel circuit in the first aspect may include a photoelectric conversion section, a current-voltage conversion section, a charge accumulation section, a discharge transistor, a transfer transistor, and an amplifying transistor. The photoelectric conversion section converts light into the charge. The current-voltage conversion section generates one of the above two analog signals through current-voltage conversion on the above photocurrent flowing through the photoelectric conversion section. The charge accumulation section accumulates the charge. The discharge transistor discharges the charge from the photoelectric conversion section when the exposure period starts. The transfer transistor transfers the charge from the photoelectric conversion section to the charge accumulation section when the exposure period ends. The amplifying transistor amplifies a voltage in the floating diffusion layer and outputs the amplified voltage as an other of the two analog signals. This provides an advantageous effect of causing the charge to be discharged when the exposure starts and transferring the charge when the exposure ends.

Also, in the first aspect, the analog-digital conversion section may be connected to a terminal having a given ground potential, and a potential lower than the given ground potential may be applied to a board having the floating diffusion layer and the photoelectric conversion section. This provides an advantageous effect in that charge is less likely to overflow in the floating diffusion layer and the photoelectric conversion section.

Also, in the first aspect, the pixel circuit may further include a reset transistor that initializes the voltage of the charge accumulation section to a reset level before the end time. The pixel signal may include a signal level when the reset level and the charge are transferred, and the digital signals may include reset data acquired by converting the reset level and signal data acquired by converting the signal level. This provides an advantageous effect of outputting data acquired by converting the reset level and data acquired by converting the signal level.

Also, in the first aspect, a correlated double sampling circuit may be further provided that finds a difference between the reset data and the signal data and outputs the difference as pixel data. This provides an advantageous effect of reducing fixed pattern noise and other noise.

Also, in the first aspect, the analog-digital converters may hold the reset data and output, when the signal level is converted, the reset data and the signal data in sequence to the correlated double sampling circuit. This provides an advantageous effect of suppressing impact of dark current.

Also, in the first aspect, the pixel signal may include first and second reset levels and first and second signal levels, and each of the analog-digital converters may include a comparison section and a data storage section. The comparison section compares a given reference signal having a slope and the pixel signal and outputs a comparison result. The data storage section stores data including each of the comparison results as the digital signal. An inclination of the slope for comparing each set of the second reset level and the first signal level may be flatter than the inclination of the slope for comparing each set of the first reset level and the second signal level. This provides an advantageous effect of generating two pieces of image data having different resolutions.

Also, in the first aspect, a drive circuit may be further provided that causes the pixel circuit to generate the first reset level and the second signal level at a given sensitivity and causes the pixel circuit to generate the second reset level and the first signal level at a sensitivity different from the given sensitivity. This provides an advantageous effect of generating two pieces of image data having different resolutions.

Also, in the first aspect, the analog-digital converter with a lower resolution of the two analog-digital converters may include a differential circuit, a comparator, and a handshake circuit. The differential circuit holds the voltage signal. The comparator compares the held voltage signal and the threshold in the given range and outputs a result of the comparison. The handshake circuit sends a request when the address event is detected and initializes the differential circuit when an acknowledgement to the request is received. This provides an advantageous effect of transferring an address event detection result through handshaking.

Also, in the first aspect, an arbiter can be further provided that arbitrates the requests and returns an acknowledgement on the basis of a result of the arbitration. This provides an advantageous effect of avoiding a collision between address events.

Also, in the first aspect, a test circuit and a redundant circuit can be further provided. The test circuit outputs a time-of-day code having a given number of bits to one of the two analog-digital converters and detects whether or not there is any fault in each bit of the time-of-day code. The redundant circuit connects a spare signal line in place of a bit line corresponding to the faulty bit in the time-of-day code. The analog-digital converter can convert the pixel signal into the digital signal by using the time-of-day code. This provides an advantageous effect of improving reliability of the solid-state imaging element.

Also, in the first aspect, first and second data storage sections, first and second bidirectional buffers, a column processing section, and a drive circuit can be further provided. The first and second data storage sections hold the different digital signals. The first bidirectional buffer outputs the digital signal, transferred from the first data storage section via a first local bit line, to a main bit line in accordance with a first control signal. The second bidirectional buffer outputs the digital signal, transferred from the second data storage section via a second local bit line, to the main bit line in accordance with a second control signal. The column processing section reads out the digital signals via the main bit line. The drive circuit controls the first data storage section to transfer the digital signal to the first bidirectional buffer via the first local bit line as a first digital signal. The drive circuit also controls the second data storage section to transfer the digital signal to the second bidirectional buffer via the second local bit line as a second digital signal before the readout of the first digital signal is complete. This provides an advantageous effect of transferring the second digital signal to the second bidirectional buffer before the readout of the first digital signal is complete.

Also, a second aspect of the present technology is an imaging apparatus that includes a pixel array section and a digital signal processing section. The pixel array section has a plurality of pixels including a specific pixel arranged in a two-dimensional lattice pattern. The specific pixel includes a pixel circuit and two analog-digital converters. The pixel circuit outputs two analog signals proportional to an amount of charge produced by photoelectric conversion. The analog-digital converters convert the respective two analog signals into digital signals with different resolutions. This has an advantageous effect of converting each of the two analog signals into a digital signal with a different resolution. The digital signal processing section processes image data that includes the digital signals. This provides an advantageous effect of converting the two analog signals into digital signals with different resolutions and processing the image data in synchronism with a synchronizing signal.

Advantageous Effect of Invention

According to the present technology, it is possible to achieve an excellent effect of capturing a high-quality image with a solid-state imaging element that detects address events. It should be noted that the effect described here is not necessarily restrictive and may be any of the effects described in the present disclosure.

BRIEF DESCRIPTION OF DRAWINGS

FIG. 11 is a circuit diagram illustrating a configuration example of the W pixel in the first embodiment of the present technology.

DESCRIPTION OF EMBODIMENTS

A description will be given below of modes for carrying out the present technology (hereinafter referred to as embodiments). The description will be given in the following order:

1. First embodiment (example in which pixel signals are AD converted while detecting an address event)
2. Second embodiment (example in which AD conversion is performed at short sampling intervals while detecting an address event)
3. Third embodiment (example in which pixel signals are AD converted while detecting an address event in a stacked solid-state imaging element)
4. Application example to a mobile body

1. First Embodiment (Configuration Example of the Imaging Apparatus)

Figure 1:
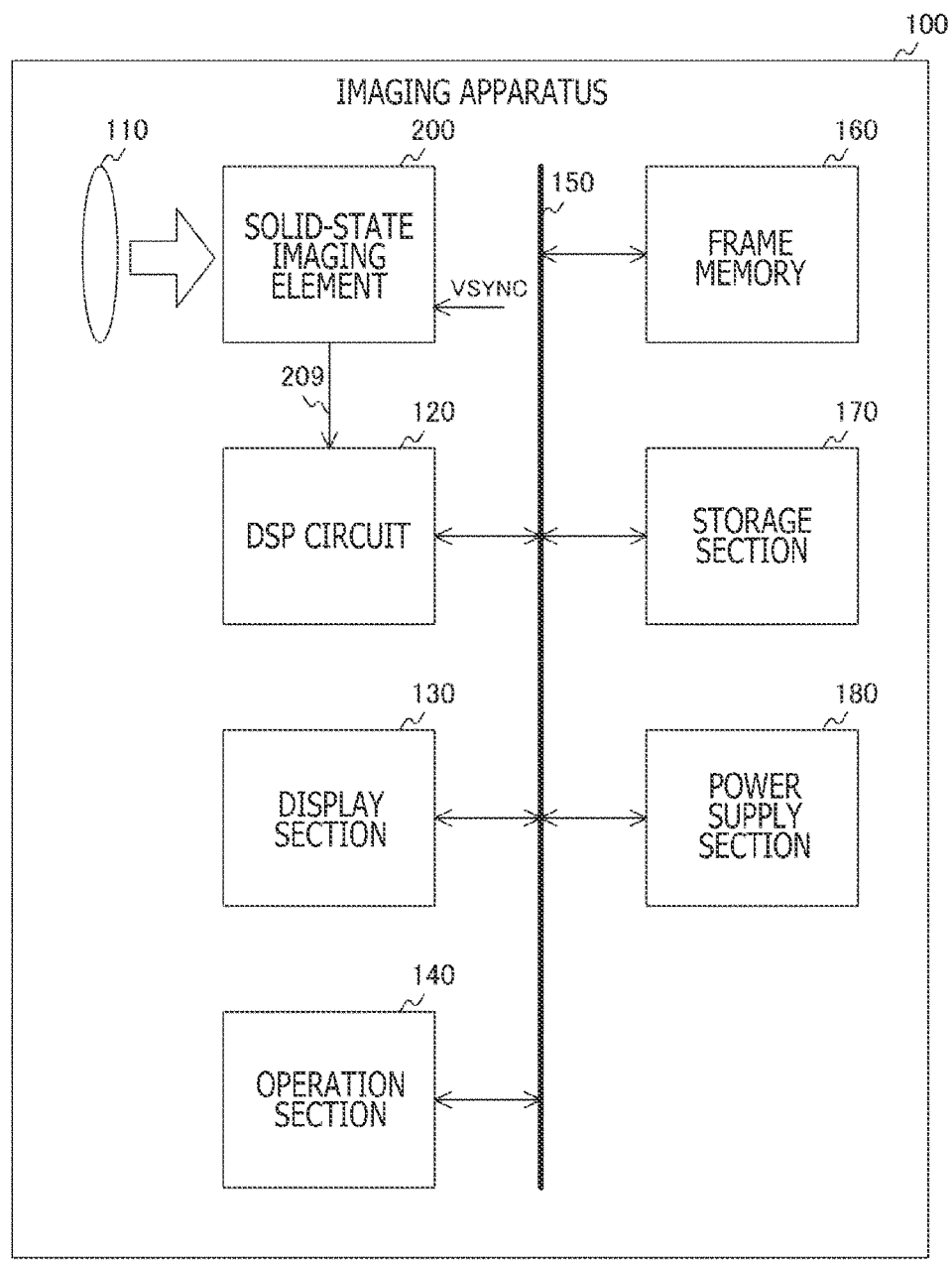
FIG. 1 is a block diagram illustrating a configuration example of an imaging apparatus in a first embodiment of the present technology.

FIG. 1 is a block diagram illustrating a configuration example of an imaging apparatus 100 in a first embodiment of the present technology. The imaging apparatus 100 is used to capture image data and includes an optical section 110, a solid-state imaging element 200, and a DSP (Digital Signal Processing) circuit 120. Further, the imaging apparatus 100 includes a display section 130, an operation section 140, a bus 150, a frame memory 160, a storage section 170, and a power supply section 180. For example, not only digital cameras such as digital still camera but also smartphone having an imaging function, personal computer, and vehicle-mounted camera are possible for use as the imaging apparatus 100.

The optical section 110 focuses light from a subject and guides the light onto the solid-state imaging element 200. The solid-state imaging element 200 generates image data through photoelectric conversion in synchronism with a vertical synchronizing signal VSYNC. Here, the vertical synchronizing signal VSYNC is a periodic signal at a given frequency that indicates an imaging timing. The solid-state imaging element 200 supplies the generated image data to the DSP circuit 120 via a signal line 209.

The DSP circuit 120 performs given signal processing on the image data from the solid-state imaging element 200. The DSP circuit 120 outputs the processed image data to the frame memory 160 and other sections via the bus 150. It should be noted that the DSP circuit 120 is an example of a digital signal processing section recited in claims.

The display section 130 displays image data. For example, a liquid crystal panel and an organic EL (Electro Luminescence) panel are possible for use as the display section 130. The operation section 140 generates an operation signal in accordance with user operation.

The bus 150 is a common channel that allows the optical section 110, the solid-state imaging element 200, the DSP circuit 120, the display section 130, the operation section 140, the frame memory 160, the storage section 170, and the power supply section 180 to exchange data with each other.

The frame memory 160 holds image data. The storage section 170 stores a variety of pieces of data such as image data. The power supply section 180 supplies power to the solid-state imaging element 200, the DSP circuit 120, and the display section 130.

(Configuration Example of the Solid-State Imaging Element)

Figure 2:
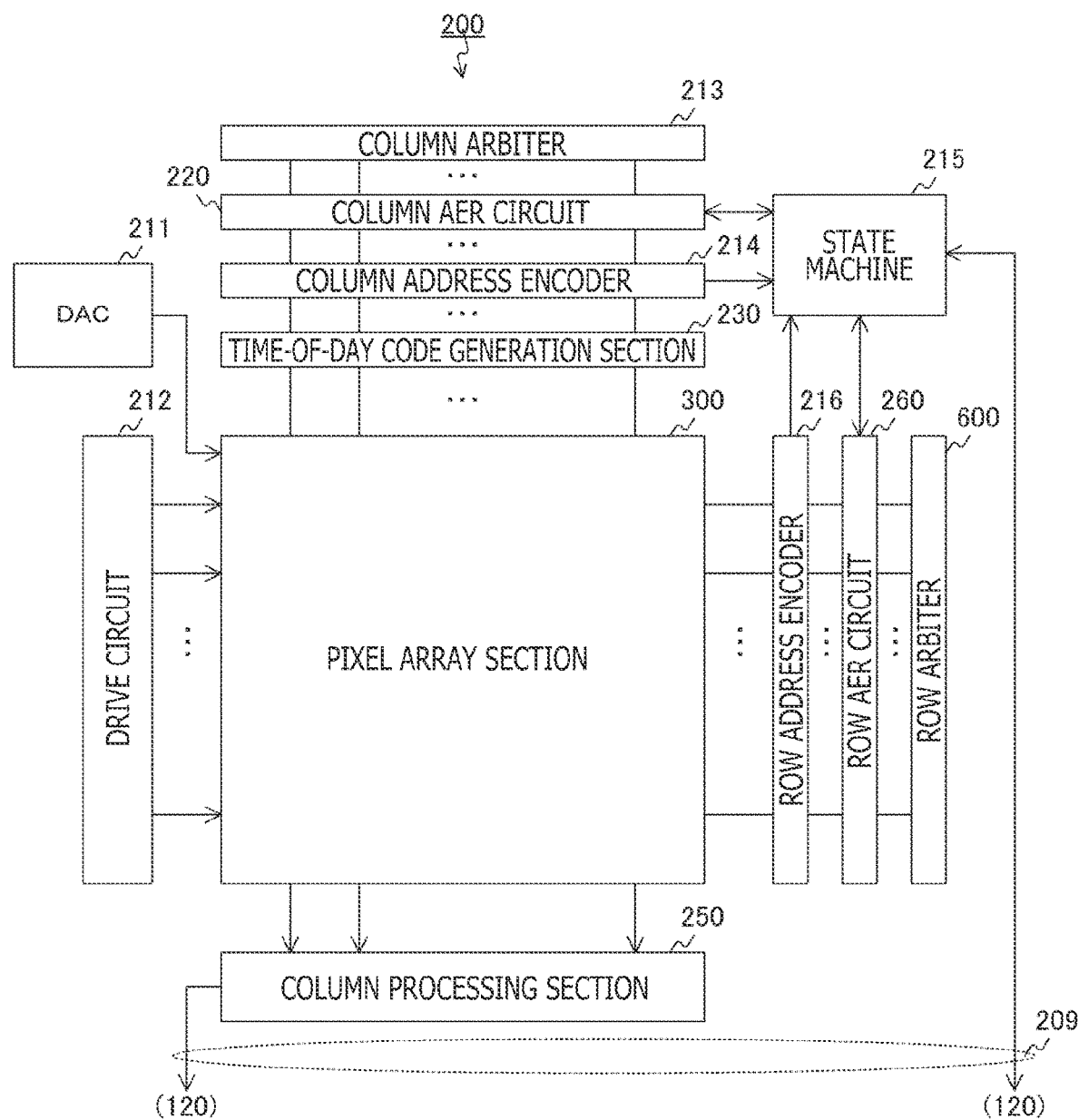
FIG. 2 is a block diagram illustrating a configuration example of a solid-state imaging element in the first embodiment of the present technology.

FIG. 2 is a block diagram illustrating a configuration example of the solid-state imaging element 200 in the first embodiment of the present technology. The solid-state imaging element 200 includes a DAC (Digital Analog Converter) 211, a drive circuit 212, a column arbiter 213, a column AER circuit 220, a column address encoder 214, and a time-of-day code generation section 230. Also, the solid-state imaging element 200 includes a pixel array section 300, a column processing section 250, a state machine 215, a row address encoder 216, a row AER circuit 260, and a row arbiter 600. Also, a plurality of pixels is arranged in a two-dimensional lattice pattern in the pixel array section 300. Hereinafter, a group of pixels arranged in a given direction in the pixel array section 300 will be referred to as a row, and a group of pixels arranged in a direction vertical to the row will be referred to as a column.

The DAC 211 generates an analog reference signal that varies in a sloped manner through DA (Digital to Analog) conversion. The DAC 211 supplies the reference signal to the pixel array section 300.

The drive circuit 212 drives the pixels of the pixel array section 300 in synchronism with the vertical synchronizing signal VSYNC.

Each of the pixels of the pixel array section 300 generates digital pixel data. Also, some of the pixels generate an address event detection result in addition to the pixel data. Here, the address event includes an ON event and an OFF event, and the detection result includes a one-bit ON event detection result and a one-bit OFF event detection result. The ON event means that when the amount of light of a pixel varies above a given reference value, an absolute value of the variation thereof has exceeded a given threshold. On the other hand, the OFF event means that when the amount of light of the pixel varies below the given reference value, the absolute value of the variation thereof has exceeded the given threshold. For example, we assume that the reference value is "10" and that the threshold is "5." In this case, if the amount of light changes to "16," the variation is "+6," and the absolute value thereof exceeds "5." Therefore, an ON event is detected. Also, if the amount of light changes to "4," the variation is "−6," and the absolute value thereof exceeds "5." Therefore, an OFF event is detected.

The pixels supply pixel data to the column processing section 250. Also, when an address event is detected, the pixels send requests to and receive acknowledgements from (hereinafter referred to as handshakes with) the row AER circuit 260 to externally output address event detection results. Next, the pixels handshake with the column AER circuit 220.

The column arbiter 213 arbitrates requests from the column AER circuit 220 and sends an acknowledgement to the column AER circuit 220 on the basis of an arbitration result.

The column AER circuit 220 sends and receives requests for externally outputting an address event detection result and an acknowledgement to and from (handshakes with) each of the columns, the column arbiter 213, and the state machine 215.

The column address encoder 214 encodes an address of the column where an address event has occurred and sends the encoded address to the state machine 215.

The time-of-day code generation section 230 generates a time-of-day code. This time-of-day code represents the time of day within a time period during which the reference signal changes in a sloped manner. The time-of-day code generation section 230 supplies the generated time-of-day code to the pixel array section 300.

The column processing section 250 performs a correlated double sampling process (CDS) on pixel data. Image data that include the processed pixel data is supplied to the DSP circuit 120.

The row address encoder 216 encodes the address of the row where an address event has occurred and sends the encoded address to the state machine 215.

The row arbiter 600 arbitrates requests from the row AER circuit 260 and sends an acknowledgement to the row AER circuit 260 on the basis of an arbitration result.

The row AER circuit 260 sends and receives a request for externally outputting an address event detection result and an acknowledgement to and from (handshakes with) each of the rows, the row arbiter 600, and the state machine 215.

The state machine 215 handshakes with the column AER circuit 220 and the row AER circuit 260. When requests are received from the column AER circuit 220 and the row AER circuit 260, the state machine 215 decodes data from the column address encoder 214 and the row address encoder 216 and identifies the address where an address event has occurred. Then, the state machine 215 supplies the address detection result to the DSP circuit 120. The address event detection results of the respective pixels are arranged in a two-dimensional lattice pattern, thus generating image data.

Hereinafter, image data from the column processing section 250 that is not in AER format will be referred to as "normal image data," and image data in AER format will be referred to as "AER image data."

Figure 3:
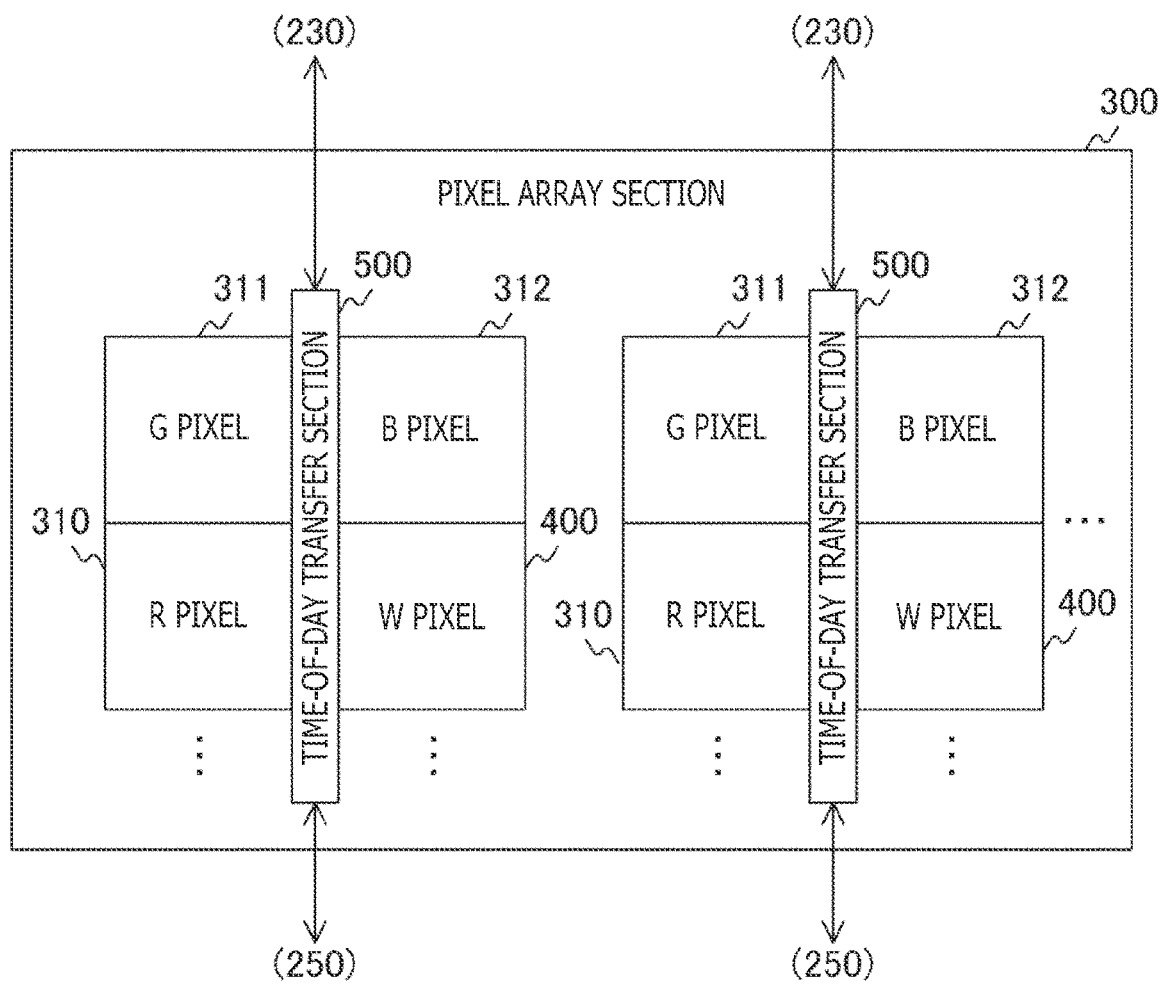
FIG. 3 is a block diagram illustrating a configuration example of a pixel array section in the first embodiment of the present technology.

(Configuration Example of the Pixel Array Section) FIG. 3 is a block diagram illustrating a configuration example of the pixel array section 300 in the first embodiment of the present technology. In the pixel array section 300, a given number of R (Red) pixels 310, a given number of G (Green) pixels 311, a given number of B (Blue) pixels 312, and a given number of W (White) pixels 400 are arranged in a two-dimensional lattice pattern. Also, a time-of-day code transfer section 500 is arranged every two columns between an odd-numbered column and an even-numbered column.

The R pixels 310 receive red light and generate pixel data through photoelectric conversion. Also, the G pixels 311 receive green light and generate pixel data. The B pixels 312 receive blue light and generate pixel data.

The W pixels 400 receive white light and generate pixel data. Also, the W pixels 400 detect address events.

The time-of-day code transfer section 500 transfers a time-of-day code. The time-of-day code transfer section 500 will be described in detail later.

(Configuration Example of the R Pixel)

Figure 4:
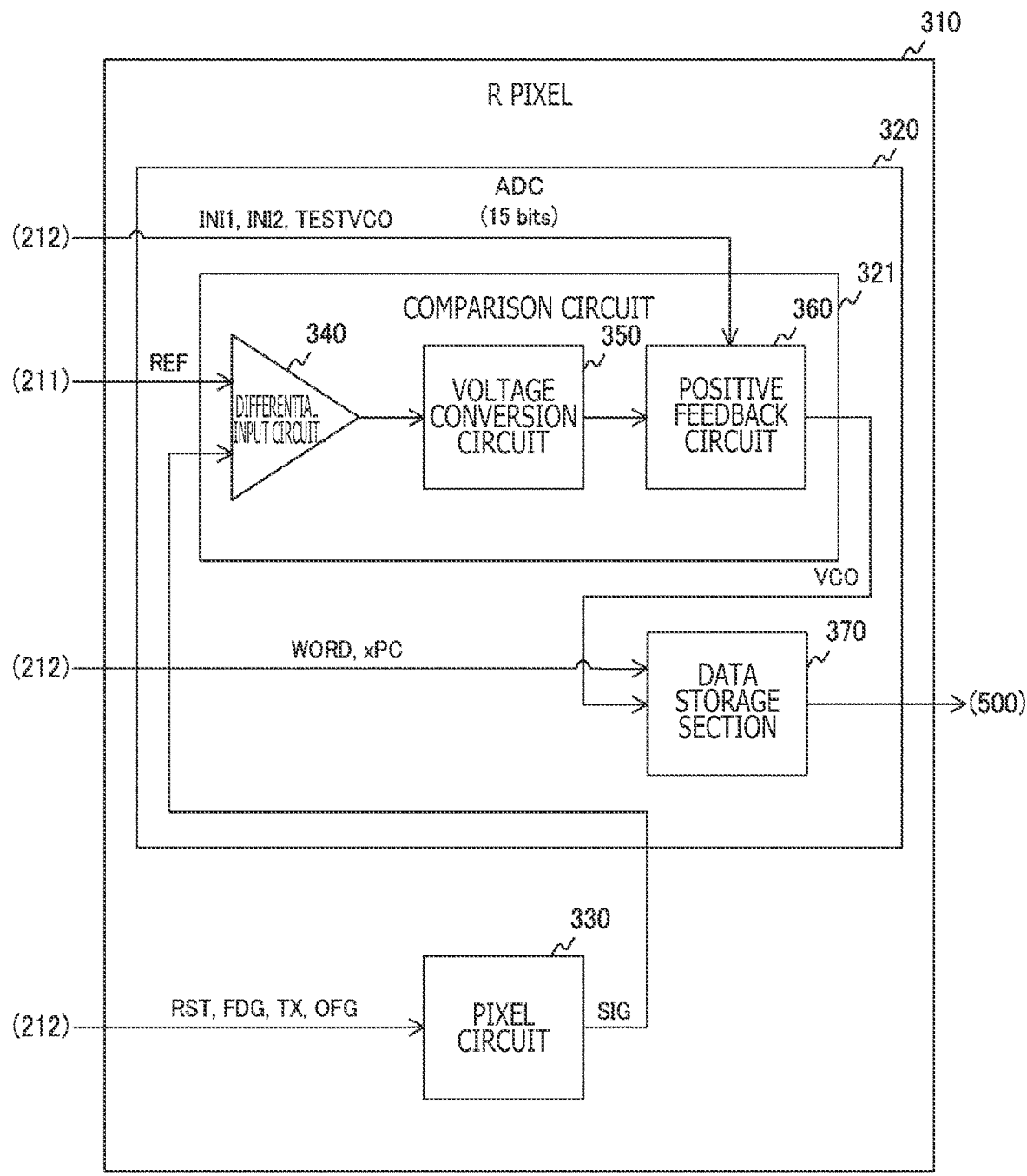
FIG. 4 is a block diagram illustrating a configuration example of an R (red) pixel in the first embodiment of the present technology.

FIG. 4 is a block diagram illustrating a configuration example of the R pixel 310 in the first embodiment of the present technology. The R pixel 310 includes a pixel circuit 330 and an ADC 320. The ADC 320 includes a comparison circuit 321 and a data storage section 370. Also, the comparison circuit 321 includes a differential input circuit 340, a voltage conversion circuit 350, and a positive feedback circuit 360. The G pixel 311 and the B pixel 312 are similar in configuration to the R pixel 310.

The pixel circuit 330 generates a reset level or a signal level as a pixel signal SIG through photoelectric conversion. Here, the reset level is a voltage at the time of initialization of an FD (Floating Diffusion) from the beginning of exposure onward, and the signal level is a voltage proportional to the amount of light at the end of exposure. The pixel circuit 330 supplies the reset level and the signal level to the differential input circuit 340 in sequence.

The ADC 320 AD converts the pixel signal SIG (reset level or signal level) into a digital signal. Data acquired by AD conversion of a reset level will be referred as "P phase data." Also, data acquired by AD conversion of a signal level will be referred to as "D phase data." It should be noted that P phase data is an example of reset data recited in claims, and that D phase data is an example of signal data recited in claims.

The differential input circuit 340 provided in the ADC 320 compares a reference signal REF from the DAC 211 and the pixel signal SIG from the pixel circuit 330. The differential input circuit 340 supplies a comparison result signal indicating a comparison result to the voltage conversion circuit 350.

The voltage conversion circuit 350 converts a voltage of the comparison result signal from the differential input circuit 340 and outputs the converted voltage to the positive feedback circuit 360.

The positive feedback circuit 360 adds part of its output to its input (comparison result signal) and outputs the signal to the data storage section 370 as an output signal VCO.

The data storage section 370 holds the time-of-day code when the output signal VCO is inverted. The data storage section 370 outputs a time-of-day code corresponding to a reset level as P phase data and outputs a time-of-day code corresponding to a signal level as D phase data.

Figure 5:
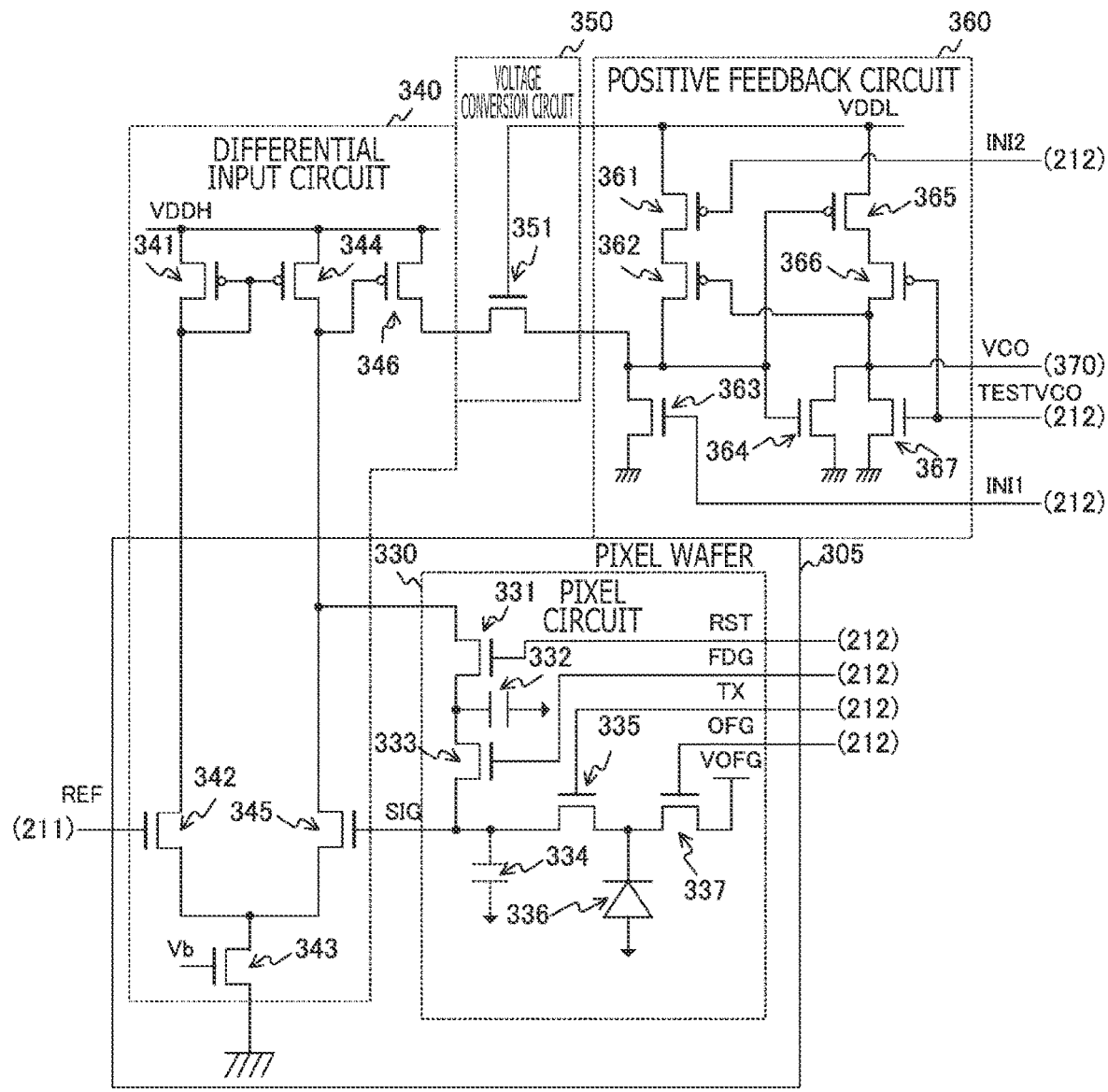
FIG. 5 is a circuit diagram illustrating configuration examples of a pixel circuit, a differential input circuit, a voltage conversion circuit, and a positive feedback circuit in the first embodiment of the present technology.

FIG. 5 is a circuit diagram illustrating configuration examples of the pixel circuit 330, the differential input circuit 340, the voltage conversion circuit 350, and the positive feedback circuit 360 in the first embodiment of the present technology.

The pixel circuit 330 includes a reset transistor 331, a capacitance 332, a gain control transistor 333, an FD (Floating Diffusion) 334, a transfer transistor 335, a photodiode 336, and a discharge transistor 337. For example, N-type MOS (Metal-Oxide-Semiconductor) transistors are used as the reset transistor 331, the gain control transistor 333, the transfer transistor 335, and the discharge transistor 337.

The photodiode 336 generates charge through photoelectric conversion. The discharge transistor 337 discharges the charge accumulated in the photodiode 336 in accordance with a drive signal OFG from the drive circuit 212 when the exposure begins.

The transfer transistor 335 transfers charge from the photodiode 336 to the FD 334 in accordance with a transfer signal TX from the drive circuit 212 when the exposure ends.

The FD 334 accumulates the transferred charge and generates a voltage proportional to the amount of charge accumulated. It should be noted that the FD 334 is an example of a charge accumulation section recited in claims.

The reset transistor 331 initializes the FD 334 in accordance with a reset signal RST from the drive circuit 212.

The gain control transistor 333 controls an analog gain of the voltage of the FD 334 in accordance with a control signal FDG from the drive circuit 212. A signal amount handled by the R pixel 310, i.e., a saturation signal amount, can be increased by reducing the analog gain of the voltage of the FD 334 with the analog gain and outputting the reduced voltage.

Also, the gain control transistor 333 and the reset transistor 331 are connected in series, and one end of the capacitance 332 is connected to a connection point between the gain control transistor 333 and the reset transistor 331.

It should be noted that the gain control transistor 333 and the capacitance 332 are provided in accordance with the need for gain control, and it is possible to do without these components.

The differential input circuit 340 includes a PMOS (Positive channel MOS) transistors 341, 344, and 346 and NMOS (Negative channel MOS) transistors 342, 343, and 345.

The NMOS transistors 342 and 345 form a differential pair, and the sources thereof are connected together to a drain of the NMOS transistor 343. Also, the drain of the NMOS transistor 342 is connected to the drain of the PMOS transistor 341 and gates of the PMOS transistors 341 and 344. The drain of the NMOS transistor 345 is connected to the drain of the PMOS transistor 344, the gate of the PMOS transistor 346, and the drain of the reset transistor 331. Also, the reference signal REF is input to the gate of the NMOS transistor 342.

A given bias voltage Vb is applied to the gate of the NMOS transistor 343, and a given ground voltage is applied to the source of the NMOS transistor 343. The gate of the NMOS transistor 345 is connected to the gain control transistor 333, the FD 334, and the transfer transistor 335.

The PMOS transistors 341 and 344 form a current mirror circuit. A supply voltage VDDH is applied to the sources of the PMOS transistors 341, 344, and 346. The supply voltage VDDH is higher than a supply voltage VDDL. Also, the drain of the PMOS transistor 346 is connected to the voltage conversion circuit 350.

Also, the pixel circuit 330 and the NMOS transistors 342, 343, and 345 are formed on a pixel wafer 305.

Also, in the R pixel 310, the source potential of the NMOS transistor 343, a current source, and the substrate bias of the pixel wafer 305 have been intentionally changed. A current flow through the comparison circuit 321 stops by bringing the DAC 211 down to an OFF level (e.g., 0V or ground level) in the time period outside of the A/D conversion period, thus contributing to reduced power consumption. However, because the DAC 211 has been brought down to the OFF level, the potential of the drain of the NMOS transistor 343, a current source, and the drains of the amplifying NMOS transistors 342 and 345 reaches ground. This means that charge is accumulated to a 0V level, and the charge here overflows to the photodiode 336 of the pixel circuit 330. This is due to the fact that, because of distance dependence and only a slight difference between portions in question (the drain of the current source and the drains of the amplifying transistors), thermally excited charge diffuses to the photodiode 336. In order to avoid this, the P-well potential is rendered negative. As a result, the P-well is set to a negative potential, approximately 240 millivolt (mV) below ground, thus suppressing leakage of charge from the portions in question to the photodiode 336.

The voltage conversion circuit 350 includes an NMOS transistor 351. The supply voltage VDDL is applied to the gate of the NMOS transistor 351. Also, the drain of the NMOS transistor 351 is connected to the drain of the PMOS transistor 346, and the source thereof is connected to the positive feedback circuit 360. The voltage conversion circuit 350 converts the supply voltage VDDH into the lower supply voltage VDDL, thus allowing a circuit operating at a low voltage to be provided at a subsequent stage. It should be noted that although the supply voltage VDDH is converted into the lower supply voltage VDDL by the voltage conversion circuit 350, this configuration is not restrictive. For example, the supply voltages VDDH and VDDL may be the same voltage so that the voltage conversion circuit 350 is not required.

The positive feedback circuit 360 includes PMOS transistors 361, 362, 365, and 366 and NMOS transistors 363, 364, and 367. The PMOS transistors 361 and 362 are connected in series to the supply voltage VDDL. Also, a drive signal INI2 from the drive circuit 212 is input to the gate of the PMOS transistor 361. The drain of the PMOS transistor 362 is connected to the source of the NMOS transistor 351, the drain of the NMOS transistor 363, and the gates of the PMOS transistor 365 and the NMOS transistor 364.

The ground voltage is applied to the source of the NMOS transistor 363, and a drive signal INI1 from the drive circuit 212 is input to the gate of the NMOS transistor 363.

The PMOS transistors 365 and 366 are connected in series to the supply voltage VDDL. Also, the drain of the PMOS transistor is connected to the gate of the PMOS transistor 362 and the drains of the NMOS transistors 364 and 367. A control signal TESTVCO from the drive circuit 212 is input to the gates of the PMOS transistor 366 and the NMOS transistor 367.

The output signal VCO is output from the drains of the NMOS transistors 364 and 367. Also, the ground voltage is applied to the sources of the NMOS transistors 364 and 367.

It should be noted that each of the pixel circuit 330, the differential input circuit 340, the voltage conversion circuit 350, and the positive feedback circuit 360 is not limited to that illustrated in FIG. 5 as long as the circuit has the function described with reference to FIG. 4.

(Configuration Example of the Data Storage Section)

Figure 6:
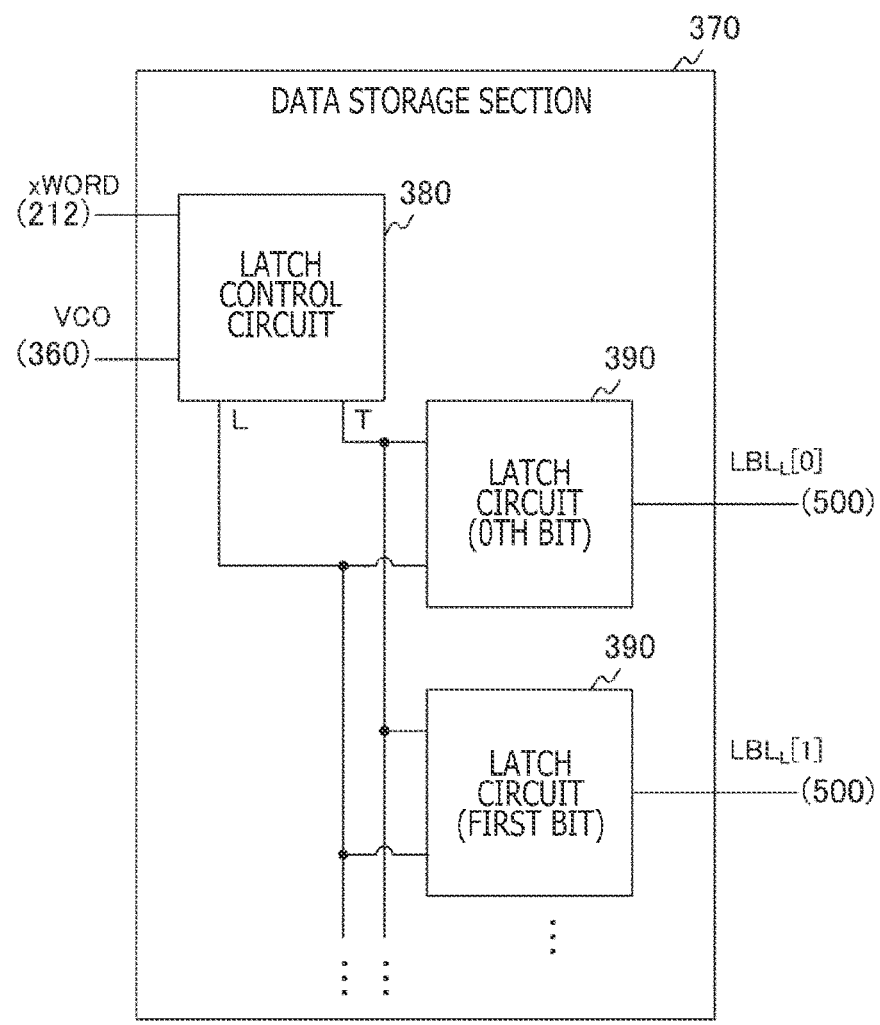
FIG. 6 is a block diagram illustrating a configuration example of a data storage section in the first embodiment of the present technology.

FIG. 6 is a block diagram illustrating a configuration example of the data storage section 370 in the first embodiment of the present technology. The data storage section 370 includes a latch control circuit 380 and as many latch circuits 390 as a bit count D (where D is an integer) of D phase data. The latch control circuit 380 causes one of the latch circuits 390 to hold the value of the output signal VCO (logic value of "0" or "1") in accordance with a control signal ×WORD from the drive circuit 212. The control signal ×WORD is an inverted signal of a control signal WORD.

The latch circuits 390 hold the value of the output signal VCO under control of the latch control circuit 380. The latch circuits 390 are connected to the time-of-day code transfer section 500 via local bit lines $LBL_L$.

Figure 7:
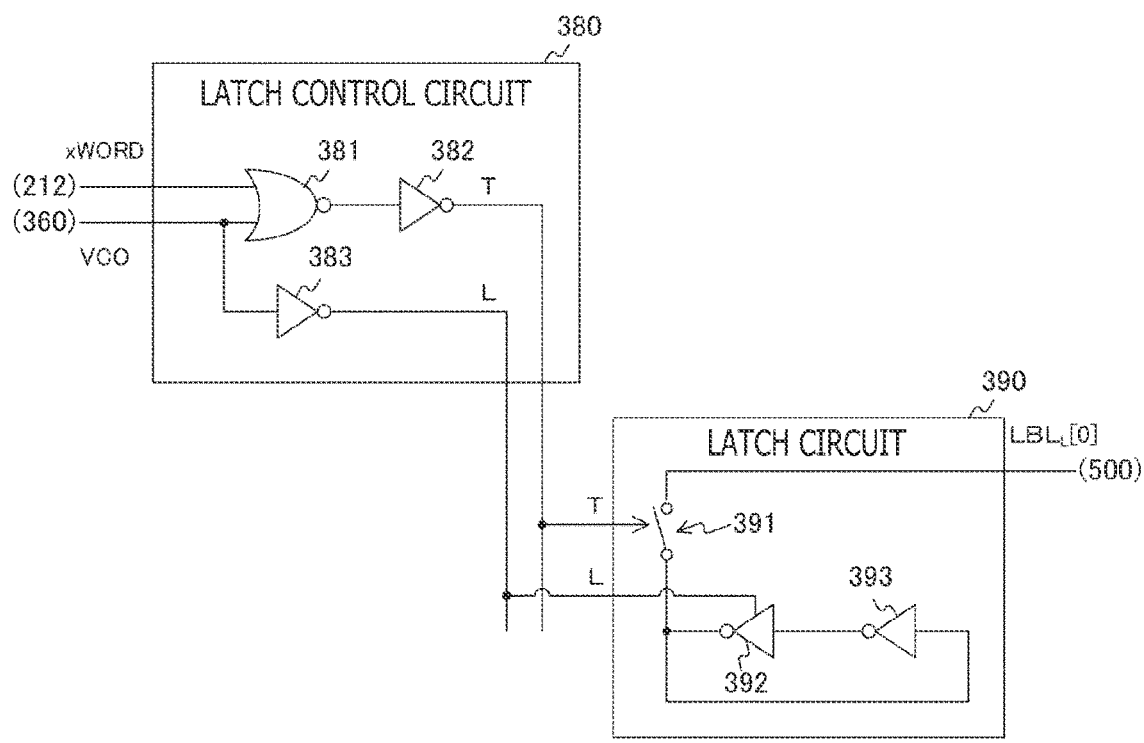
FIG. 7 is a circuit diagram illustrating configuration examples of a latch control circuit and a latch circuit in the first embodiment of the present technology.

(Configuration Examples of the Latch Control Circuit and the Latch Circuit) FIG. 7 is a block diagram illustrating configuration examples of the latch control circuit 380 and the latch circuit 390 in the first embodiment of the present technology. The latch control circuit 380 includes a NOR gate 381 and inverters 382 and 383.

The NOR gate 381 outputs a negative logic sum of the control signal ×WORD and the output signal VCO to the inverter 382. The inverter 382 inverts the output value from the NOR gate 381 and outputs the inverted value to the latch circuit 390 as a latch control signal T.

The inverter 383 inverts the output signal VCO and outputs the inverted signal to the latch circuit 390 as a latch input signal L.

Also, the latch circuit 390 includes a switch 391 and inverters 392 and 393. The switch 391 opens or closes a path between the inverter 392 and the local bit line $LBL_L$ in accordance with the latch control signal T from the latch control circuit 380. The local bit line $LBL_L$ is connected to the time-of-day code transfer section 500.

The inverter 392 inverts the signal from the inverter 393 in accordance with a latch input signal L from the latch control circuit 380. The inverter 392 outputs the inverted signal to an input terminal of the inverter 393 and to the switch 391.

The inverter 393 inverts the signal from the inverter 392 and outputs the inverted signal to the input terminal of the inverter 392.

It should be noted that the latch control circuit 380 and the latch circuit 390 are not limited to those illustrated in FIG. 7 as long as they have equivalent functions.

Figure 8:
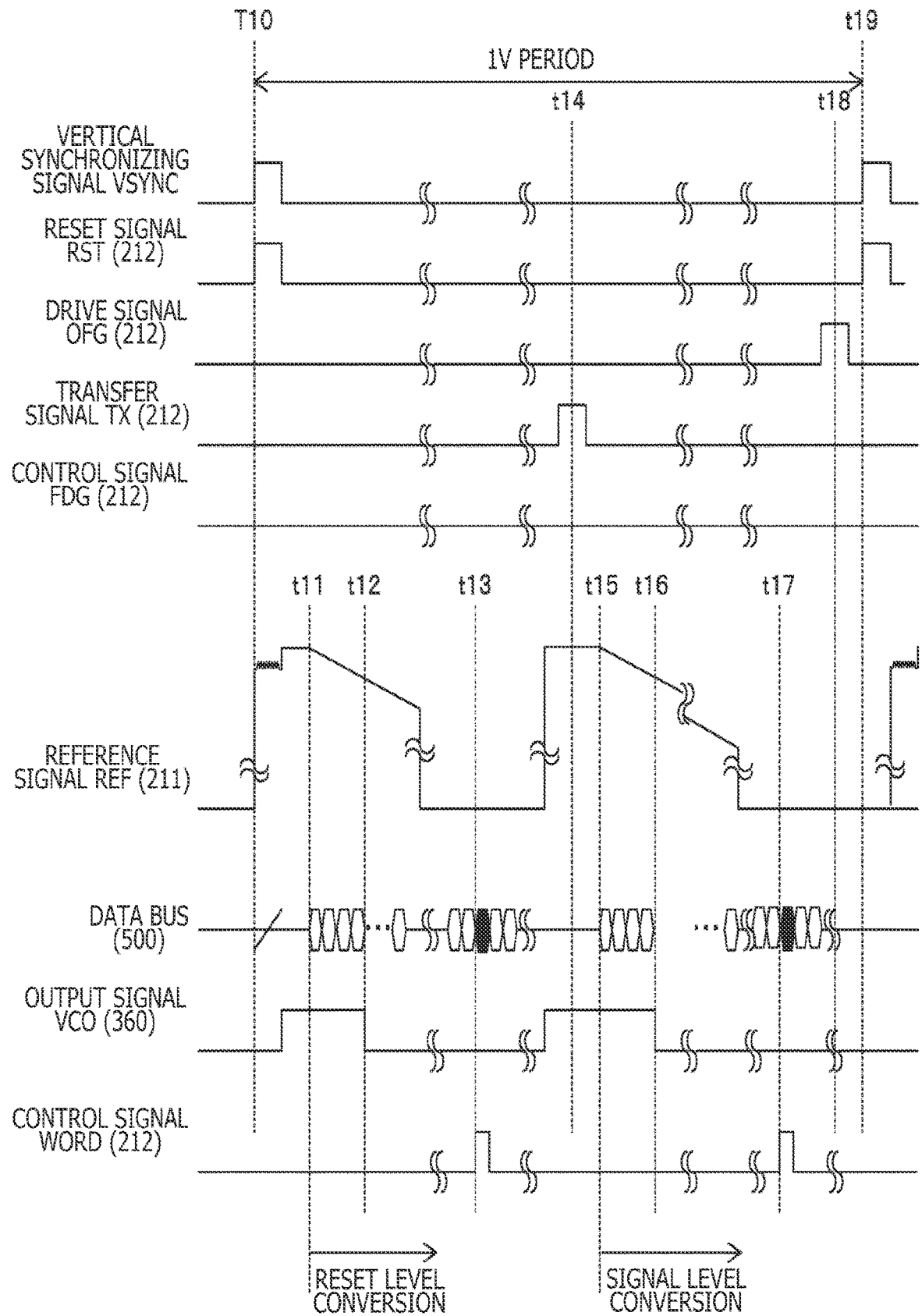
FIG. 8 is a timing diagram illustrating an example of operation of the solid-state imaging element in the first embodiment of the present technology.

FIG. 8 is a timing diagram illustrating an example of operation of the solid-state imaging element 200 in the first embodiment of the present technology. The drive circuit 212 initializes the FD in response to the reset signal RST at a start time t10 during a 1V period. Here, the 1V period is an interval of the vertical synchronizing signal VSYNC. We also assume that the exposure of all the pixels has started before time t10.

The DAC 211 reduces the reference signal REF in a sloped manner for a fixed time period from time t11. A data bus is data in a repeater circuit provided in the time-of-day code transfer section 500. The latch control circuit 380 continues to write the data, sent from external equipment via the local bit line LBL, to the latch circuit 390. The latch control circuit 380 stops writing the data at time t12, a point of intersection between the slope of the output signal VCO and the potential of the FD 334, when the output signal VCO is inverted. Next, the data is read at time t13 and held in a memory provided in the time-of-day code transfer section 500. This data is a digital value (P phase data) acquired by converting the reset level including the voltage value of the FD 334 and a circuit offset. The P phase data is read out and held in the memory provided in the column processing section 250.

Next, the drive circuit 212 sends the transfer signal TX and transfers the charge to the FD 334 at time t14 when the exposure of all the pixels ends. Also, the DAC 211 reduces the reference signal REF in a sloped manner for a fixed time period from time t15. The latch control circuit 380 continues to write the data, sent via the local bit line LBL, to the latch circuit 390. The latch control circuit 380 stops writing the data at time t16 when the output signal VCO is inverted. The data is read out at time t17 and held in the memory provided in the time-of-day code transfer section 500. This data is D phase data acquired by converting the signal level.

The column processing section 250 finds the difference between the P phase data and the D phase data for each column as net pixel data. The drive circuit 212 causes the charge to be discharged from the photodiode 336 in all the pixels by sending the drive signal OFG at time t18 when the exposure of the pixels begins. As described above, the exposure start and end times are simultaneous in all the pixels, and such exposure control is called global shutter. Then, the 1V period ends at time t19.

It should be noted that the control signal FDG is controlled in a similar manner to the reset signal RST. For this reason, when the reset signal RST is constantly at high level, the conversion efficiency of the FD 334 is low (in other words, the capacitance of the FD 334 has increased). This makes it possible to avoid a situation where the FD 334 becomes no longer capable of accepting charge when the photodiode 336 generates excessive charge.

(Configuration Example of the W Pixel)

Figure 9:
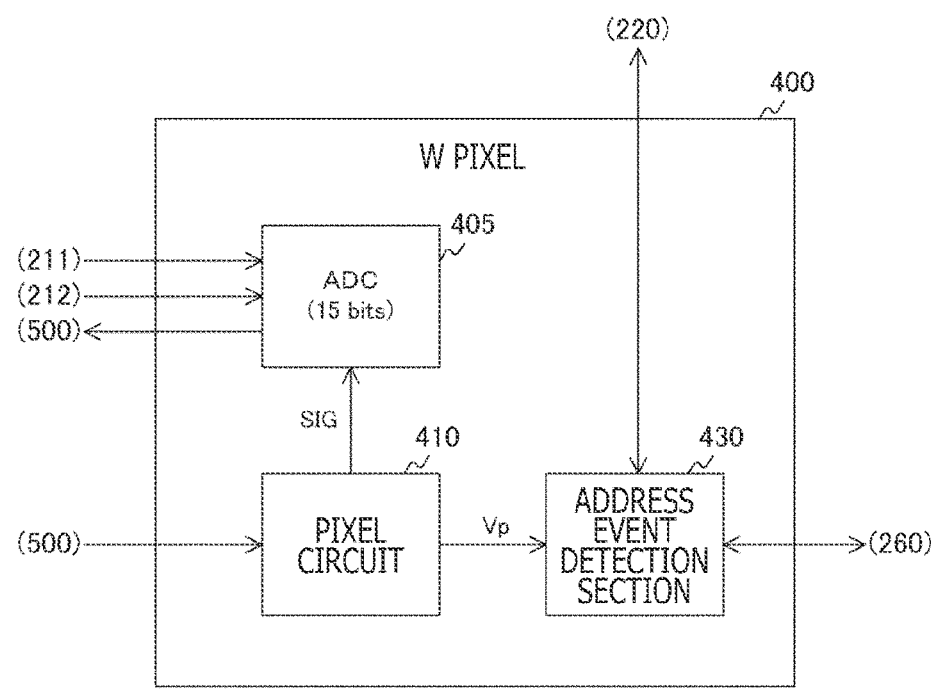
FIG. 9 is a block diagram illustrating a configuration example of a W (white) pixel in the first embodiment of the present technology.

FIG. 9 is a block diagram illustrating a configuration example of the W pixel 400 in the first embodiment of the present technology. The W pixel 400 includes an ADC 405, a pixel circuit 410, and an address event detection section 430.

The pixel circuit 410 not only generates the pixel signal SIG (reset level or signal level) and outputs the pixel signal SIG to the ADC 405 but also generates a voltage signal Vp and outputs the voltage signal Vp to the address event detection section 430. Here, the voltage signal Vp is generated by converting photocurrent proportional to the amount of charge generated by photoelectric conversion into a voltage.

The ADC 405 converts the pixel signal SIG into a digital signal (P phase data or D phase data). The ADC 405 is configured in a similar manner to the ADC 320 provided in the R pixel 310. The ADC 405 converts, under control of the drive circuit 212, the pixel signal SIG, for example, into a 15-bit digital signal and outputs the digital signal to the time-of-day code transfer section 500.

The address event detection section 430 detects, as an address event, the fact that the absolute value of the variation of the amount of light received by the W pixel 400 (amount of charge) has exceeded a given threshold on the basis of the voltage signal Vp. When detecting an address event, the address event detection section 430 handshakes with the row AER circuit 260 and next handshakes with the column AER circuit 220. An address event detection result is, for example, two bits in length which is smaller in bit count than the digital signal from the ADC 405. As described above, the W pixel 400 has two ADCs, the ADC 405 and the address event detection section 430, an ADC with lower resolution than the ADC 405. It should be noted that the address event detection section 430 is an example of an analog digital converter recited in claims.

(Configuration Example of the Address Event Detection Section)

Figure 10:
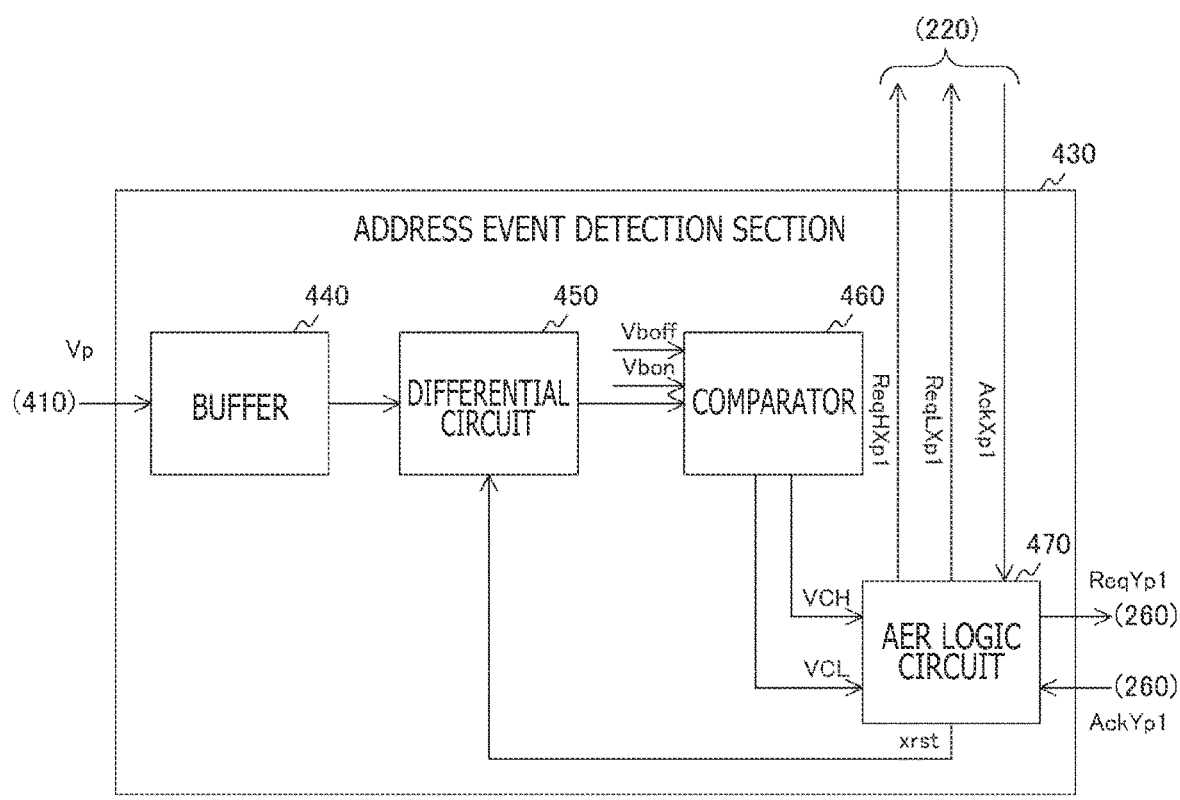
FIG. 10 is a block diagram illustrating a configuration example of an address event detection section in the first embodiment of the present technology.

FIG. 10 is a block diagram illustrating a configuration example of the address event detection section 430 in the first embodiment of the present technology. The address event detection section 430 includes a buffer 440, a differential circuit 450, a comparator 460, and an AER logic circuit 470.

The buffer 440 includes, for example, a source follower and is used to convert impedance for the voltage signal Vp.

The differential circuit 450 includes, for example, a switched capacitor circuit and acquires a differential signal of the variation in Vp relative to the reference value at the time of reset. The differential circuit 450 supplies the differential signal to the comparator 460.

The comparator 460 compares the level of the differential signal with each of thresholds Vthon and Vthoff. The comparator 460 outputs a comparison result with the threshold Vthon to the AER logic circuit 470 as VCH and a comparison result with the threshold Vthoff to the AER logic circuit 470 as VCL.

Here, the threshold Vthon is set higher than the threshold Vthoff. The fact that the differential signal exceeds the threshold Vthon means that the variation of the amount of light received by the W pixel 400 has exceeded the value corresponding to the threshold Vthon. Also, the fact that the differential signal falls below the threshold Vthoff means that the absolute value of the variation of the amount of light received by the W pixel 400 has exceeded the value corresponding to the threshold Vthoff. For this reason, in the case where the differential signal exceeds the threshold Vthon, of the address events, an ON event is detected, and in the case where the differential signal falls below the threshold Vthoff, an OFF event is detected.

The AER logic circuit 470 handshakes on the basis of the comparison results VCH and VCL. The AER logic circuit 470 detects whether or not an address event has occurred and handshakes, in the case where such an event has occurred, with the row AER circuit 260. Next, the AER logic circuit 470 handshakes with the column AER circuit 220 and resets the differential circuit 450 with a reset signal xrst. It should be noted that the AER logic circuit 470 is an example of a handshaking circuit recited in claims.

FIG. 11 is a circuit diagram illustrating a configuration example of the W pixel 400 in the first embodiment of the present technology. The pixel circuit 410 includes a reset transistor 411, a capacitance 412, a gain control transistor 413, an FD 414, a transfer transistor 415, a logarithmic response section 422, a photodiode 418, and a discharge transistor 419.

The reset transistor 411, the capacitance 412, the gain control transistor 413, the FD 414, the transfer transistor 415, the photodiode 418, and the discharge transistor 419 are identical in configuration to the elements having the same names provided in the R pixel 310.

The logarithmic response section 422 includes NMOS transistors 416, 417, and 420 and a PMOS transistor 421. The NMOS transistors 416 and 417 are connected in series between a connection point between the transfer transistor 415 and the discharge transistor 419 and the photodiode 418. Also, the PMOS transistor 421 and the NMOS transistor 420 are connected in series between a power supply and a ground terminal.

Also, a bias voltage Vbcus is applied to the gate of the NMOS transistor 416, and a bias voltage Vblog is applied to the gate of the PMOS transistor 421. The gate of the NMOS transistor 420 is connected to a connection point between the NMOS transistor 417 and the photodiode 418, and the gate of the NMOS transistor 417 is connected to a connection point between the NMOS transistor 420 and the PMOS transistor 421 and the buffer 440. Such connections allow the photocurrent flowing through the photodiode 418 to be logarithmically converted into a voltage Vp.

Also, of the elements provided in the pixel circuit 410, those other than the PMOS transistor 421, and of the elements provided in the ADC 405, NMOS transistors 423 and 424, a differential pair, and an NMOS transistor 425, a current source, are provided on a pixel wafer 406. Also, in the W pixel 400, the source potential of the NMOS transistor 425, a current source, and the substrate bias of the pixel wafer 406 have been intentionally changed as in the R pixel 310.

Also, the buffer 440 includes PMOS transistors 441 and 442 that are connected in series between the power supply and the ground terminal. The gate of the PMOS transistor 442 on the ground side is connected to the pixel circuit 410, and a bias voltage Vbsf is applied to the gate of the PMOS transistor 442 on the power supply side. Also, a connection point between the PMOS transistors 441 and 442 is connected to the differential circuit 450. This connection allows impedance conversion to be performed for Vp.

The differential circuit 450 includes capacitances 451 and 453, PMOS transistors 452 and 454, and an NMOS transistor 455.

One end of the capacitance 451 is connected to the buffer 440, and other end thereof is connected to one end of the capacitance 453 and the gate of the PMOS transistor 454. The reset signal xrst is input to the gate of the PMOS transistor 452, and the source and drain thereof are connected to respective ends of the capacitance 453. The PMOS transistor 454 and the NMOS transistor 455 are connected in series between the power supply and the ground terminal. Also, other end of the capacitance 453 is connected to a connection point between the PMOS transistor 454 and the NMOS transistor 455. A bias voltage Vba is applied to the gate of the NMOS transistor 455 on the ground side, and a connection point between the PMOS transistor 454 and the NMOS transistor 455 is also connected to the comparator 460. Such connections allow a differential signal to be generated and output to the comparator 460. Also, the differential signal is initialized by the reset signal xrst.

The comparator 460 includes PMOS transistors 461 and 463 and NMOS transistors 462 and 464. The PMOS transistor 461 and the NMOS transistor 462 are connected in series between the power supply and the ground terminal, and the PMOS transistor 463 and the NMOS transistor 464 are also connected in series between the power supply and the ground terminal. Also, the gates of the PMOS transistors 461 and 463 are connected to the differential circuit 450. A bias voltage Vbon for generating the threshold Vthon is applied to the gate of the NMOS transistor 462, and a bias voltage Vboff for generating the threshold Vthoff is applied to the gate of the NMOS transistor 464.

A connection point between the PMOS transistor 461 and the NMOS transistor 462 is connected to the AER logic circuit 470, and the voltage of this connection point is output as the comparison result VCH. A connection point between the PMOS transistor 463 and the NMOS transistor 464 is connected to the AER logic circuit 470, and the voltage of this connection point is output as the comparison result VCL. Such connections allow the comparator 460 to output the high-level comparison result VCH in the case where the differential signal exceeds the threshold Vthon and to output the low-level comparison result VCL in the case where the differential signal falls below the threshold Vthoff.

Figure 12:
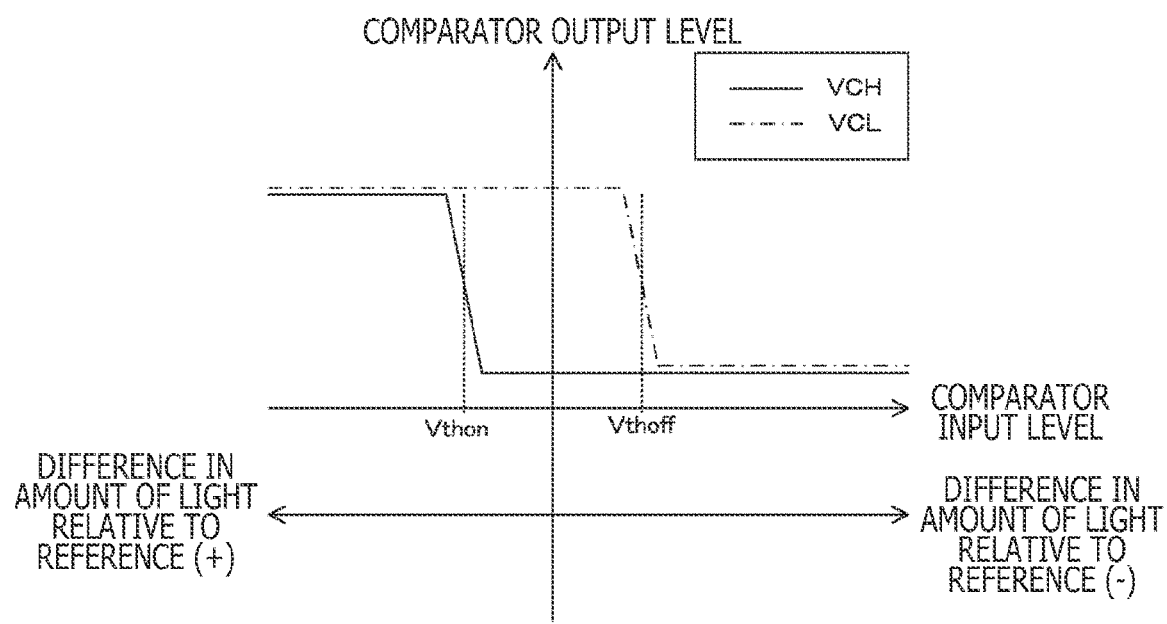
FIG. 12 is a graph illustrating an example of an input/output characteristic of a comparator in the first embodiment of the present technology.

FIG. 12 is a graph illustrating an example of an input/output characteristic of the comparator 460 in the first embodiment of the present technology. A vertical axis in FIG. 12 represents the level of the output signal (VCH or VCL) of the comparator 460, and a horizontal axis represents the level of the input signal (differential signal) of the comparator 460. Also, a solid line represents a locus of the comparison result VCH, and a long dashed short dashed line represents a locus of the comparison result VCL.

The amount of light when the differential signal is "0" is used as a reference, and when the positive difference in amount of light (variation) relative to the reference exceeds the value corresponding to the threshold Vthon, the comparison result VCH changes from low to high level, as a result of which an ON event is detected. On the other hand, when the absolute value of the negative difference in amount of light relative to the reference exceeds the value corresponding to the threshold Vthoff, the comparison result VCL changes from high to low level, as a result of which an OFF event is detected.

The DSP circuit 120 processes detection results of the respective address events of the W pixel 400 in a variety of applications. Among possible applications are those for vehicle-mounted equipment, those for image recognition input devices for artificial intelligence, those for monitoring, and so on.

As for an application for vehicle-mounted equipment, data displayed for visual recognition by drivers is normal image data captured in synchronism with the vertical synchronizing signal VSYNC. On the other hand, the solid-state imaging element 200 outputs, at high speed and in real time, a signal when an address event occurs in a vehicle control system. As a result, information previously acquired by an existing solid-state imaging element only at intervals of the vertical synchronizing signal can be detected as a change portion signal without waiting for that interval to elapse. For this reason, it is possible to enhance safety by speeding up the feedback until an instruction is issued, for example, to avoid humans and obstacles.

Also, as for an application for artificial intelligence, inputting low-resolution meaningful information (e.g., logarithmically compressed luminance difference) rather than high-resolution normal image data provides an advantage of reducing the amount of computations thanks to high-speed processing. Normal image data can also be acquired. Therefore, it is possible to realize highly accurate image recognition by using a computational result together with normal image data. The computational result is acquired by performing signal processing on event-driven output AER image data by using an LSTM (Long Short Term Memory).

As for an application for monitoring purpose, the application is activated on an event-driven basis under normal operation, and in the case where a difference equal to or greater than a fixed number (an event equal to or greater than a given threshold) occurs, the application starts recording high-resolution normal image data in synchronism with a vertical synchronizing signal. This eliminates the need to keep the high-resolution ADC active at all times, thus contributing to reduced power consumption.

(Configuration Example of the AER Logic Circuit)

Figure 13:
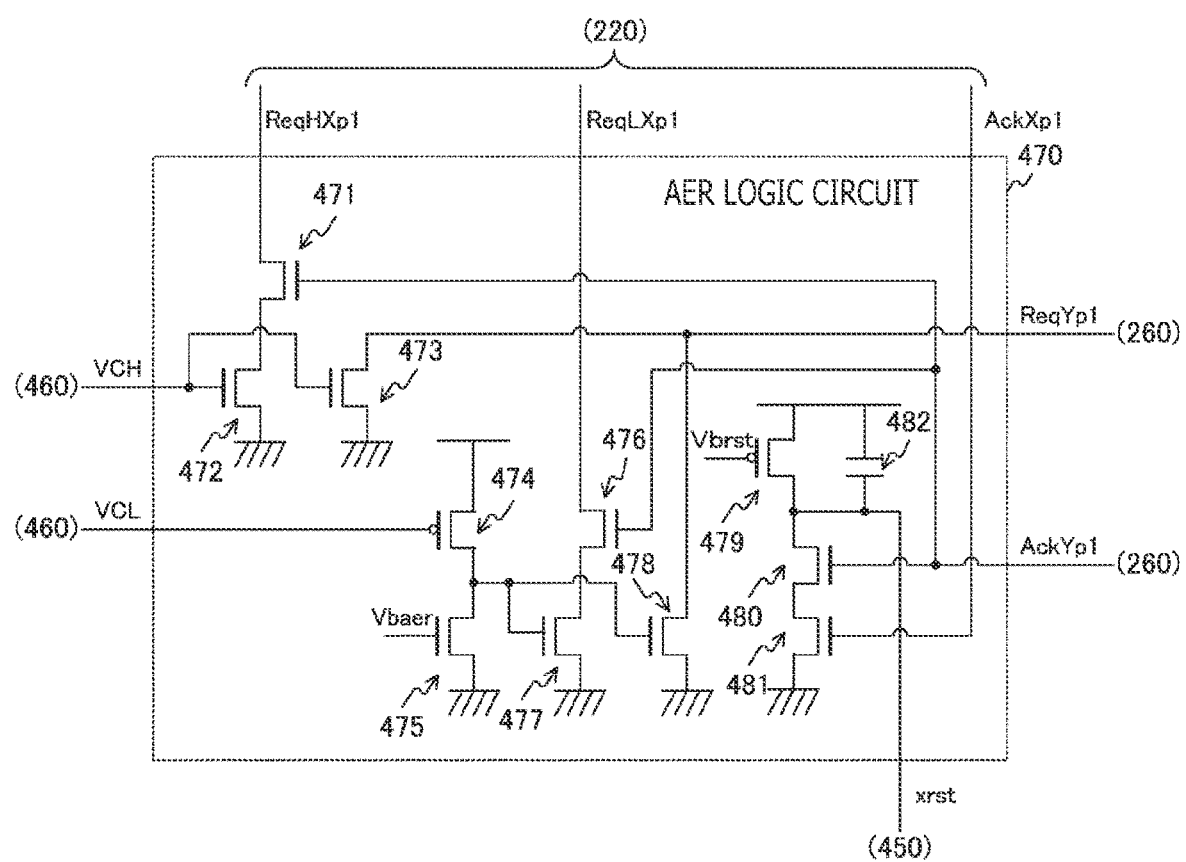
FIG. 13 is a block diagram illustrating a configuration example of an AER logic circuit in the first embodiment of the present technology.

FIG. 13 is a block diagram illustrating a configuration example of the AER logic circuit 470 in the first embodiment of the present technology. The AER logic circuit 470 includes NMOS transistors 471 to 473, 475 to 478, and 480 and 481, PMOS transistors 474 and 479, and a capacitance 482.

The NMOS transistors 471 and 472 are connected in series. The comparison result VCH is input to the gates of the NMOS transistors 472 and 473, and an acknowledgement AckYp1 is input to the gate of the NMOS transistor 471. Also, the sources of the NMOS transistors 472 and 473 are grounded, and a request ReqHXp1 is output from the drain of the NMOS transistor 471 to the column AER circuit 220. A request ReqYp1 is output from the drain of the NMOS transistor 473 to the row AER circuit 260.

The PMOS transistor 474 and the NMOS transistor 475 are connected in series between the power supply and the ground terminal. Also, the comparison result VCL is input to the gate of the PMOS transistor 474, and a bias voltage Vbaer is applied to the gate of the NMOS transistor 475.

The NMOS transistors 476 and 477 are connected in series. The gates of the NMOS transistors 477 and 478 are connected to a connection point between the PMOS transistor 474 and the NMOS transistor 475. The acknowledgement AckYp1 is input to the gate of the NMOS transistor 476. Also, the sources of the NMOS transistors 477 and 478 are grounded, and a request ReqLXp1 is output from the drain of the NMOS transistor 476 to the column AER circuit 220. The request ReqYp1 is output from the drain of the NMOS transistor 478 to the row AER circuit 260.

The PMOS transistor 479 and the NMOS transistors 480 and 481 are connected in series between the power supply and the ground terminal. Also, a bias voltage Vbrst is applied to the gate of the PMOS transistor 479. The acknowledgement AckYp1 is input to the gate of the NMOS transistor 480, and an acknowledgement AckXp1 is input to the gate of the NMOS transistor 481. One end of the capacitance 482 is connected to the power supply, and the other end thereof is connected to a connection point between the PMOS transistor 479 and the NMOS transistor 480. Also, the voltage of the connection point between the PMOS transistor 479 and the NMOS transistor 480 is output to the differential circuit 450 as the reset signal xrst.

Thanks to the above configuration, when the high-level comparison result VCH is input (i.e., when an ON event is detected), the AER logic circuit 470 sends the low-level request ReqYp1 to the row AER circuit 260. Then, when the high-level acknowledgement AckYp1 is received from the row AER circuit 260, the AER logic circuit 470 sends the low-level request ReqHXp1 to the column AER circuit 220. Next, when the high-level acknowledgement AckXp1 is received from the column AER circuit 220, the AER logic circuit 470 outputs the low-level reset signal xrst to the differential circuit 450.

Also, when the low-level comparison result VCL is input (i.e., when an OFF event is detected), the AER logic circuit 470 sends the low-level request ReqYp1 to the row AER circuit 260. Then, when the high-level acknowledgement AckYp1 is received from the row AER circuit 260, the AER logic circuit 470 sends the low-level request ReqLXp1 to the column AER circuit 220. Next, when the high-level acknowledgement AckXp1 is received from the column AER circuit 220, the AER logic circuit 470 outputs the low-level reset signal xrst to the differential circuit 450.

(Configuration Example of the Time-of-Day Code Generation Section)

Figure 14:
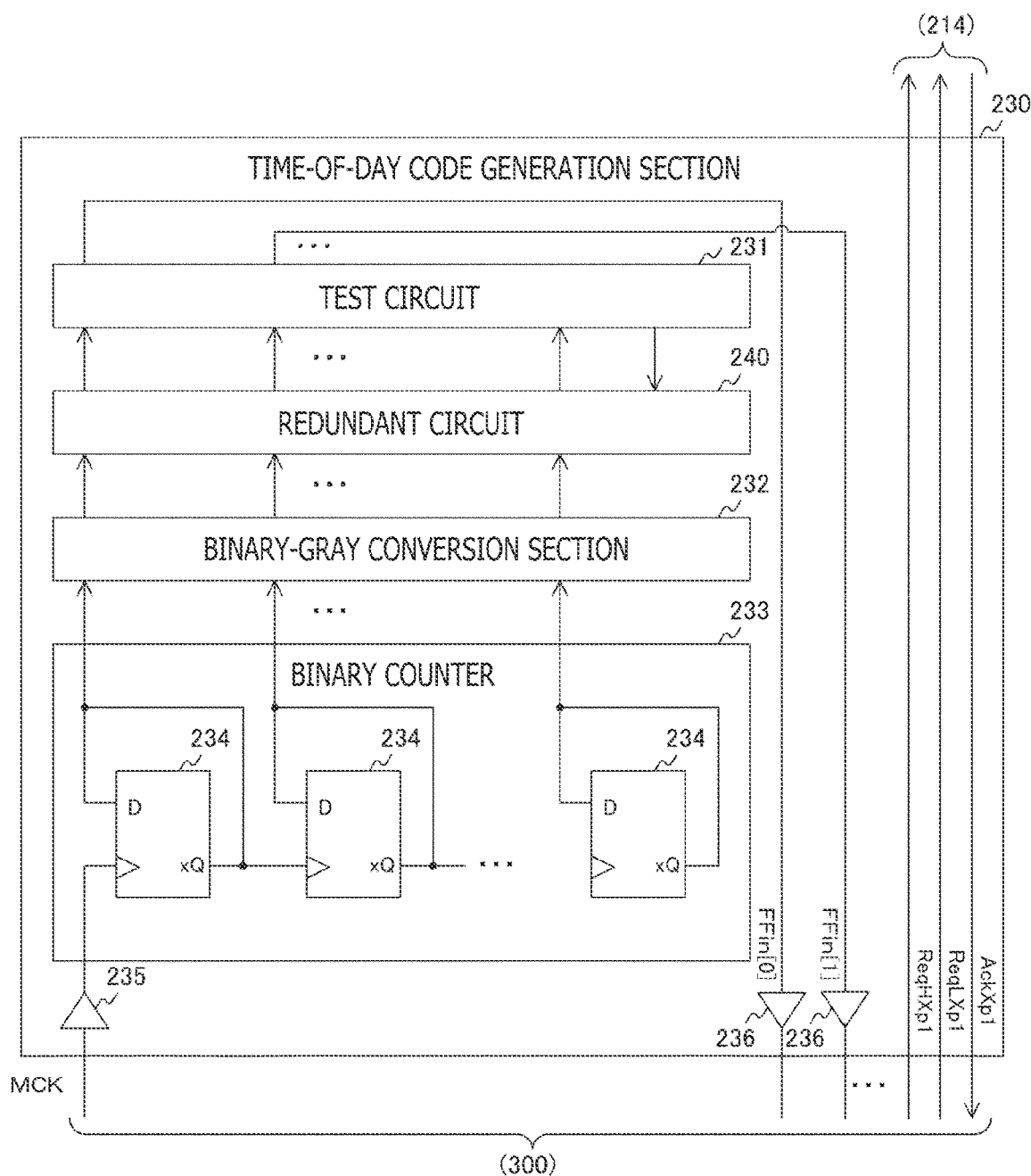
FIG. 14 is a block diagram illustrating a configuration example of a time-of-day code generation section in the first embodiment of the present technology.

FIG. 14 is a block diagram illustrating a configuration example of the time-of-day code generation section 230 in the first embodiment of the present technology. The time-of-day code generation section 230 includes a test circuit 231, a redundant circuit 240, a binary-gray conversion section 232, a binary counter 233, a receiver 235, and a plurality of drivers 236.

The receiver 235 receives a master clock MCK from the pixel array section 300. The receiver 235 supplies the received master clock MCK to the binary counter 233.

The binary counter 233 counts a binary count value in synchronism with the master clock MCK. The binary counter 233 includes a plurality of stages of flip-flops 234. The master clock MCK is input to a clock terminal of the flip-flop 234 at the first stage. The inverted outputs of the flip-flops 234 at the previous stages are input to the clock terminals of the flip-flops 234 at the second and succeeding stages. Also, the inverted outputs of the flip-flops 234 at the respective stages are output to the input terminals at these stages and are also output to the binary-gray conversion section 232 as bits of corresponding digits.

The binary-gray conversion section 232 converts the binary count value from the binary counter 233 into a gray code. The binary-gray conversion section 232 supplies the gray code to the redundant circuit 240.

The redundant circuit 240 connects a spare signal line in place of a signal line corresponding to a faulty bit under control of the test circuit 231. Here, at least one spare signal line is connected between the redundant circuit 240 and the test circuit 231. For example, in the case where the gray code is 15 bits long, 16 signal lines including one spare one are connected.

The test circuit 231 detects, for each bit of the gray code and, for example, at the time of startup, whether or not there is any fault in the corresponding signal line. Here, possible faults detected by the test circuit 231 are a break or short in wiring, a defective latch circuit, and so on. In the case where a fault occurs, the test circuit 231 controls the redundant circuit 240 to connect a spare signal line in place of the faulty signal line. Also, the test circuit 231 outputs a gray code as a time-of-day code.

The driver 236 is provided for each bit of the time-of-day code. The driver 236 outputs a corresponding bit FFin[k] (where k is an integer equal to or greater than 0) of the time-of-day code to the pixel array section 300.

Also, the time-of-day code generation section 230 has signal lines arranged therein for transmitting the requests ReqHXp1 and ReqLXp1 and the acknowledgement AckXp1.

(Configuration Example of the Redundant Circuit)

Figure 15:
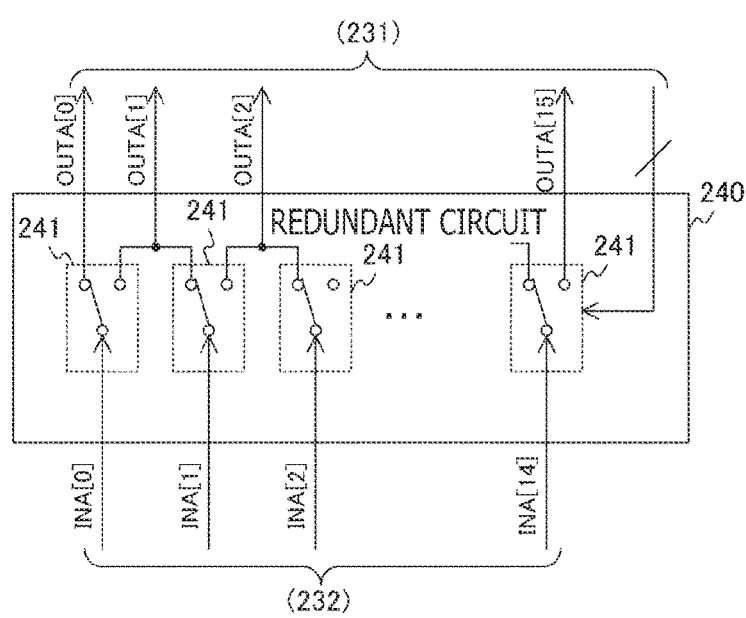
FIG. 15 is a circuit diagram illustrating a configuration example of a redundant circuit in the first embodiment of the present technology.

FIG. 15 is a circuit diagram illustrating a configuration example of the redundant circuit 240 in the first embodiment of the present technology. The redundant circuit 240 includes a plurality of switches 241. The number of switches 241 is the same as the number of bits of the gray code (time-of-day code). Also, the switches 241 each include one input terminal and two output terminals. A signal line INA[k] for transmitting the kth bit of the time-of-day code from the binary-gray conversion section 232 is connected to the input terminal of the kth switch 241. Also, a signal line OUT[0] is connected to the left output terminal of the zeroth switch 241. Also, the right output terminal of the kth switch 241 and the left output terminal of the k+1th switch 241 are connected, and these output terminals are also connected to a signal line OUT[k]. A spare signal line OUT[15] is connected to the right output terminal of the last switch 241.

The switches 241 change connection destinations of their input terminals under control of the test circuit 231. In an initial state, the input terminals of all the switches 241 are connected to the left output terminals. In the case where the kth bit becomes faulty, the kth and succeeding switches 241 change the connection destinations of their input terminals to the right output terminals. For example, in the case where, of the 15 bits, the first bit becomes faulty, the first to 14th switches 241 change their connection destinations to the right output terminals. This connects the signal lines INA[1] to INA[14] to signal lines OUT[2] to OUT[15] and disconnects the faulty signal line OUT[1] from the input terminal.

The test circuit 231 detects whether or not a fault has occurred at the time of startup, and the redundant circuit 240 changes the connection destination on the basis of a detection result thereof. It should be noted that this method is not restrictive and that, for example, the test circuit 231 may detect in advance whether or not any fault has occurred before the startup and write a detection result to a non-volatile memory. In this case, the redundant circuit 240 need only read out the detection result from the memory at the time of startup and change the connection destination.

Figure 16:
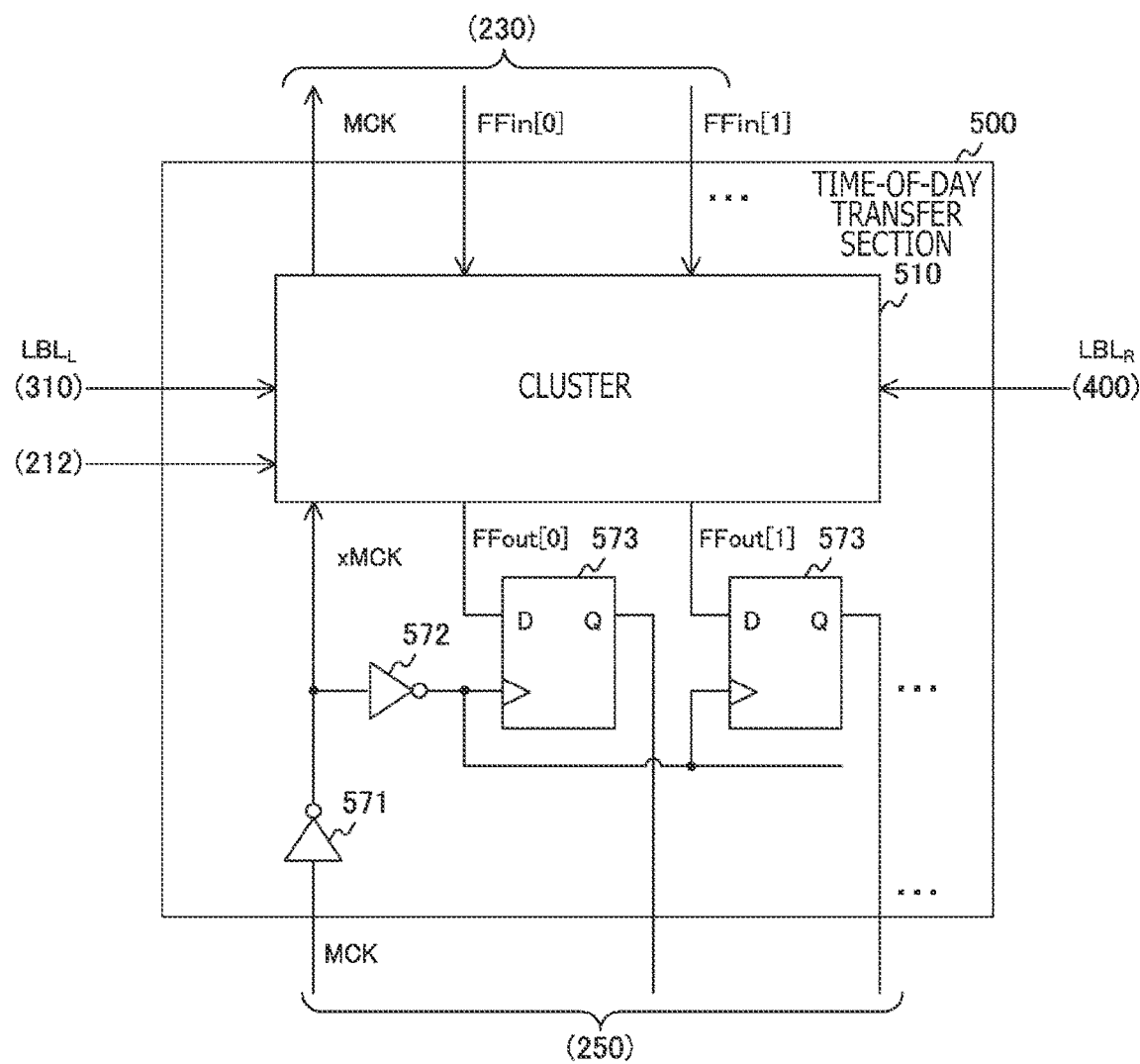
FIG. 16 is a block diagram illustrating a configuration example of a time-of-day code transfer section in the first embodiment of the present technology.

FIG. 16 is a block diagram illustrating a configuration example of the time-of-day code transfer section 500 in the first embodiment of the present technology. The time-of-day code transfer section 500 includes a cluster 510, inverters 571 and 572, and a plurality of flip-flops 573. The number of flip-flops 573 is the same as the number of the latch circuits 390 in a fixed unit of transmission/reception (e.g., 256 circuits). The configuration of the cluster 510 will be described later.

The inverter 571 inverts the master clock MCK from the column processing section 250. The inverter 571 supplies the inverted clock signal xMCK to the inverter 572 and the cluster 510.

The inverter 572 inverts the clock signal xMCK and outputs the inverted clock signal to the clock terminal of each of the flip-flops 573 as the master clock MCK.

The flip-flops 573 hold bits FFout[k] from the cluster 510 in synchronism with the master clock MCK. These flip-flops 573 output the held bits to the column processing section 250.

(Configuration Example of the Cluster)

Figure 17:
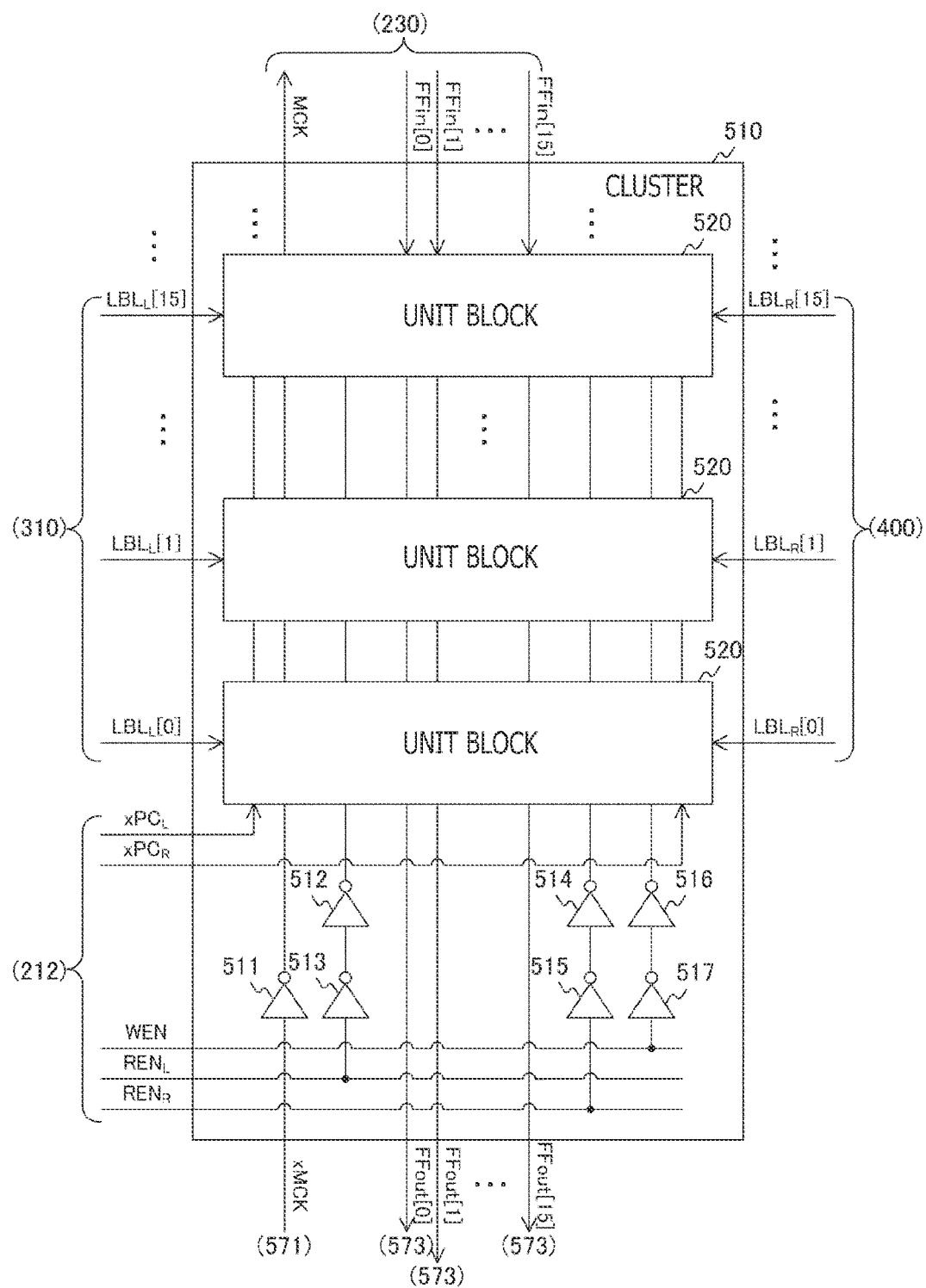
FIG. 17 is a block diagram illustrating a configuration example of a cluster in the first embodiment of the present technology.

FIG. 17 is a block diagram illustrating a configuration example of the cluster 510 in the first embodiment of the present technology. The cluster 510 includes a plurality of unit blocks 520 and inverters 511 to 517. The number of unit blocks 520 is the same as the number of bits in the unit of transmission/reception (e.g., 16 bits including one redundant bit added to 15 bits).

The inverter 511 inverts the clock signal xMCK from the inverter 571 and supplies the inverted clock signal to each of the unit blocks 520 and the time-of-day code generation section 230 as the master clock MCK.

The inverter 513 inverts a read enable signal $REN_L$ from the drive circuit 212. The read enable signal $REN_L$ is used to instruct that left pixel data of the pixels of the time-of-day code transfer section 500 be read out. The inverter 512 inverts the signal from the inverter 513 and supplies the inverted signal to each of the unit blocks 520.

The inverter 515 inverts a read enable signal $REN_R$ from the drive circuit 212. The read enable signal $REN_R$ is used to instruct that right pixel data of the pixels of the time-of-day code transfer section 500 be read out. The inverter 514 inverts the signal from the inverter 515 and supplies the inverted signal to each of the unit blocks 520.

The inverter 517 inverts a write enable signal WEN from the drive circuit 212. The write enable signal WEN is used to instruct that a time-of-day code be written. The inverter 516 inverts the signal from the inverter 517 and supplies the inverted signal to each of the unit blocks 520.

The unit blocks 520 read out pixel data or write a time-of-day code in accordance with the read enable signals $REN_L$ and $REN_R$ and the write enable signal WEN.

Figure 18:
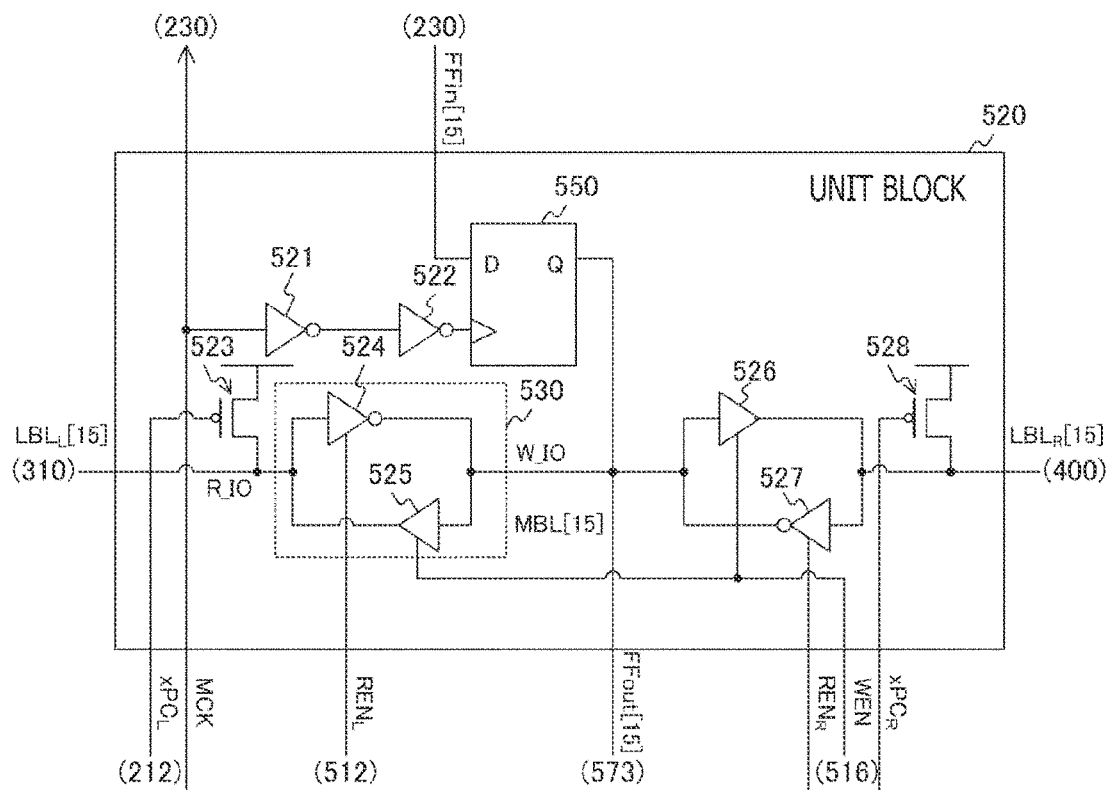
FIG. 18 is a circuit diagram illustrating a configuration example of a unit block in the first embodiment of the present technology.

FIG. 18 is a block diagram illustrating a configuration example of the unit block 520 in the first embodiment of the present technology. The unit block 520 includes inverters 521, 522, 524, and 527, PMOS transistors 523 and 528, buffers 525 and 526, and a flip-flop 550.

The inverter 521 inverts the master clock MCK from the inverter 511. The inverter 521 supplies the inverted clock signal to the inverter 522. The inverter 522 inverts the signal from the inverter 521 and supplies the inverted signal to the clock terminal of the flip-flop 550 as the master clock MCK.

The flip-flop 550 holds the corresponding bit FFin[k] of the time-of-day code from the time-of-day code generation section 230 in synchronism with the master clock MCK. The flip-flop 550 supplies the held bit to the buffers 525 and 526 as FFout[k].

The PMOS transistor 523 precharges a local bit line $LBL_L[k]$ in accordance with a signal $xPC_L$ acquired by inverting a control signal $PC_L$ from the drive circuit 212. Here, the control signal $PC_L$ is used to instruct that the local bit line $LBL_L[k]$ be precharged, and a precharging instruction is issued, for example, immediately before the bit is read out via the local bit line $LBL_L[k]$. This causes an initial voltage inside the latch circuit 390 to vary due to an impedance ratio between the output (T) of the inverter 382 and the switch 391 when a signal is output to the local bit line $LBL_L[k]$, thus preventing the signal of the local bit line $LBL_L[k]$ from being overwritten. Also, the area of the latch circuit 390 can be minimized.

The inverter 524 inverts the bit read out via the local bit line $LBL_L[k]$ in accordance with the high-level read enable signal REND and outputs the inverted bit to the column processing section 250 via the flip-flop 573 as a kth bit of the pixel data (FFout[k]). The buffer 525 outputs the bit output from the flip-flop 550 to the local bit line $LBL_L[k]$ in accordance with the high-level write enable signal WEN. These inverter 524 and buffer 525 form a bidirectional buffer circuit 530. The terminal connected to the local bit line $LBL_L[k]$ of the buffer circuit 530 will be denoted as R_IO, and the terminal connected to the flip-flop 550 will be denoted as W_IO.

The PMOS transistor 528 precharges a local bit line $LBL_R[k]$ in accordance with a signal $xPC_R$ acquired by inverting a control signal $PC_R$ from the drive circuit 212. Here, the control signal $PC_R$ is used to instruct that the local bit line $LBL_R[k]$ be precharged, and a precharging instruction is issued, for example, immediately before the bit is read out via the local bit line $LBL_R[k]$.

The inverter 527 inverts the bit read out via the local bit line $LBL_R[k]$ in accordance with the high-level read enable signal $REN_R$ and outputs the inverted bit to the column processing section 250 via the flip-flop 573 as the kth bit of the pixel data. The buffer 526 outputs the bit output from the flip-flop 550 to the local bit line $LBL_R[k]$ in accordance with the high-level write enable signal WEN. These inverter 527 and buffer 526 form a bidirectional buffer circuit.

(Configuration Example of the Buffer Circuit)

Figure 19:
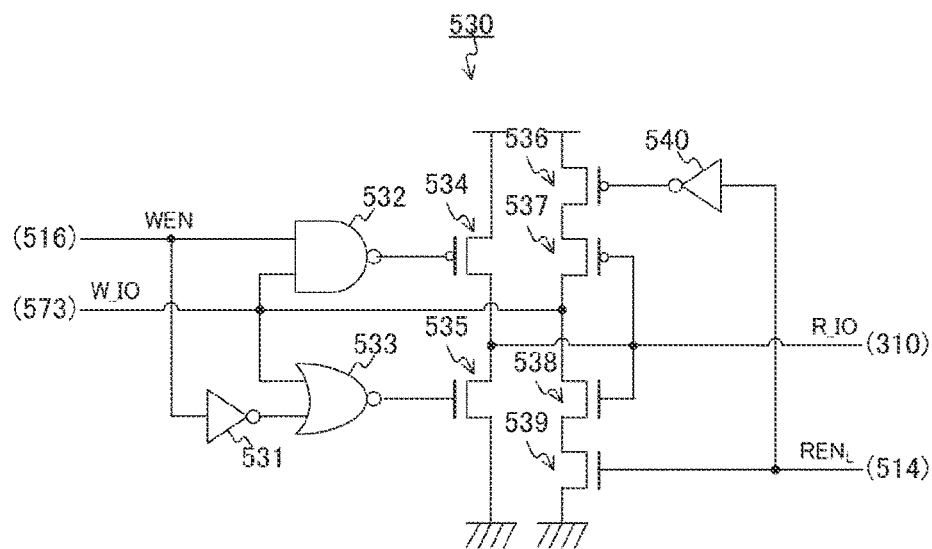
FIG. 19 is a circuit diagram illustrating a configuration example of a buffer circuit in the first embodiment of the present technology.

FIG. 19 is a circuit diagram illustrating a configuration example of the buffer circuit 530 in the first embodiment of the present technology. The buffer circuit 530 includes inverters 531 and 540, a NAND gate 532, a NOR gate 533, PMOS transistors 534, 536, and 537, and NMOS transistors 535, 538, and 539.

The inverter 531 inverts the write enable signal WEN and outputs the inverted signal to the NOR gate 533. The NAND gate 532 outputs a negative logic product of the write enable signal WEN and the input bit from the terminal W_IO to the gate of the PMOS transistor 534. The NOR gate 533 outputs a negative logic sum of the signal from the inverter 531 and the input bit from the terminal W_IO to the gate of the NMOS transistor 535.

The PMOS transistor 534 and the NMOS transistor 535 are connected in series between the power supply and the ground terminal. Also, the connection point between the PMOS transistors 534 and the NMOS transistor 535 is connected to the terminal R_IO and the respective gates of the PMOS transistor 537 and the NMOS transistor 538.

The inverter 540 inverts the read enable signal $REN_L$ and outputs the inverted signal to the gate of the PMOS transistor 536.

The PMOS transistors 536 and 537 and the NMOS transistors 538 and 539 are connected in series between the power supply and the ground terminal. Also, the read enable signal $REN_L$ is input to the gate of the NMOS transistor 539.

Thanks to the above configuration, the buffer circuit 530 inverts the bit read out from the terminal R_IO and outputs the inverted signal from the terminal W_IO in accordance with the read enable signal $REN_L$. Also, the buffer circuit 530 outputs, to the terminal R_IO, the bit input from the terminal W_IO in accordance with the write enable signal WEN.

(Configuration Example of the Flip-Flop)

Figure 20:
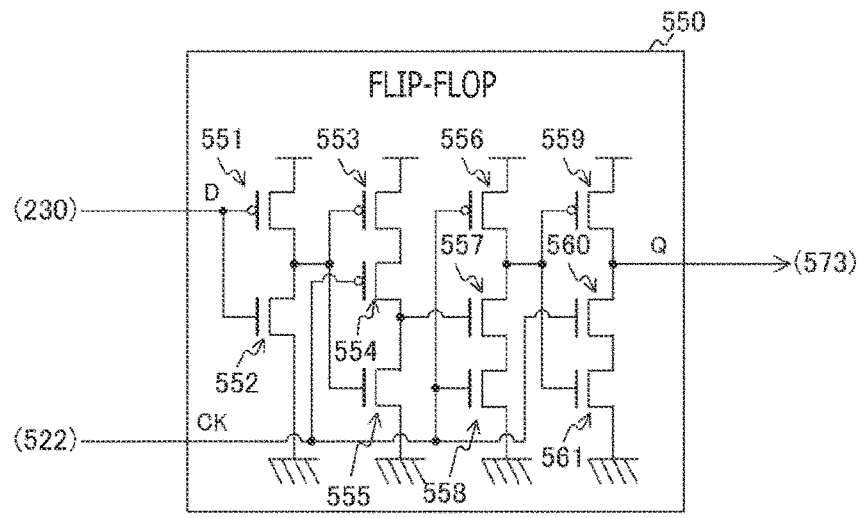
FIG. 20 is a circuit diagram illustrating a configuration example of a flip-flop in the first embodiment of the present technology.

FIG. 20 is a circuit diagram illustrating a configuration example of the flip-flop 550 in the first embodiment of the present technology. The flip-flop 550 includes PMOS transistors 551, 553, 554, 556, and 559 and NMOS transistors 552, 555, 557, 558, 560, and 561.

The PMOS transistor 551 and the NMOS transistor 552 are connected in series between the power supply and the ground terminal. The gates of these transistors are connected to a D terminal.

The PMOS transistors 553 and 554 and the NMOS transistor 555 are connected in series between the power supply and the ground terminal. The gates of the PMOS transistor 553 and the NMOS transistor 555 are connected to a connection point between the PMOS transistor 551 and the NMOS transistor 552. Also, the gate of the PMOS transistor 554 is connected to a clock terminal CK.

The PMOS transistor 556 and the NMOS transistors 557 and 558 are connected in series between the power supply and the ground terminal. The gates of the PMOS transistor 556 and the NMOS transistor 558 are connected to the clock terminal CK. Also, the gate of the NMOS transistor 557 is connected to a connection point between the PMOS transistor 554 and the NMOS transistor 555.

The PMOS transistor 559 and the NMOS transistors 560 and 561 are connected in series between the power supply and the ground terminal. The gates of the PMOS transistor 559 and the NMOS transistor 561 are connected to a connection point between the PMOS transistor 556 and the NMOS transistor 557. Also, the gate of the NMOS transistor 560 is connected to the clock terminal CK.

Thanks to the above configuration, the flip-flop 550 outputs the input of the D terminal to Q at a rising edge of the clock signal input to the clock terminal and puts a Q node into a high Z state at a falling edge of the clock signal, thus allowing the Q signal to be held. Also, thanks to the above configuration, the buffer circuit 530 allows data to be written to a Q wiring node.

(Configuration Example of the Column Processing Section)

Figure 21:
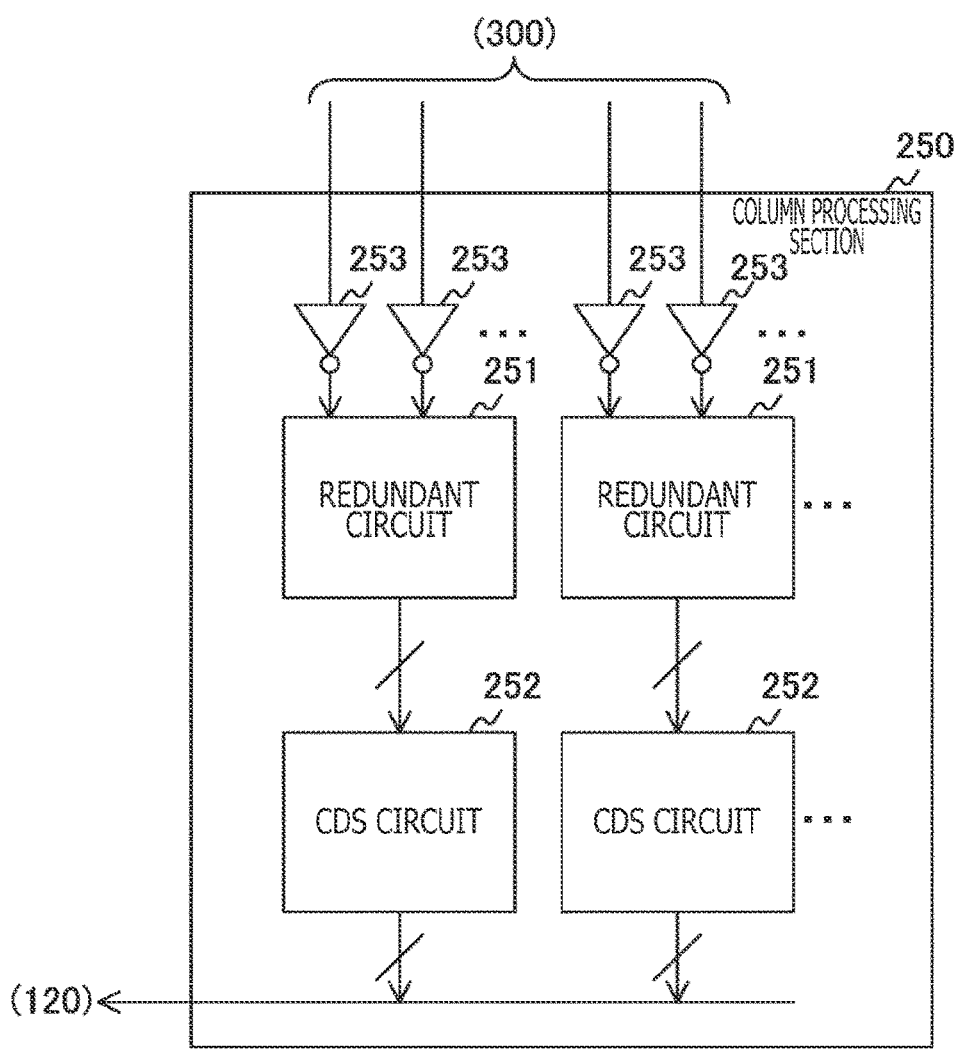
FIG. 21 is a block diagram illustrating a configuration example of a column processing section in the first embodiment of the present technology.

FIG. 21 is a block diagram illustrating a configuration example of the column processing section 250 in the first embodiment of the present technology. The column processing section 250 includes an inverter 253 for each signal line and a redundant circuit 251 and a CDS circuit 252 for each column.

The inverters 253 invert bits from the pixel array section 300. Each of the inverters 253 sends the inverted bit to the corresponding redundant circuit 251.

The redundant circuits 251 are similar in configuration to the redundant circuits 240 illustrated in FIG. 15. Also, the CDS circuits 252 perform a CDS process of calculating the difference between P phase data and D phase data of the corresponding column as net pixel data. These CDS circuit 252 outputs pixel data to the DSP circuit 120.

(Configuration Example of the Row AER Circuit)

Figure 22:
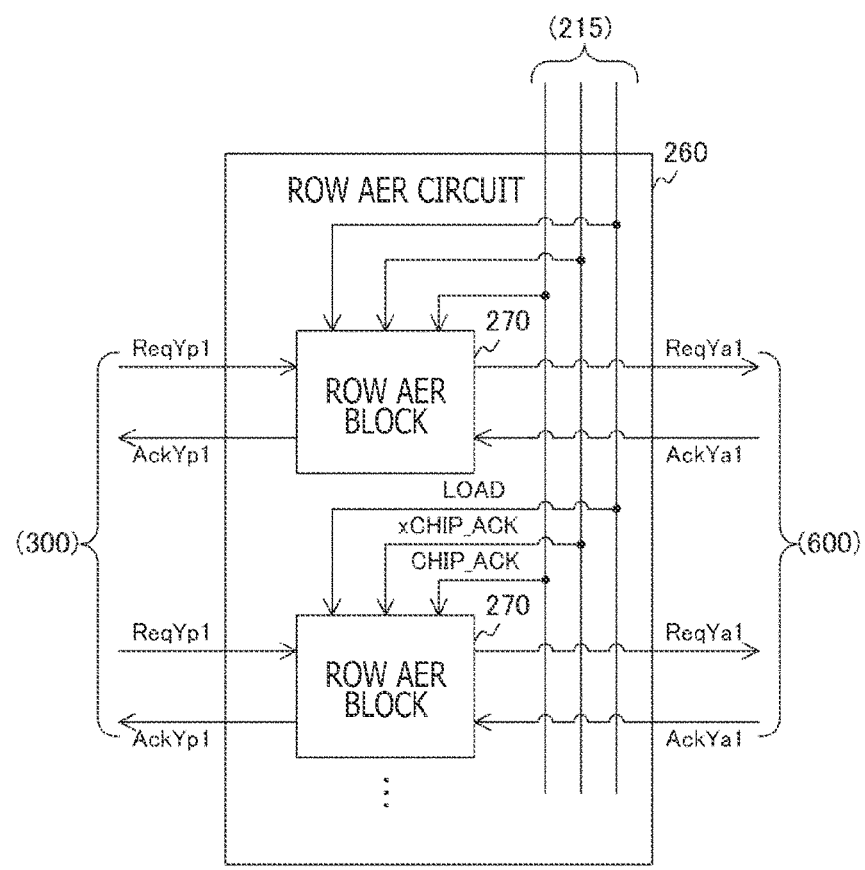
FIG. 22 is a block diagram illustrating a configuration example of a row AER circuit in the first embodiment of the present technology.

FIG. 22 is a block diagram illustrating a configuration example of the row AER circuit 260 in the first embodiment of the present technology. The row AER circuit 260 includes a row AER block 270 for each row. The row AER block 270 carries out handshaking between the corresponding row, the row arbiter 600, and the state machine 215.

(Configuration Example of the Row AER Block)

Figure 23:
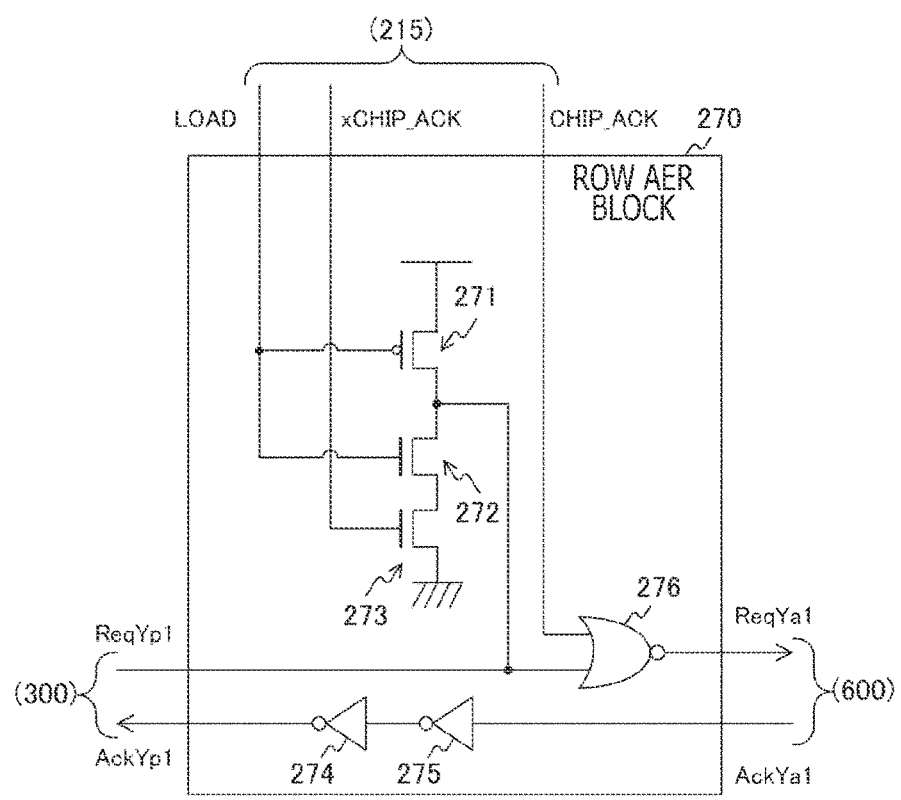
FIG. 23 is a circuit diagram illustrating a configuration example of a row AER block in the first embodiment of the present technology.

FIG. 23 is a circuit diagram illustrating a configuration example of the row AER block 270 in the first embodiment of the present technology. The row AER block 270 includes a PMOS transistor 271, NMOS transistors 272 and 273, a NOR gate 276, and inverters 274 and 275.

The PMOS transistor 271 and the NMOS transistors 272 and 273 are connected in series between the power supply and the ground terminal. Also, a control signal LOAD is input to the gates of the PMOS transistor 271 and the NMOS transistor 272 from the state machine 215. The control signal LOAD is used to instruct that an address event detection result be read out. Also, ×CHIP_ACK acquired by inverting an acknowledgement CHIP_ACK from the state machine 215 is input to the gate of the NMOS transistor 273.

The NOR gate 276 outputs a negative logic sum of two input values to the row arbiter 600 as a request ReqYa1. The acknowledgement CHIP_ACK from the state machine 215 is input to one input terminal of the NOR gate 276. Other input terminal of the NOR gate 276 is connected to a connection point between the PMOS transistor 271 and the NMOS transistor 272 and a signal line that transmits the request ReqYp1 from the pixel array section 300.

The inverter 275 inverts an acknowledgement AckYa1 from the row arbiter 600 and outputs the inverted acknowledgement to the inverter 274. The inverter 274 inverts the signal from the inverter 275 and outputs the inverted signal to the pixel array section 300 as the acknowledgement AckYp1.

Thanks to the above configuration, when the low-level request ReqYp1 is input, and if the acknowledgement CHIP_ACK is at high level, the row AER block 270 outputs the low-level request ReqYa1. Also, the row AER block 270 delays the high-level acknowledgement AckYa1 and outputs the delayed acknowledgement as the acknowledgement AckYp1.

(Configuration Example of the Column AER Circuit)

Figure 24:
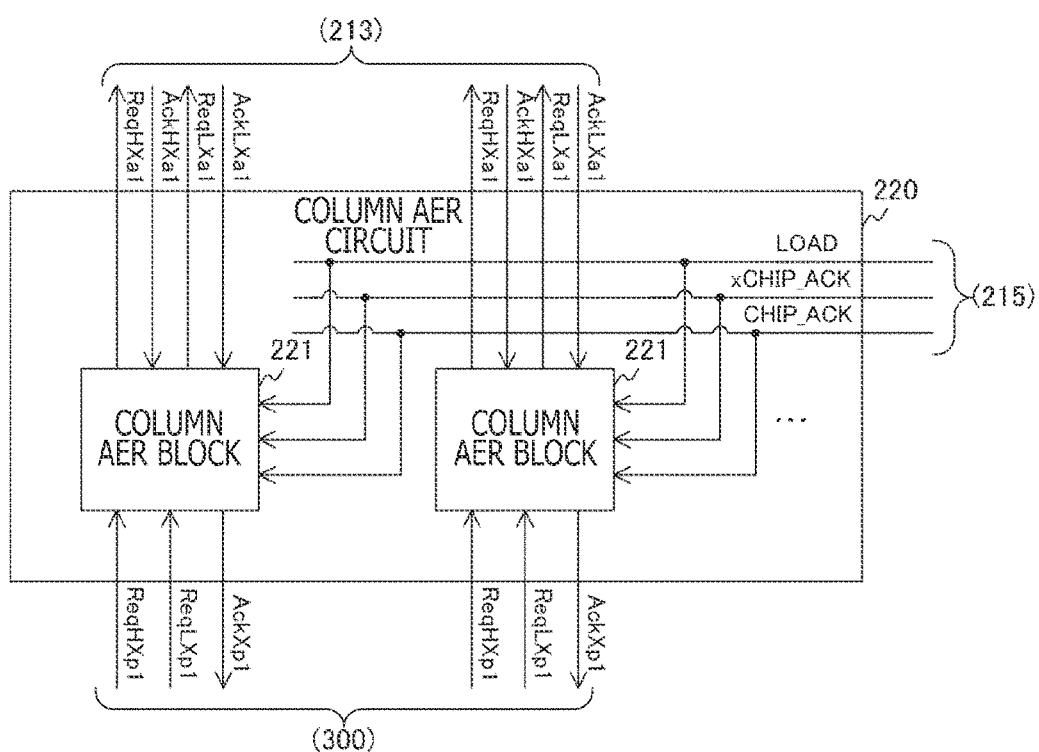
FIG. 24 is a block diagram illustrating a configuration example of a column AER circuit in the first embodiment of the present technology.

FIG. 24 is a block diagram illustrating a configuration example of the column AER circuit 220 in the first embodiment of the present technology. The column AER circuit 220 includes a column AER block 221 for each column. The column AER block 221 carries out handshaking between the corresponding column, the state machine 215, and the column arbiter 213.

(Configuration Example of the Column AER Block)

Figure 25:
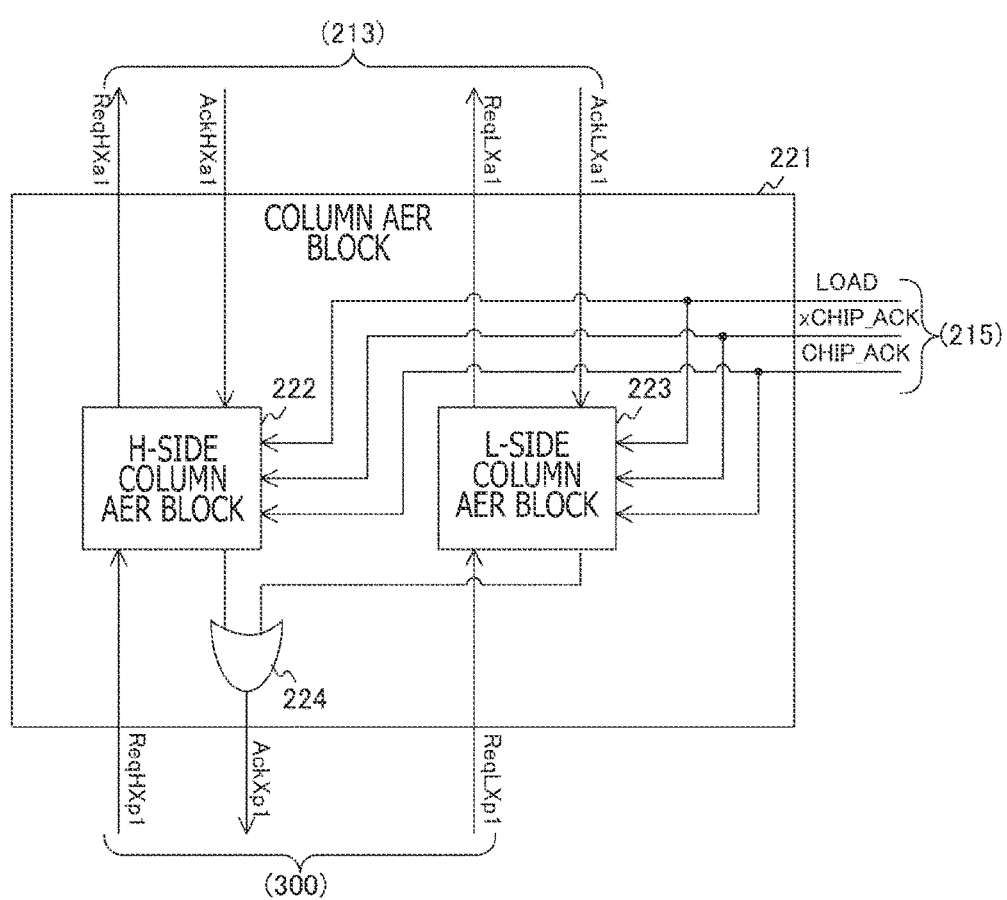
FIG. 25 is a block diagram illustrating a configuration example of a column AER block in the first embodiment of the present technology.

FIG. 25 is a block diagram illustrating a configuration example of the column AER block 221 in the first embodiment of the present technology. The column AER block 221 includes an H-side column AER block 222, an L-side column AER block 223, and an OR gate 224.

The H-side column AER block 222 carries out handshaking when the low-level request ReqHXp1 is input. The H-side column AER block 222 outputs, to the OR gate 224, a signal acquired by delaying a high-level acknowledgement AckHXa1. The L-side column AER block 223 carries out handshaking when the low-level request ReqLXp1 is input. The L-side column AER block 223 outputs, to the OR gate 224, a signal acquired by delaying a high-level acknowledgement AckLXa1. Also, the low-level request from the pixel array section 300 is inverted by the H-side column AER block 222 and the L-side column AER block 223. These H-side column AER block 222 and L-side column AER block 223 are similar in configuration to the row AER block 270 illustrated in FIG. 23. It should be noted that the configuration of these row and column AER blocks is not limited to the circuit illustrated in FIG. 23 as long as handshaking can be carried out.

The OR gate 224 outputs a logic sum of the signals from the H-side column AER block 222 and the L-side column AER block 223 as the acknowledgement AckXp1.

(Configuration Example of the Row Arbiter)

Figure 26:
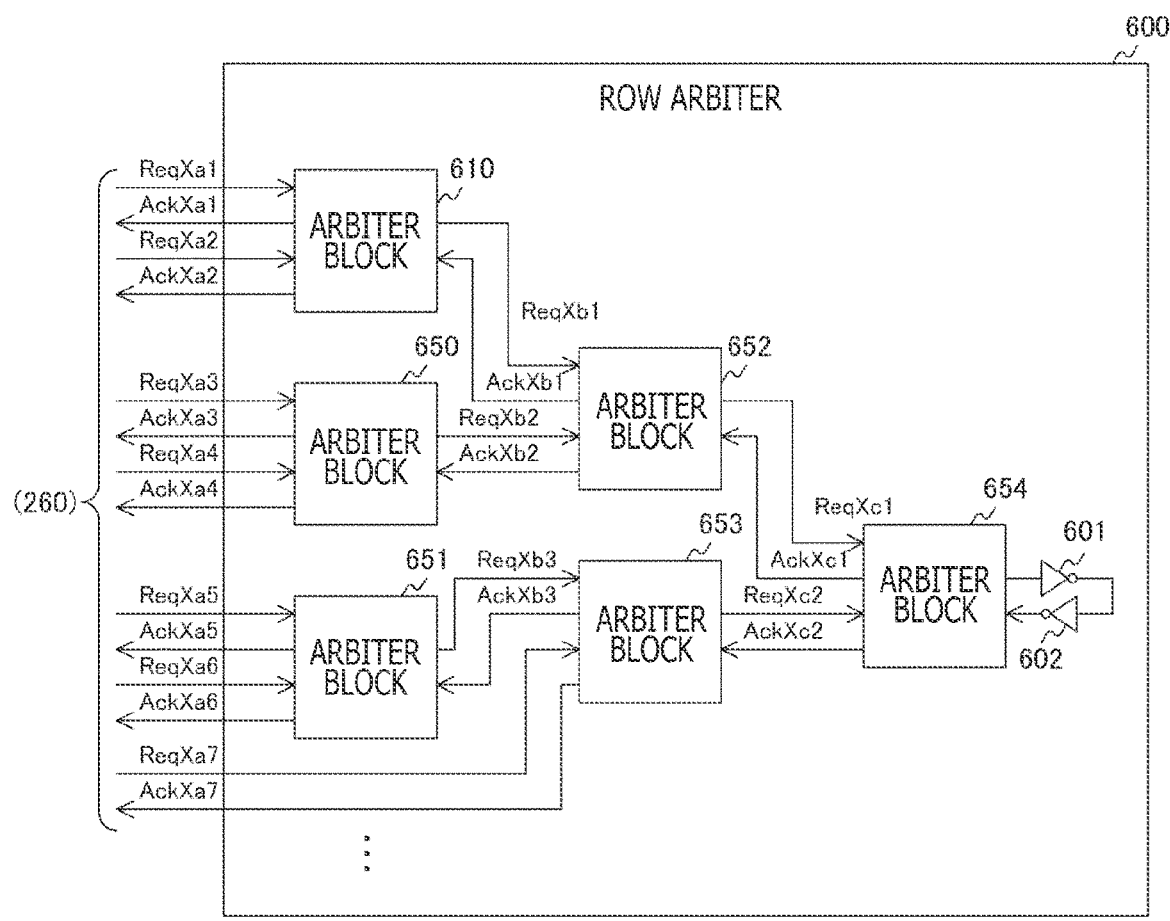
FIG. 26 is a block diagram illustrating a configuration example of a row arbiter in the first embodiment of the present technology.

FIG. 26 is a block diagram illustrating a configuration example of the row arbiter 600 in the first embodiment of the present technology. The row arbiter 600 includes arbiter blocks 610 and 650 to 654 and inverters 601 and 602 for every seven rows. It should be noted that FIG. 26 is a diagram in the case where the number of vertical event-driven pixels is seven pixels. For example, if the number of vertical event-driven pixels is 1000 pixels, ten stages of arbiters that cover up to $2^{10}$ (=1024) are provided.

The arbiter block 610 arbitrates a request from the first row and a request from the second row. The arbiter block 610 handshakes with the arbiter block 652 and outputs an acknowledgement to the first or second row on the basis of an arbitration result.

The arbiter block 650 arbitrates a request from the third row and a request from the fourth row. The arbiter block 650 handshakes with the arbiter block 652 and outputs an acknowledgement to the third or fourth row on the basis of an arbitration result.

The arbiter block 651 arbitrates a request from the fifth row and a request from the sixth row. The arbiter block 651 handshakes with the arbiter block 653 and outputs an acknowledgement to the fifth or sixth row on the basis of an arbitration result.

The arbiter block 652 arbitrates a request from the arbiter block 610 and a request from the arbiter block 650. The arbiter block 652 handshakes with the arbiter block 654 and outputs an acknowledgement to the arbiter block 610 or 650 on the basis of an arbitration result.

The arbiter block 653 arbitrates a request from the arbiter block 651 and a request from the seventh row. The arbiter block 653 handshakes with the arbiter block 654 and outputs an acknowledgement to the arbiter block 651 or the seventh row on the basis of an arbitration result.

The arbiter block 654 arbitrates a request from the arbiter block 652 and a request from the arbiter block 653. The arbiter block 654 delays an acknowledgement to the earlier request with the inverters 601 and 602 and supplies the delayed acknowledgement to the arbiter block 652 or 653.

It should be noted that the column arbiter 213 is similar in configuration to the row arbiter 600. Also, the configuration of these arbiters is not limited to that illustrated in FIG. 26 as long as requests can be arbitrated.

(Configuration Example of the Arbiter Block)

Figure 27:
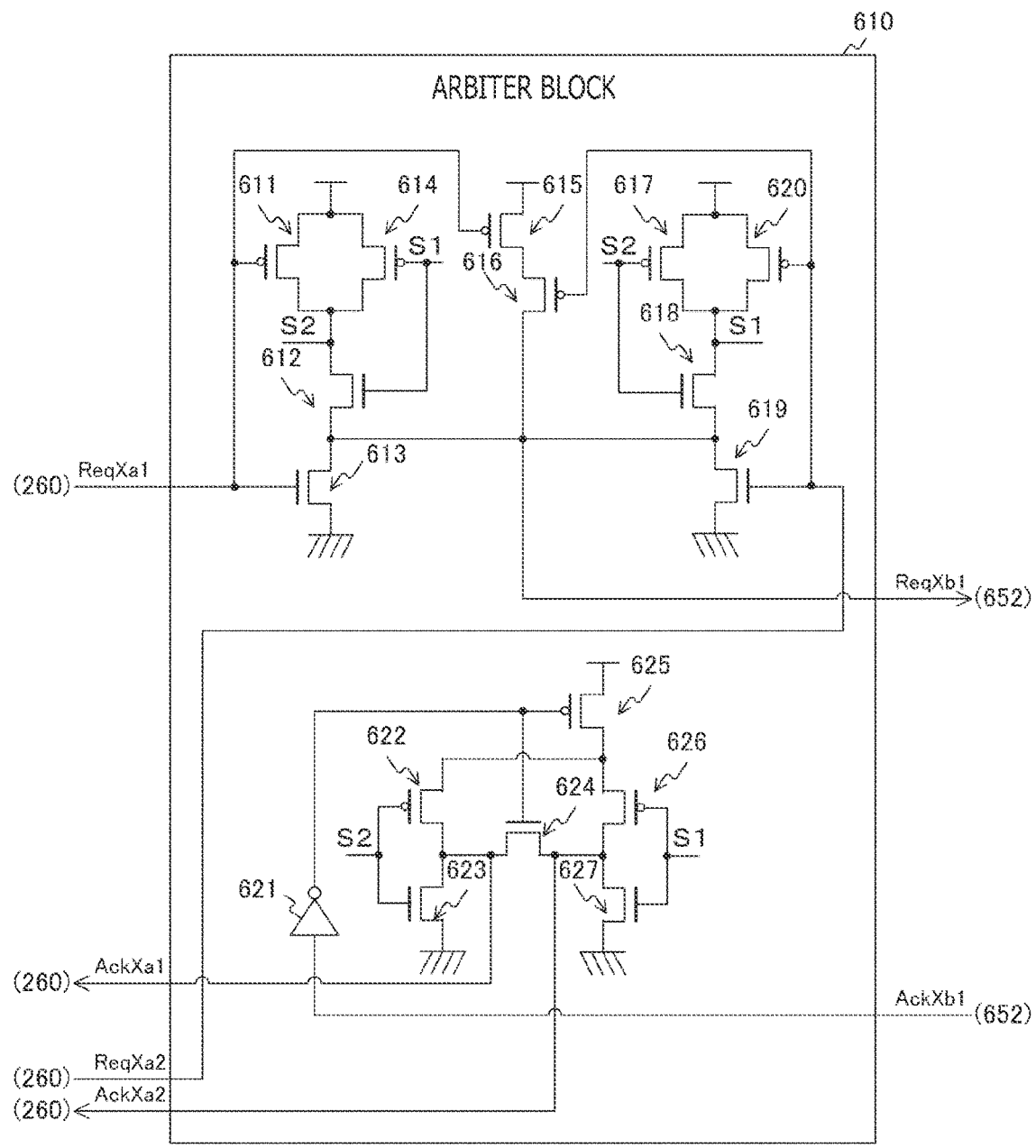
FIG. 27 is a circuit diagram illustrating a configuration example of an arbiter block in the first embodiment of the present technology.

FIG. 27 is a circuit diagram illustrating a configuration example of the arbiter block 610 in the first embodiment of the present technology. The arbiter block 610 includes PMOS transistors 611, 614, 615 to 617, 620, 622, 625, and 626, NMOS transistors 612, 613, 618, 619, 623, 624, and 627, and an inverter 621.

The PMOS transistors 611 and 614 are connected in series to the power supply. The NMOS transistors 612 and 613 are connected in series between the drains of the PMOS transistors 611 and 614 and the ground terminal. Also, a request ReqXa1 from the first row is input to the gates of the PMOS transistor 611 and the NMOS transistor 613.

The PMOS transistors 615 and 616 are connected in series to the power supply. Also, the request ReqXa1 is input to the gate of the PMOS transistor 615, and a request ReqXa2 from the second row is input to the gate of the PMOS transistor 616.

The PMOS transistors 617 and 620 are connected in series to the power supply. The NMOS transistors 618 and 619 are connected in series between the drains of the PMOS transistors 617 and 620 and the ground terminal. Also, the gates of the PMOS transistor 617 and the NMOS transistor 618 are connected to the drains of the PMOS transistors 611 and 614. The request ReqXa2 is input to the gates of the PMOS transistor 620 and the NMOS transistor 619. The drains of the PMOS transistors 617 and 620 are connected to the gates of the PMOS transistor 614 and the NMOS transistor 612.

Also, a connection point between the NMOS transistors 612 and 613, the drain of the PMOS transistor 616, and a connection point between the NMOS transistors 618 and 619 are connected to a signal line that transmits a request ReqXb1. The request ReqXb1 is output to the higher-order arbiter block 652.

The inverter 621 inverts an acknowledgement AckXb1 from the higher-order arbiter block 652. The inverter 621 outputs the inverted signal to the gates of the PMOS transistor 625 and the NMOS transistor 624.

The PMOS transistors 625 and 626 and the NMOS transistor 627 are connected in series between the power supply and the ground terminal. Also, the PMOS transistor 622 and the NMOS transistor 623 are connected in series between a connection point between the PMOS transistors 625 and 626 and the ground terminal. The source and drain of the NMOS transistor 624 are connected to a connection point between the PMOS transistor 622 and the NMOS transistor 623 and a connection point between the PMOS transistor 626 and the NMOS transistor 627.

Also, the gates of the PMOS transistor 622 and the NMOS transistor 623 are connected to the drains of the PMOS transistor 611 and the NMOS transistor 614. The gates of the PMOS transistor 626 and the NMOS transistor 627 are connected to the drains of the PMOS transistor 617 and the NMOS transistor 620. A connection point between the PMOS transistor 622 and the NMOS transistor 623 is connected to a signal line that transmits an acknowledgement AckXa1 to the first row. A connection point between the PMOS transistor 626 and the NMOS transistor 627 is connected to a signal line that transmits an acknowledgement AckXa2 to the second row.

Thanks to the above configuration, when the request ReqXb1 or ReqXb2 is received, the arbiter block 610 outputs the request ReqXb1. Then, when the acknowledgement AckXb1 is received, the arbiter block 610 outputs an acknowledgement corresponding to the one of two requests ReqXb1 and ReqXb2 that arrives earlier.

The arbiter blocks 650 to 654 are similar in configuration to the arbiter block 610 illustrated in FIG. 27.

Figure 28:
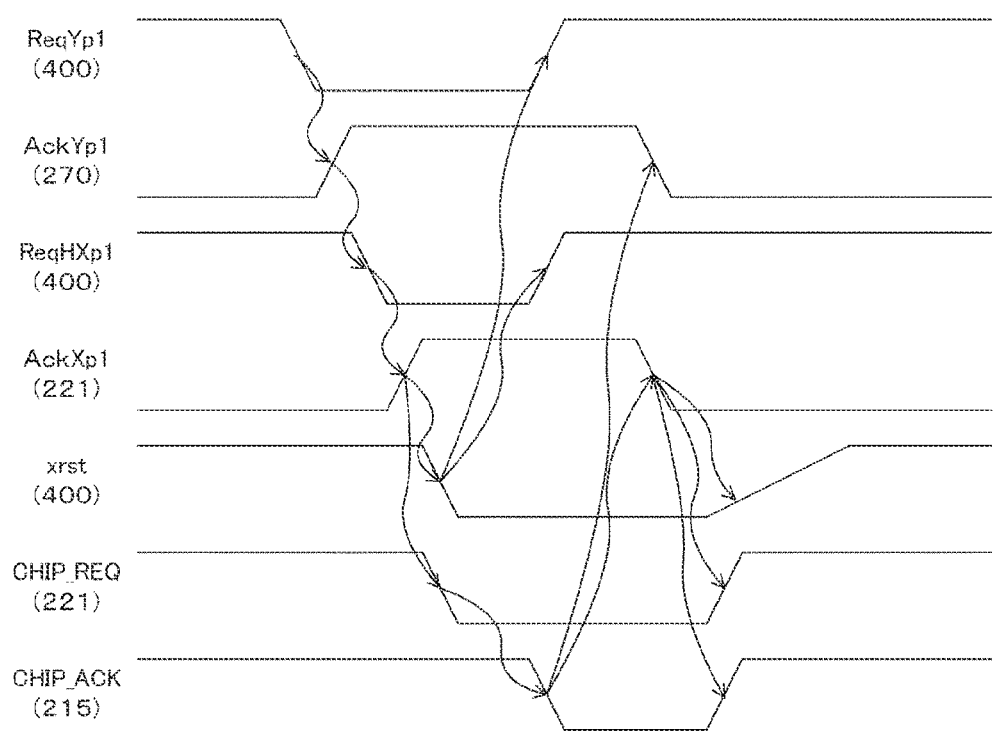
FIG. 28 is a timing diagram illustrating an example of handshaking in the first embodiment of the present technology.

FIG. 28 is a timing diagram illustrating an example of handshaking in the first embodiment of the present technology. When the W pixel 400 outputs the low-level request ReqYp1, and if the acknowledgement CHIP_ACK is at high level, the row AER block 270 returns the high-level acknowledgement AckYp1.

When the acknowledgement AckYp1 is received, and in the case where an ON event occurs, the W pixel 400 outputs the low-level request ReqHXp1. It should be noted that in the case where an OFF event occurs, the low-level request ReqLXp1 is output.

When the request ReqLXp1 is received, and if the acknowledgement CHIP_ACK is at high level, the column AER block 221 returns the high-level acknowledgement AckXp1. When the acknowledgement AckXp1 is received, the W pixel 400 generates the low-level reset signal xrst and initializes the requests ReqYp1 and ReqHXp1 to high level.

Also, when the acknowledgement AckXp1 is output, the column AER block 221 outputs a low-level request CHIP_REQ. When the request CHIP_REQ is received, the state machine 215 transfers an address event detection result to the DSP circuit 120 and returns the low-level acknowledgement CHIP_ACK.

When the acknowledgement CHIP_ACK is received, and if the request ReqYp1 is at high level, the row AER block 270 initializes the acknowledgement AckYp1 to low level. Also, when the acknowledgement CHIP_ACK is received, and if the request ReqHXp1 is at high level, the column AER block 221 initializes the acknowledgement AckXp1 to low level.

When the acknowledgement AckXp1 is initialized, the W pixel 400 initializes the reset signal xrst to high level, and the column AER block 221 initializes the request CHIP_REQ to high level. Also, the state machine 215 initializes the acknowledgement CHIP_ACK to high level.

Figure 29:
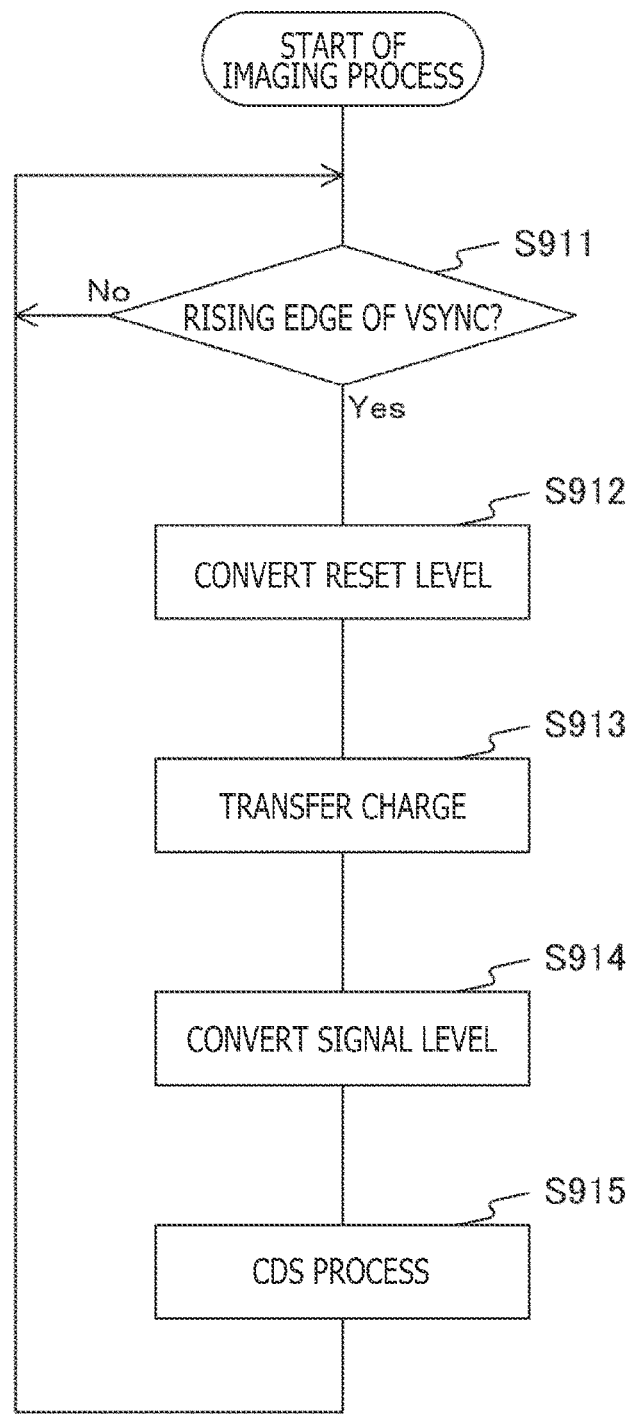
FIG. 29 is a flowchart illustrating an example of an imaging process in the first embodiment of the present technology.

(Operation example of the solid-state imaging element)
FIG. 29 is a flowchart illustrating an example of an imaging process in the first embodiment of the present technology. This imaging process is initiated, for example, when an application for capturing normal image data is executed.

The solid-state imaging element 200 decides whether or not VSYNC is at a rising edge (step S911). In the case where VSYNC is at a rising edge (Yes in step S911), each of the pixels of the solid-state imaging element 200 converts a reset level into P phase data immediately prior to the end of exposure (step S912). Then, the pixels transfer the charge to the FD at the end of exposure (step S913) and convert a signal level into D phase data (step S914). Then, the solid-state imaging element 200 performs the CDS process (step S915). In the case where VSYNC has yet to reach a rising edge (No in step S911), or after step S915, the solid-state imaging element 200 repeats step S911 and subsequent steps.

Figure 30:
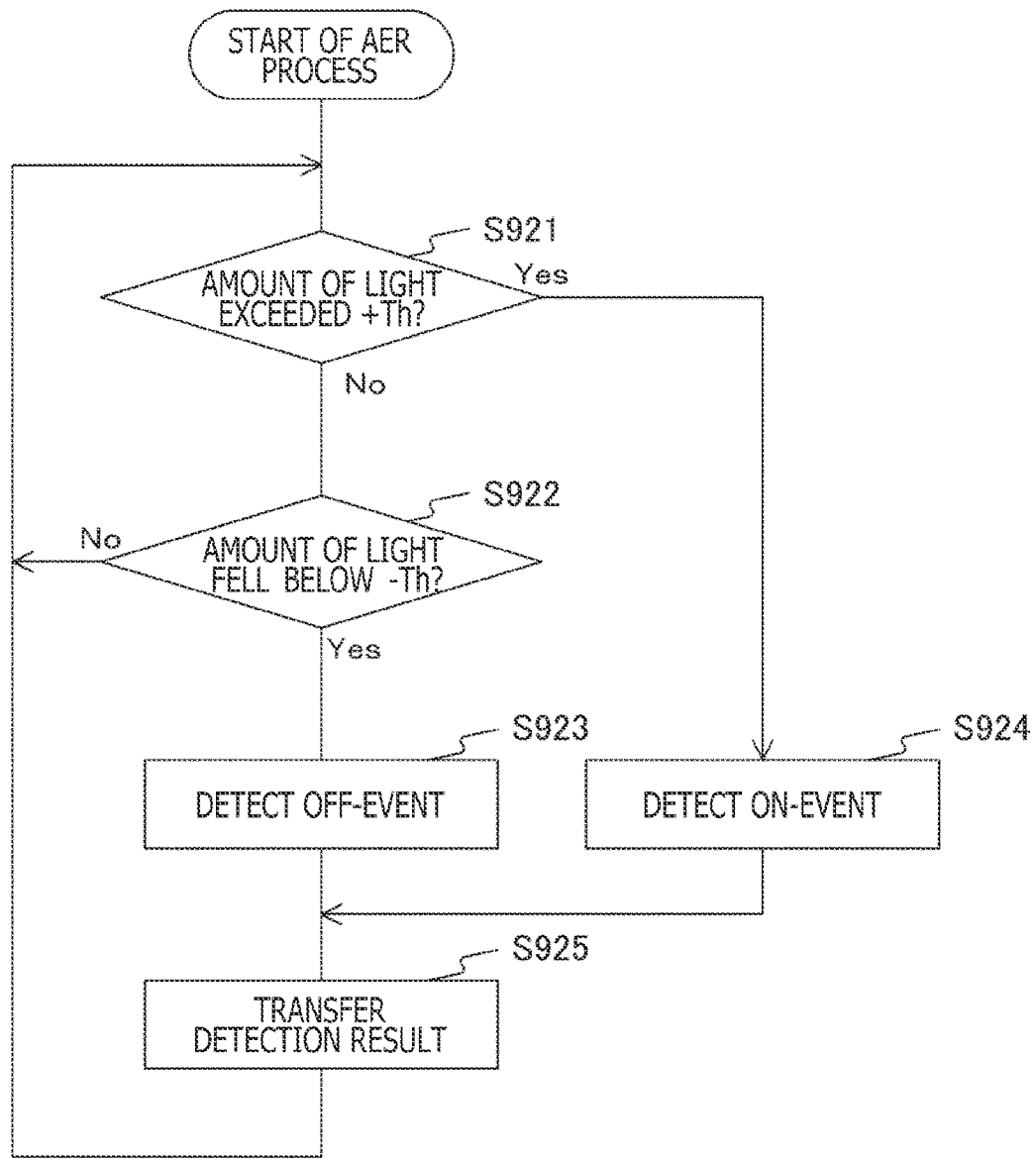
FIG. 30 is a flowchart illustrating an example of an AER process in the first embodiment of the present technology.

FIG. 30 is a flowchart illustrating an example of an AER process in the first embodiment of the present technology. This AER process is initiated, for example, when an application for AER is executed.

The W pixel 400 of the solid-state imaging element 200 decides whether or not the difference in amount of light has exceeded+Th, the value corresponding to the threshold Vthon (step S921). In the case where the difference in amount of light is equal to or smaller than +Th (No in step S921), the W pixel 400 decides whether or not the difference in amount of light has fallen below −Th, the value corresponding to the threshold Vthoff (step S922). In the case where the difference in amount of light is smaller than −Th (Yes in step S922), the W pixel 400 detects an OFF event (step S923). On the other hand, in the case where the amount of light has exceeded+Th (Yes in step S921), the W pixel 400 detects an ON event (step S924).

After step S923 or S924, the W pixel 400 transfers an address event detection result through handshaking (step S925) and repeats step S921 and subsequent steps. Also, in the case where the difference in amount of light is equal to or greater than −Th (No in step S922), the W pixel 400 repeats step S921 and subsequent steps.

As described above, in the first embodiment of the present technology, the W pixel 400 detects an address event and converts a pixel signal into a digital signal, thus allowing for generation of high-quality normal image data that includes the digital signal while detecting the address event.

2. Second Embodiment

In the first embodiment described above, each of the pixels such as the R pixel 310 transferred P phase data first after conversion of a reset level into the P phase data and then transferred the P phase data to the column processing section 250 and converted a signal level into D phase data. However, with this processing method, a sampling period from the beginning of the reset level conversion to the end of the signal level conversion is longer by the transfer time of P phase data, making it likely that impacts of dark current cannot be suppressed sufficiently. The solid-state imaging element 200 of a second embodiment differs from that of the first embodiment in that impacts of dark current are suppressed by shortening the sampling period.

Figure 31:
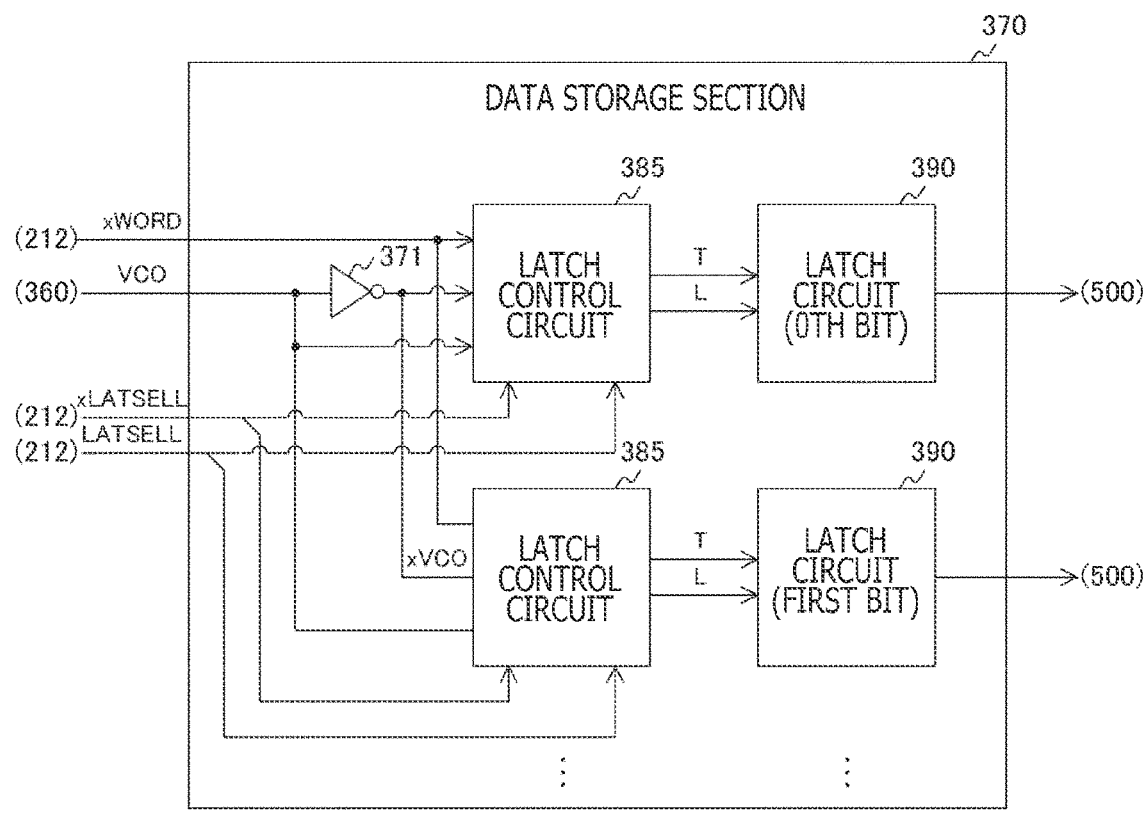
FIG. 31 is a block diagram illustrating a configuration example of a data storage section in a second embodiment of the present technology.

FIG. 31 is a block diagram illustrating a configuration example of the data storage section 370 in the second embodiment of the present technology. The data storage section 370 of the second embodiment includes as many latch circuits 390 as necessary to hold both P phase data and D phase data and differs from that of the first embodiment in that a latch control circuit 385 is provided for each latch circuit 390.

For example, in the case where the P phase data is 14 bits long and the D phase data is 16 bits long, as many latch circuits 390 and latch control circuit 385 as necessary to cover 30 bits are provided.

Figure 32:
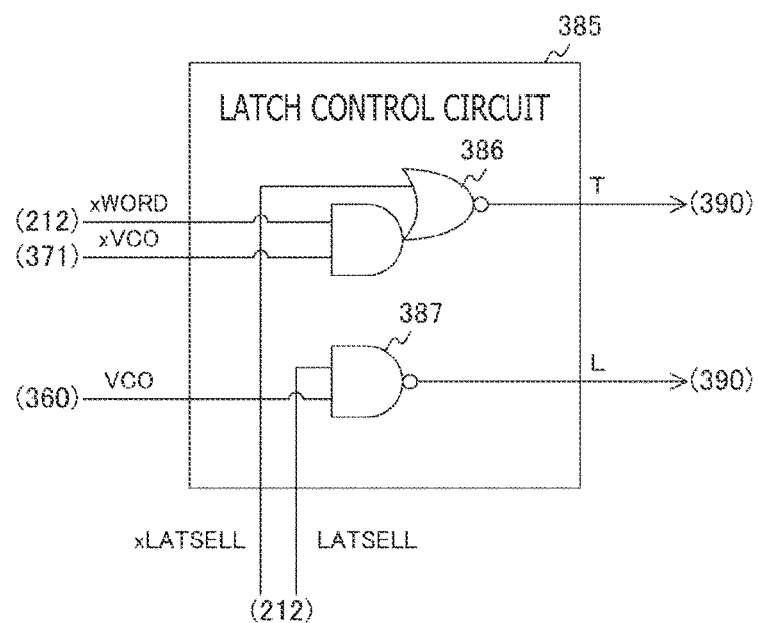
FIG. 32 is a circuit diagram illustrating a configuration example of a latch control circuit in the second embodiment of the present technology.

FIG. 32 is a circuit diagram illustrating a configuration example of the latch control circuit 385 in the second embodiment of the present technology. The latch control circuit 385 includes a composite gate 386 and a NAND gate 387.

The composite gate 386 performs logic operations on the control signal xWORD and a control signal xLATSELL from the drive circuit 212 and a signal xVCO from the inverter 371. The composite gate 386 outputs a negative logic sum of a logic product of the control signal xWORD and the signal xVCO and the control signal xLATSELL to the latch circuit 390 as a latch control signal T.

The NAND gate 387 outputs a negative logic product of a control signal LATSELL from the drive circuit 212 and the output signal VCO from the positive feedback circuit 360 to the latch circuit 390 as a latch control signal L.

Figure 33:
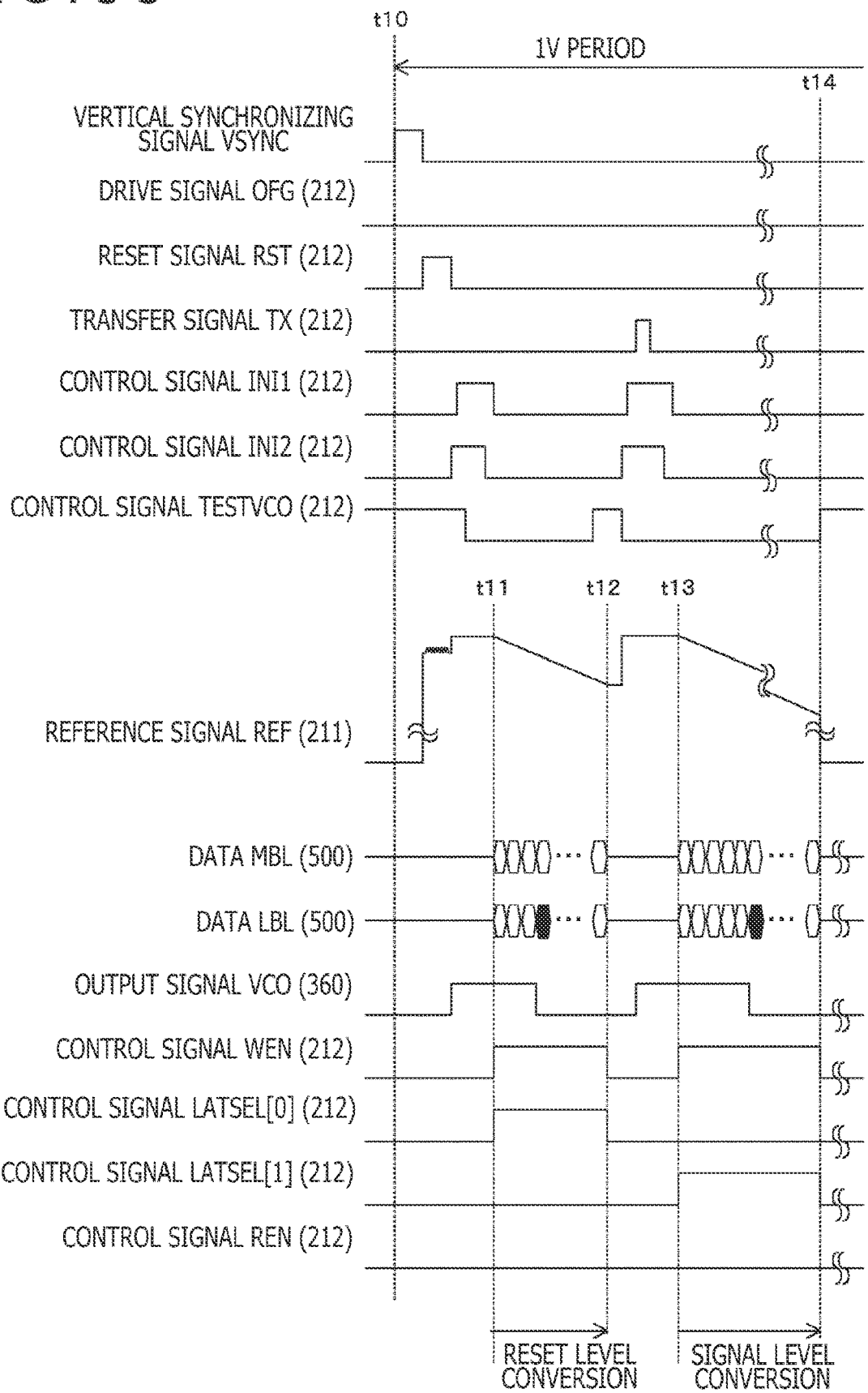
FIG. 33 is a timing diagram illustrating an example of a sampling process of a solid-state imaging element in the second embodiment of the present technology.

FIG. 33 is a timing diagram illustrating an example of a sampling process of the solid-state imaging element 200 in the second embodiment of the present technology. During the 1V period starting from time t10, the pixel performs a process of converting the reset level into P phase data from time t11 to time t12. The pixel holds the P phase data in the latch circuit 390 provided therein without outputting the data and next performs a process of converting a signal level into D phase data from time t13 to time t14.

Figure 34:
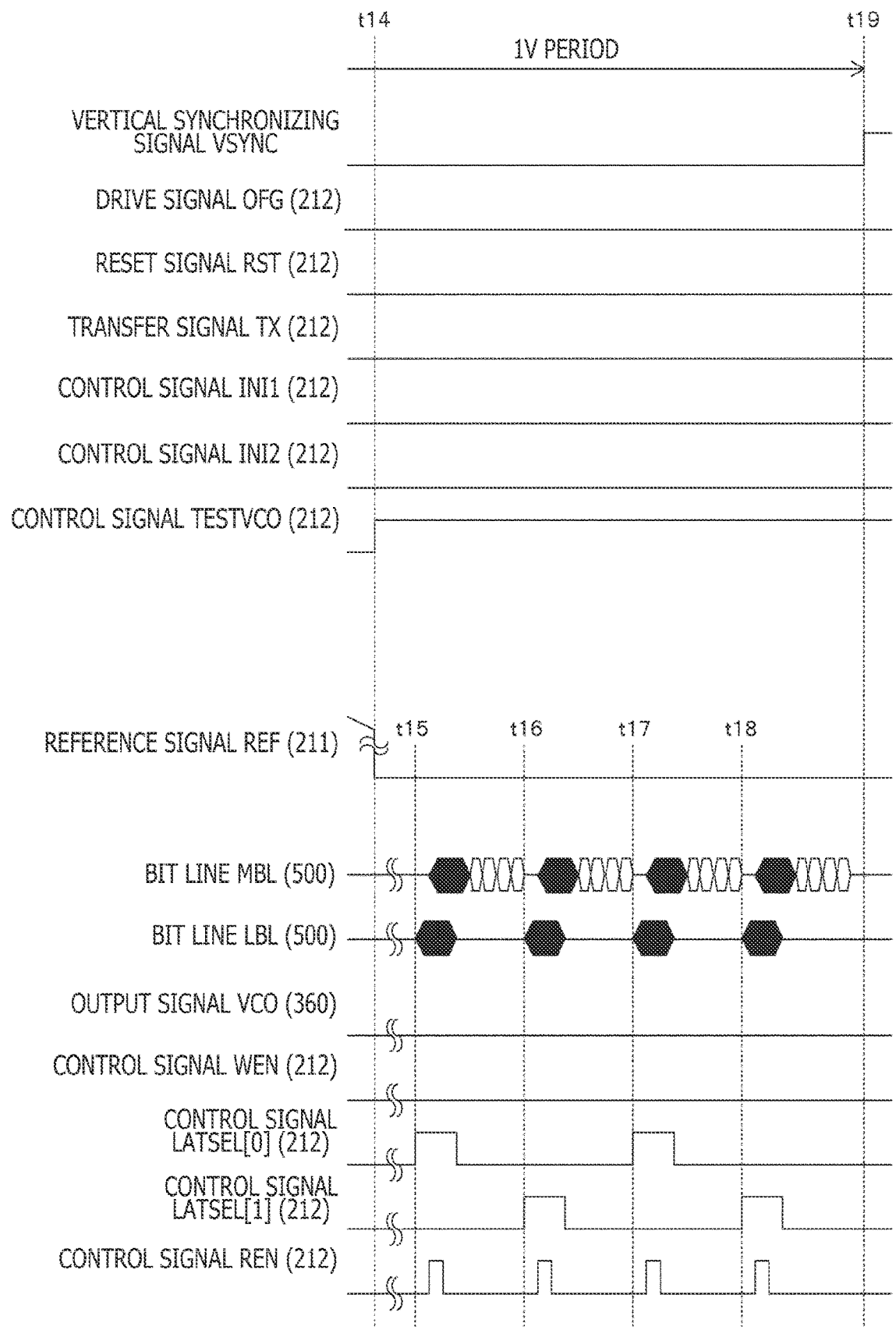
FIG. 34 is a timing diagram illustrating an example of operation after sampling of the solid-state imaging element in the second embodiment of the present technology.

FIG. 34 is a timing diagram illustrating an example of operation after the sampling of the solid-state imaging element 200 in the second embodiment of the present technology. The drive circuit 212 causes P phase data to be output using a control signal LATSELL[0] at time t15 immediately after time t14 when the signal level sampling ends. Next, at time t16, the drive circuit 212 outputs D phase data using a control signal LATSELL[1].

Then, at time t17, the drive circuit 212 outputs P phase data using the control signal LATSELL[0]. Next, at time t18, the drive circuit 212 outputs D phase data using the control signal LATSELL[1].

As described above, in the second embodiment of the present technology, the pixel holds P phase data. Therefore, it is possible to start signal level sampling immediately after reset level sampling. This makes it possible to shorten the sampling period, thus suppressing impacts of dark current.

Modification Example

In the second embodiment described above, each of the pixels such as the R pixel 310 converted a plurality of signal levels into digital signals over the same exposure time. However, this may lead to insufficient dynamic range under natural light. It is common to increase the dynamic range by generating pixel data with short time exposure and pixel data with long time exposure and combining these pieces of data together. However, this method is problematic in that the total exposure time including the long time exposure and the short time exposure is lengthy. A modification example of the solid-state imaging element 200 of the second embodiment differs from that of the second embodiment in that the dynamic range is increased while suppressing the increase in exposure time.

Figure 35:
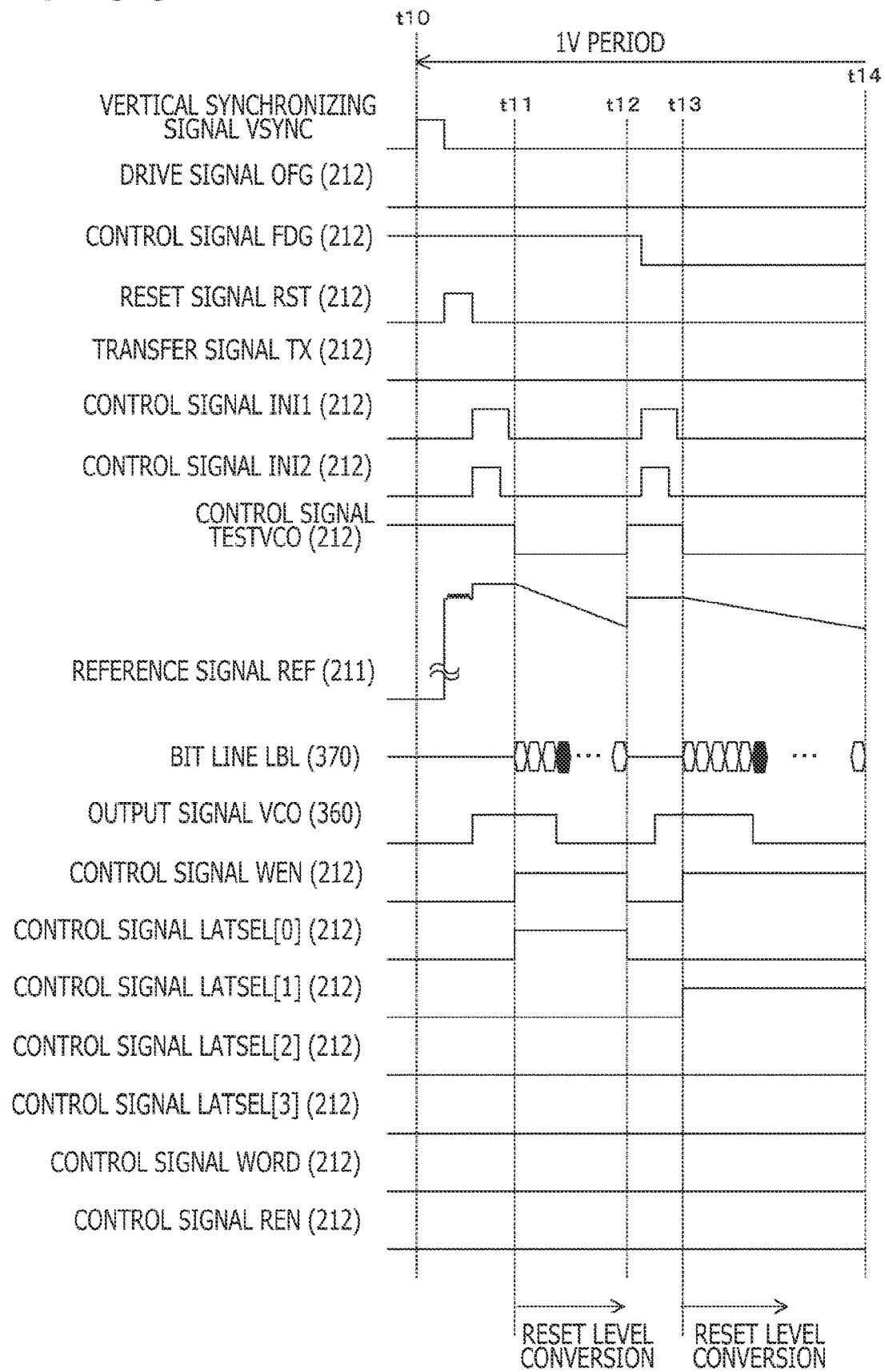
FIG. 35 is a timing diagram illustrating an example of a reset level sampling process of the solid-state imaging element in a modification example of the second embodiment of the present technology.

FIG. 35 is a timing diagram illustrating an example of a reset level sampling process of the solid-state imaging element 200 in a modification example of the second embodiment of the present technology. During the 1V period starting from time t10, the pixel performs a reset level conversion process from time t11 to time t12. The pixel holds the first piece of P phase data using the control signals WEN and LATSEL[0], and the drive circuit 212 shifts the control signal from high to low level, thus reducing sensitivity of the pixel.

The pixel performs a reset level conversion process for a second time from time t13 to time t14. The second P phase data is held by the control signals WEN and LATSEL[1]. In the second conversion process, the DAC 211 changes the slope of the reference signal REF to a flatter inclination than in the first reset level conversion process. Because of reduced sensitivity and the slope inclination change, the second reset level is subjected to AD conversion with a higher resolution than the first one.

It should be noted that although the solid-state imaging element 200 handles both sensitivity control with the control signal FDG and slope inclination control, only one of the two types of control may be performed.

Figure 36:
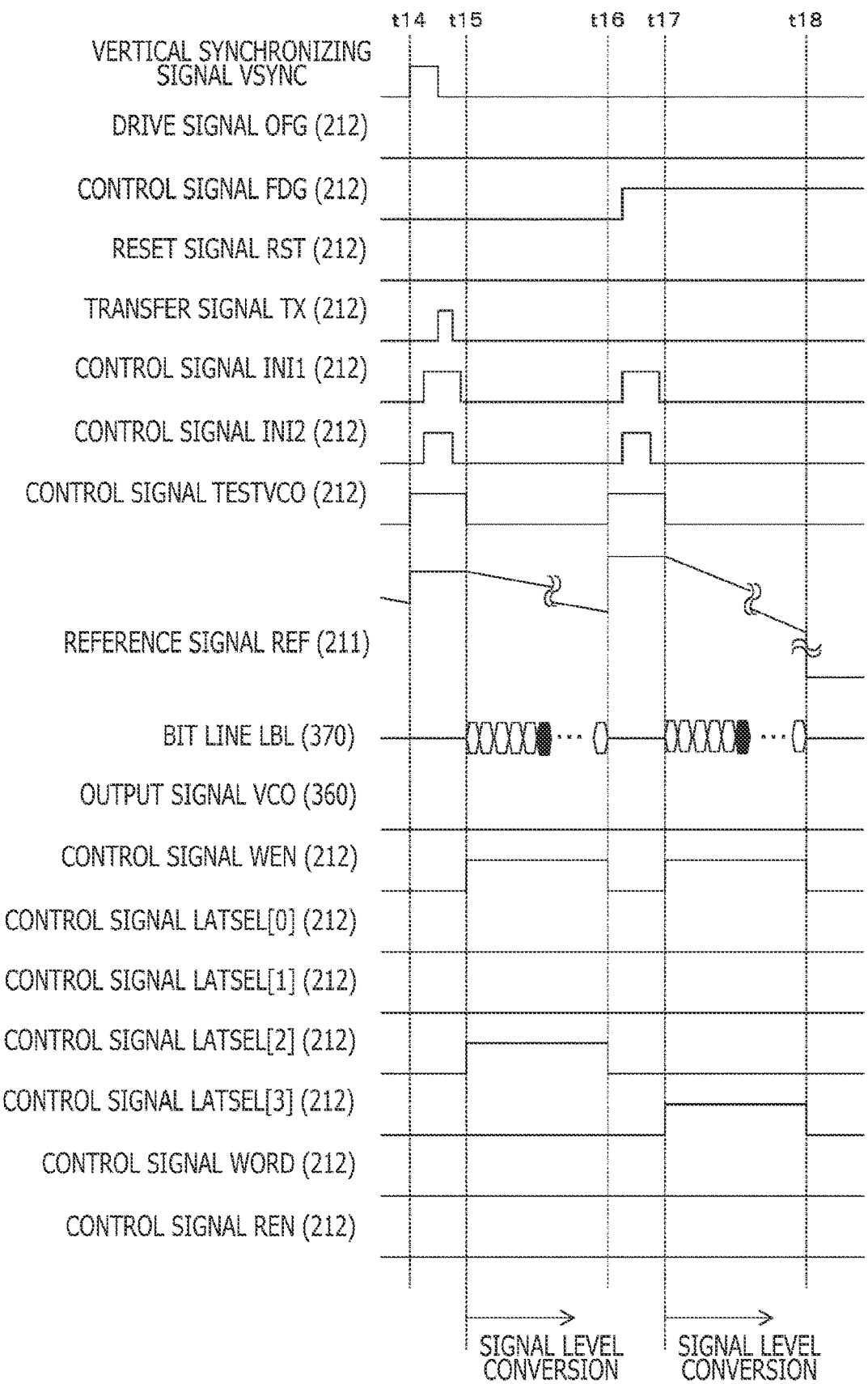
FIG. 36 is a timing diagram illustrating an example of a signal level sampling process of the solid-state imaging element in the modification example of the second embodiment of the present technology.

FIG. 36 is a timing diagram illustrating an example of a signal level sampling process of the solid-state imaging element 200 in the modification example of the second embodiment of the present technology. The pixel holds the first and second pieces of P phase data and performs the first signal level conversion process from time t15 to time t16. The pixel further holds the first piece of D phase data using the control signal WEN and a control signal LATSEL[2], and the drive circuit 212 shifts the control signal FDG from low to high level and brings the pixel sensitivity back to the value at the time of the first reset level sampling.

The pixel performs the second signal level conversion process from time t17 to time 18. The second piece of D phase data is held by the control signals WEN and a control signal LATSEL[3]. In the second conversion process, the DAC 211 changes the slope of the reference signal REF back to the inclination at the time of the first reset level sampling. Because of improved sensitivity and the slope inclination change, the second signal level is subjected to AD conversion with a lower resolution than the first one.

As described above, the resolution switching scheme requires only a single pixel exposure and eliminates the need to perform both long time exposure and short time exposure, thus suppressing the increase in exposure time.

Figure 37:
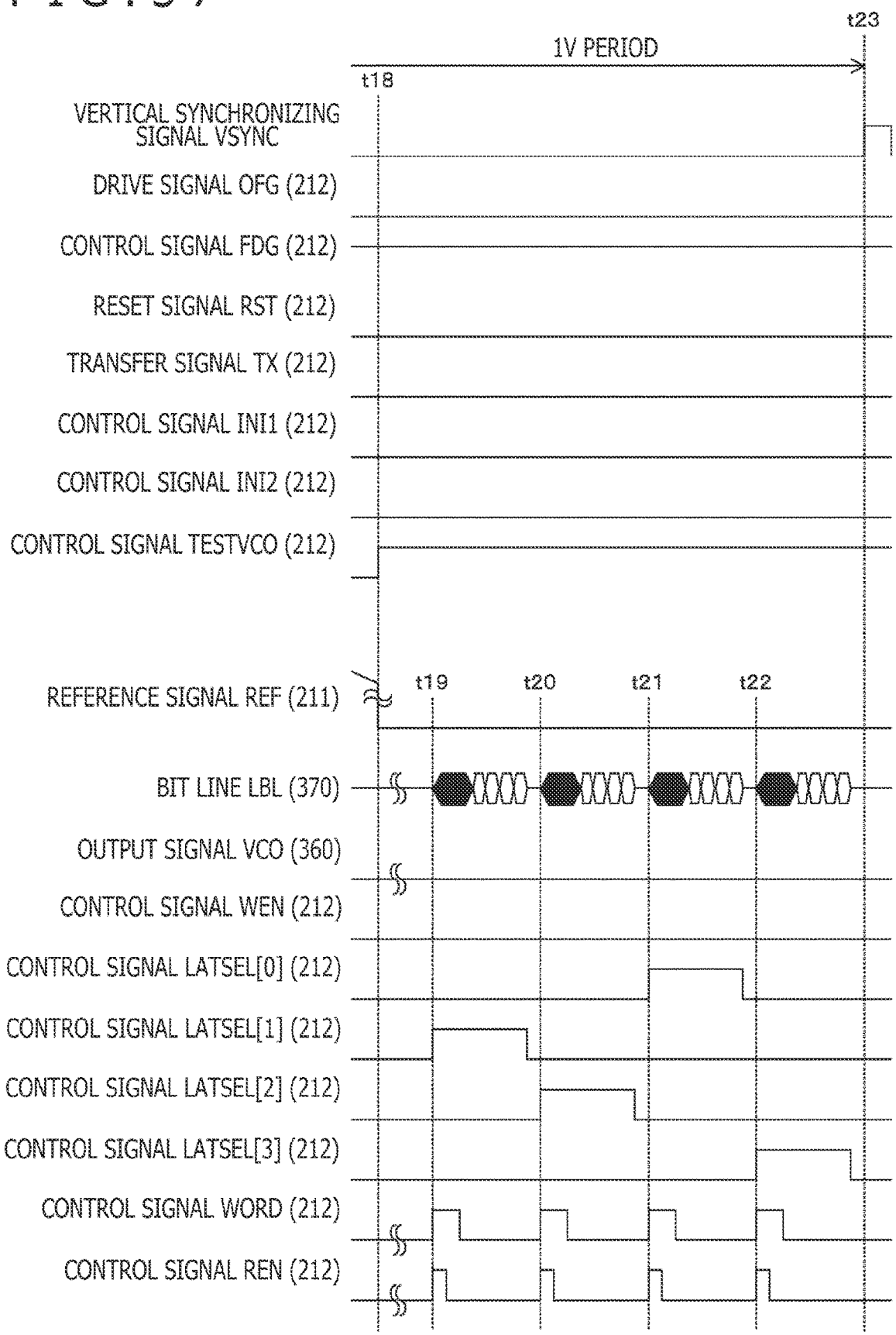
FIG. 37 is a timing diagram illustrating an example of operation after sampling of the solid-state imaging element in the modification example of the second embodiment of the present technology.

FIG. 37 is a timing diagram illustrating an example of operation after sampling of the solid-state imaging element 200 in the modification example of the second embodiment of the present technology. The drive circuit 212 causes the first piece of P phase data to be output at time t19 immediately after time t18 when the signal level sampling ends and causes the second piece of P phase data to be output at time t20. Next, the drive circuit 212 causes the first piece of D phase data to be output at time t21 and the second piece of D phase data to be output at time t22.

The column processing section 250 outputs the difference between the first and second pieces of D phase data as low-resolution net pixel data and the difference between the second piece of P phase data and the first piece of D phase data as high-resolution net pixel data. Then, the DSP circuit 120 generates composite image data by combining these pieces of data.

As described above, in the modification example of the second embodiment of the present technology, the solid-state imaging element 200 generates two pieces of image data with different resolutions, and the dynamic range can be increased by combining these pieces of image data.

3. Third Embodiment

In a third embodiment, a detailed description will be given of a stacked structure of the solid-state imaging element 200 and an effect produced by arranging local bit lines $LBL_L$ and $LBL_R$.

Figure 38:
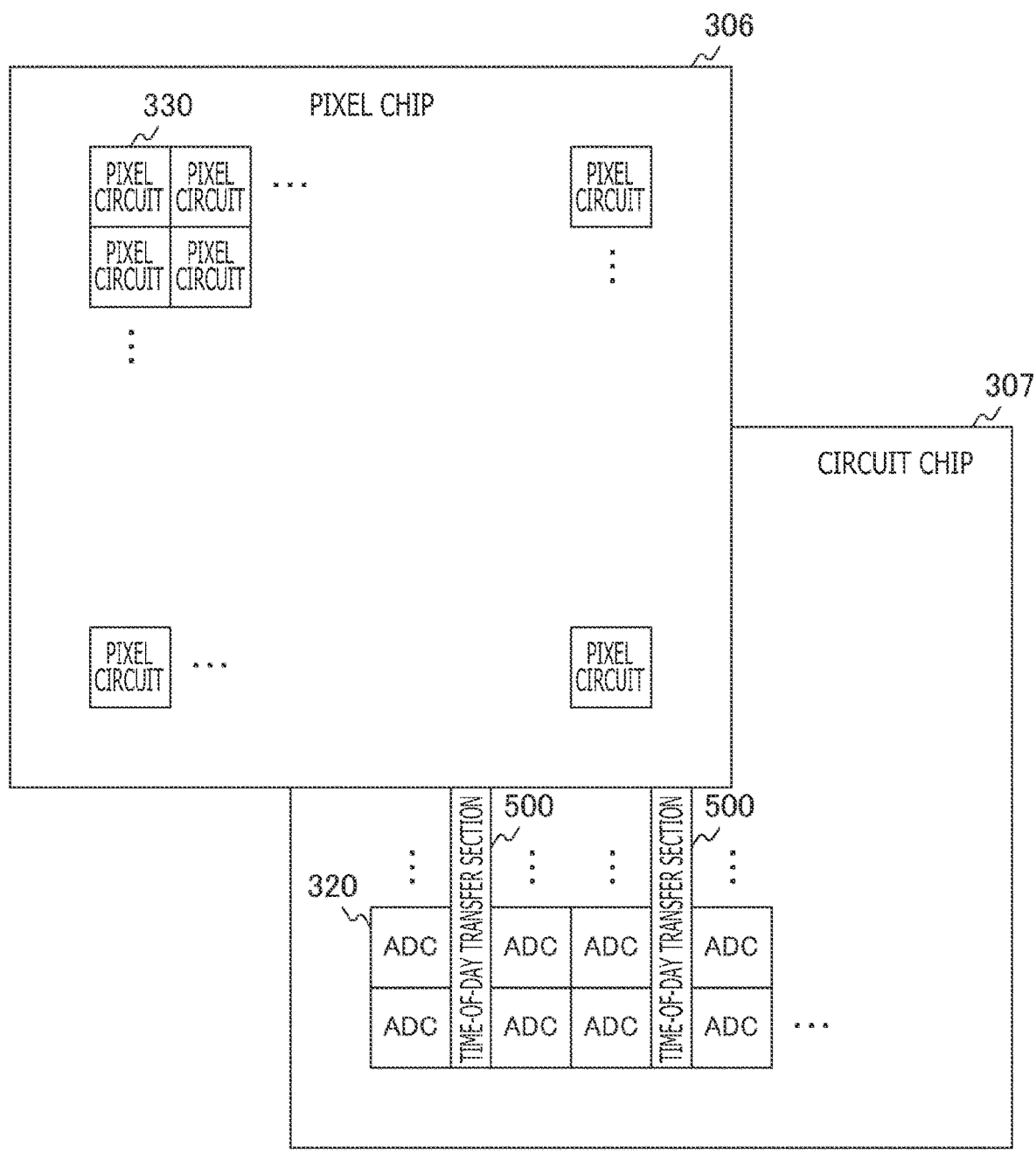
FIG. 38 is a block diagram illustrating a configuration example of a solid-state imaging element in a third embodiment of the present technology.

FIG. 38 is a block diagram illustrating a configuration example of the solid-state imaging element 200 in the third embodiment of the present technology. The solid-state imaging element 200 of the third embodiment includes a pixel chip 306 and a circuit chip 307 that are stacked one on top of the other.

The pixel chip 306 has a plurality of pixel circuits such as the pixel circuits 330 arranged in a two-dimensional lattice pattern. The circuit chip 307 has circuitry other than the pixel circuits arranged thereon. For example, a plurality of ADCs such as the ADCs 320 and the time-of-day code transfer section 500 are arranged.

Figure 39:
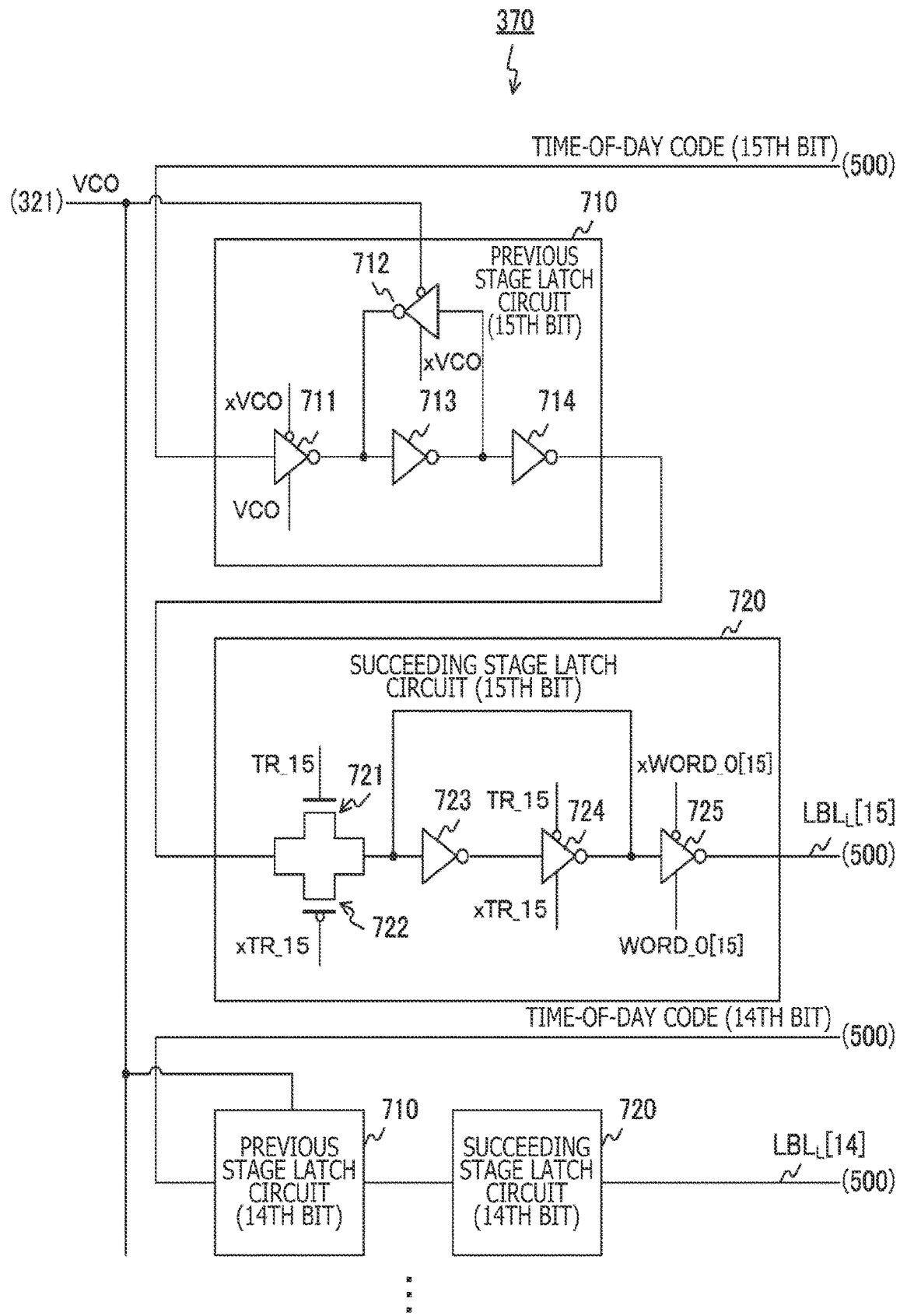
FIG. 39 is a block diagram illustrating a configuration example of a data storage section in the third embodiment of the present technology.

FIG. 39 is a block diagram illustrating a configuration example of the data storage section 370 in the third embodiment of the present technology. The data storage section 370 of the third embodiment has a previous stage latch circuit 710 and a succeeding stage latch circuit 720 arranged for each bit. For example, in the case where pixel data is 16 bits long, 16 sets of the previous stage latch circuit 710 and the succeeding stage latch circuit 720 are arranged.

The previous stage latch circuit 710 holds a time-of-day code when the output signal VCO from the comparison circuit 321 is inverted. The previous stage latch circuit 710 includes inverters 711 to 714.

The inverter 711 inverts a kth bit of the time-of-day code and outputs the inverted kth bit to the inverter 713 in the case where the output signal VCO is at high level and an inverted signal xVCO of the output signal VCO is at low level.

The inverter 712 inverts the signal from the inverter 713 and outputs the inverted signal to the inverter 713 in the case where the output signal VCO is at low level and the inverted signal xVCO of the output signal VCO is at high level.

The inverter 713 inverts the signal from the inverter 711 or the inverter 312 and outputs the inverted signal to the inverter 714. The inverter 714 inverts the signal from the inverter 713 and outputs the inverted signal to the succeeding stage latch circuit 720.

The succeeding stage latch circuit 720 holds a signal from the previous stage latch circuit 710 under control of the column processing section 250. The succeeding stage latch circuit 720 includes an NMOS transistor 721, a PMOS transistor 722, and inverters 723 to 725.

The NMOS transistor 721 and the PMOS transistor 722 are connected in parallel between the previous stage latch circuit 710 and input terminals of the inverters 723 and 725. Also, a latch control signal TR_k from the column processing section 250 is input to the gate of the NMOS transistor 721, and an inverted signal xTR_k of the latch control signal TR_k is input to the gate of the PMOS transistor 722. The latch control signal TR_k is input, for example, at a given timing immediately after the kth bit of the time-of-day code is updated.

The inverter 723 inverts signals from the NMOS transistor 721 and the PMOS transistor 722 and outputs the inverted signals to the inverter 724. The inverter 724 inverts the signal from the inverter 723 and outputs the inverted signal to the inverter 725 in the case where the latch control signal Tr_k is at low level and the inverted signal xTR_k of the latch control signal TR_k is at high level.

The inverter 725 inverts the input signal and outputs the inverted signal to the local bit line $LBL_L[k]$ in the case where a control signal WORD_m[k] (where m is 0 or 1) from the drive circuit 212 is at high level and an inverted signal xWORD_m[k] thereof is at low level.

Here, m indicates which of the left and right pixel data is to be read out. For example, a control signal WORD_0[k] is supplied when pixel data is read out from the left local bit line $LBL_L[k]$. Also, a control signal WORD_1[k] is supplied when pixel data is read out from the right local bit line $LBL_R[k]$. It should be noted that the local bit line $LBL_L[k]$ is an example of a first local bit line recited in claims and that the local bit line $LBL_R[k]$ is an example of a second local bit line recited in claims.

Figure 40:
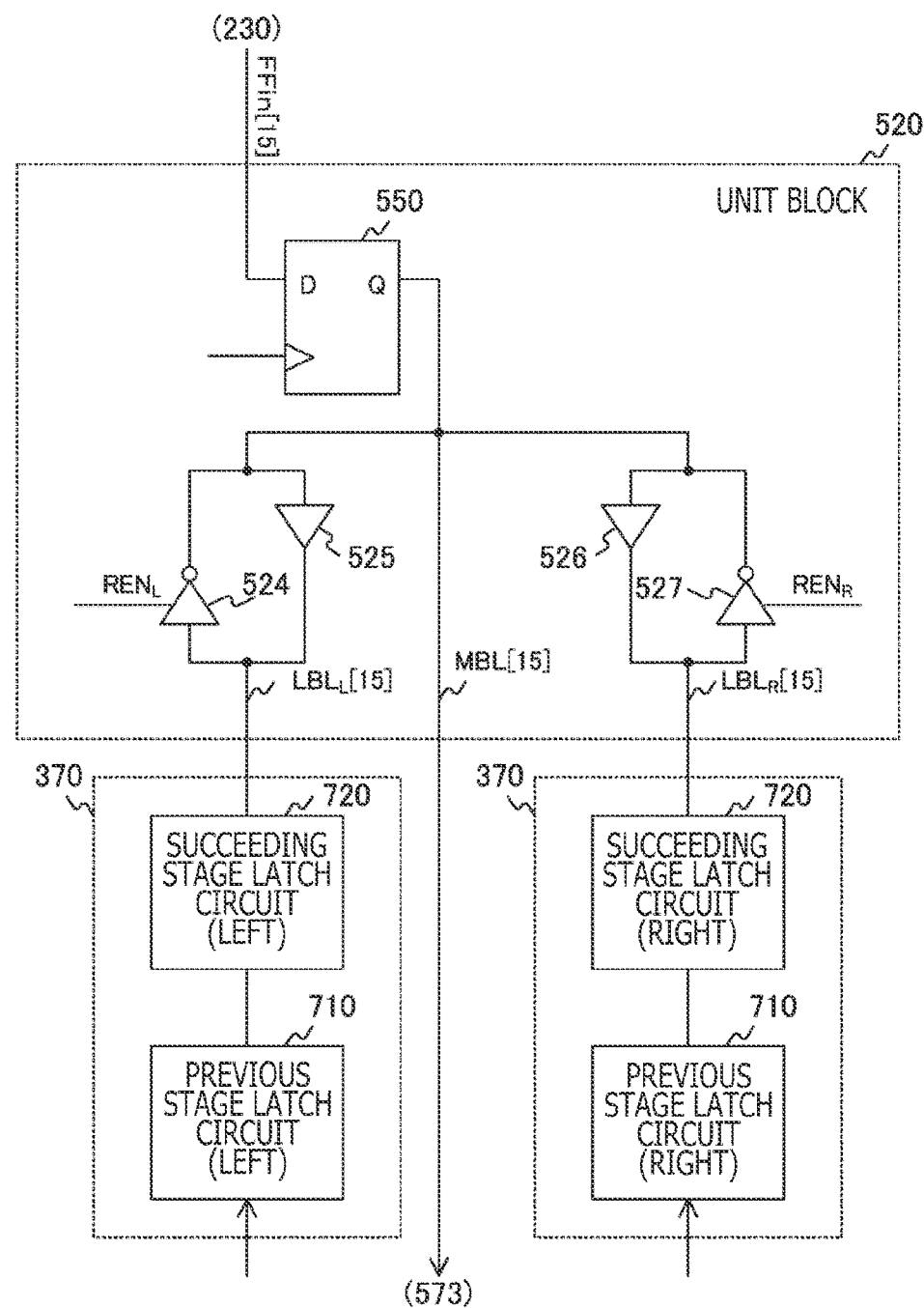
FIG. 40 is a block diagram illustrating a configuration example of a unit block in a time-of-day code transfer section in the third embodiment of the present technology.

FIG. 40 is a block diagram illustrating a configuration example of the unit block 520 in the time-of-day code transfer section 500 in the third embodiment of the present technology. The output terminal of the flip-flop 550 is connected to the flip-flop 573 at the succeeding stage via a main bit line MBL. Also, a left bidirectional buffer that includes the inverter 524 and the buffer 525 is inserted between the main bit line MBL and the left succeeding stage latch circuit 720. A right bidirectional buffer that includes the buffer 526 and the inverter 527 is inserted between the main bit line MBL and the succeeding stage latch circuit 720 corresponding to the right pixel.

Also, the input terminal of the inverter 524 and the output terminal of the buffer 525 are connected to the succeeding stage latch circuit 720 via the local bit line $LBL_L[k]$. The input terminal of the inverter 527 and the output terminal of the buffer 526 are connected to the succeeding stage latch circuit 720 corresponding to the right pixel via the local bit line $LBL_R[k]$.

Figure 41:
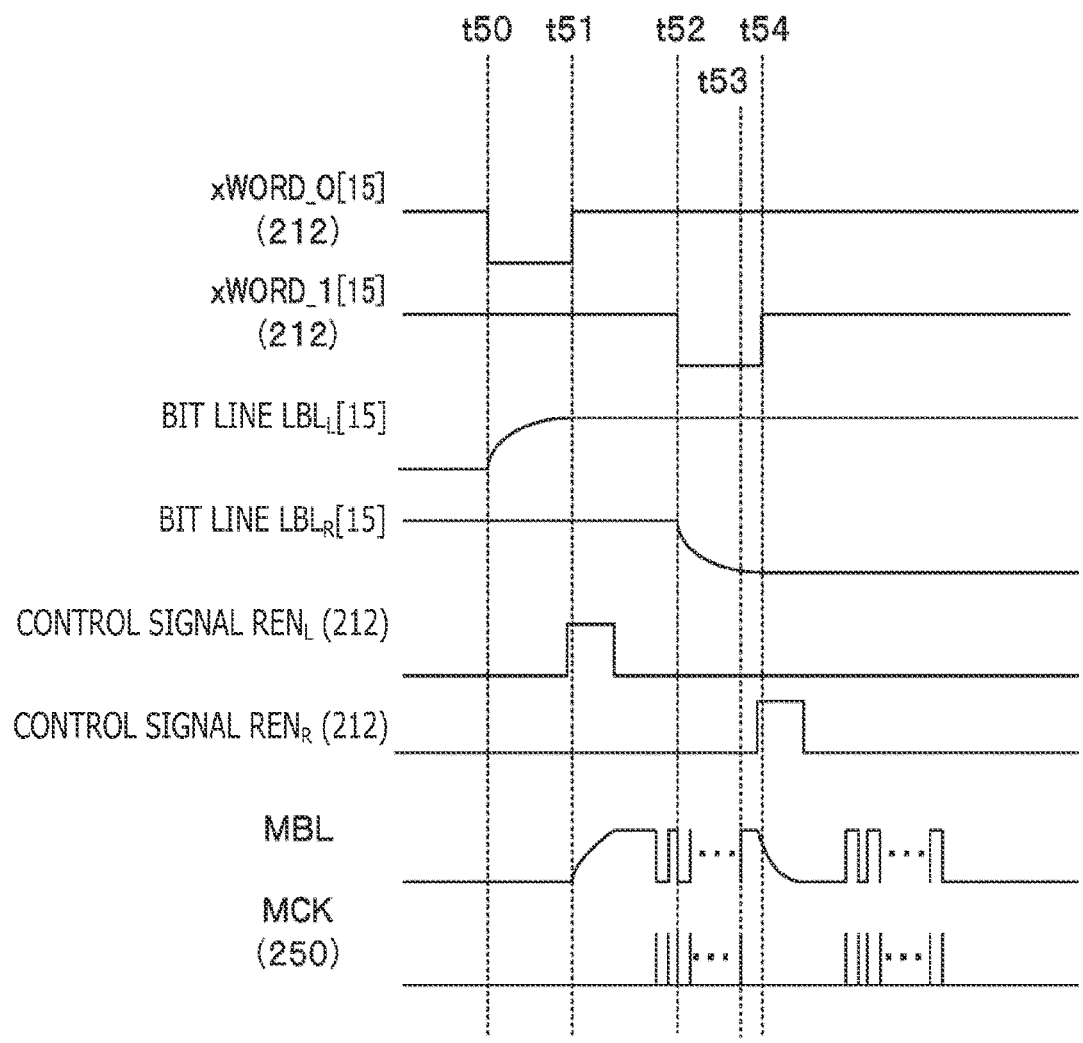
FIG. 41 is a timing diagram illustrating an example of pixel data readout control in the third embodiment of the present technology.

FIG. 41 is a timing diagram illustrating an example of pixel data readout control in the third embodiment of the present technology. The drive circuit 212 supplies a low-level control signal xWORD_0[15] for transferring pixel data to the left bidirectional buffer for a time period from time t50 to time t51. In accordance with the control signal xWORD_0[15], the left data storage section 370 shifts a local bit line $LBL_L[15]$ from low to high level, thus allowing the data to be transferred to the left bidirectional buffer. It should be noted that the local bit line $LBL_L[15]$ may be shifted from high to low level. Also, although the transfer of 14th to zeroth bits takes place in parallel via local bit lines $LBL_L[14]$ to $LBL_L[0]$, the transfer of the 14th to zeroth bits is omitted in FIG. 41 for convenience of description.

Also, the column processing section 250 supplies the control signal $REN_L$ for reading out the left pixel data for a given pulse period from immediately before time t51. Thanks to the control signal $REN_L$, the left bidirectional buffer outputs data to the main bit line MBL, and the main bit line MBL makes a transition to high level by the time the control signal REND falls. The column processing section 250 reads out the left pixel data (e.g., 16 bits) via that main bit line MBL in synchronism with the master clock MCK.

The readout of the left pixel data is complete by time t53. The drive circuit 212 supplies a low-level control signal xWORD_1[15] for transferring the pixel data to the right bidirectional buffer for a time period from time t52, a time immediately before the completion of the readout of the left pixel data, to time t54. In accordance with the control signal xWORD_1 [15], the right data storage section 370 shifts a local bit line $LBL_R[15]$, for example, from high to low level, thus allowing the data to be transferred to the right bidirectional buffer. It should be noted that the local bit line $LBL_R[15]$ may be shifted from low to high level.

Also, the column processing section 250 supplies the signal $REN_R$ for reading out the right pixel data for a given pulse period from immediately before time t54. The right bidirectional buffer outputs data to the main bit line MBL using the control signal $REN_R$, and the main bit line MBL makes a transition to low level by the time the control signal $REN_R$ falls. The column processing section 250 reads out the right pixel data (e.g., 16 bits) via that main bit line MBL in synchronism with the master clock MCK.

We assume here a comparative example where only one bidirectional buffer is arranged for each bit and only the single local bit line LBL is arranged. In this comparative example, the bidirectional buffer is connected to the left data storage section 370 via the local bit line LBL. Also, the local bit line LBL branches off, thus allowing the bidirectional buffer to be also connected to the right data storage section 370.

Figure 42:
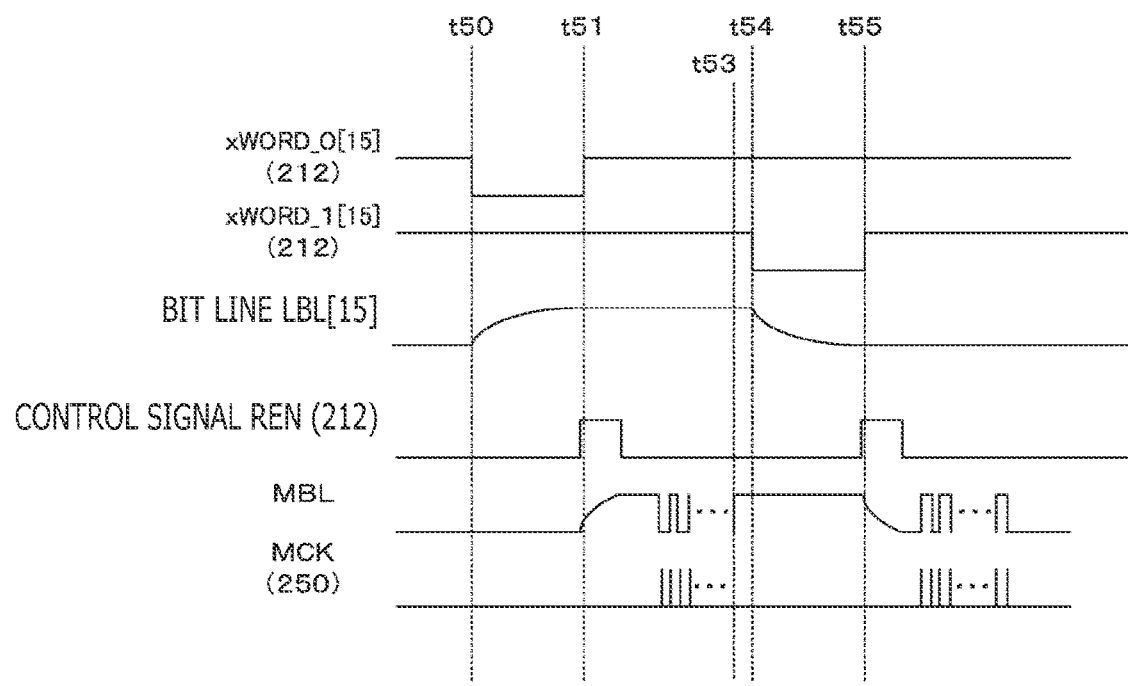
FIG. 42 is a timing diagram illustrating an example of the pixel data readout control in a comparative example.

FIG. 42 is a timing diagram illustrating an example of the pixel data readout control in the comparative example. The drive circuit 212 supplies the control signal xWORD_0[15] for a period from time t50 to time t51. In accordance with the control signal xWORD_0[15], the left data storage section 370 shifts the local bit line $LBL_L[15]$, for example, from low to high level.

Also, the column processing section 250 supplies the control signal $REN_L$ for the given pulse period from immediately before time t51. Thanks to the control signal $REN_L$, the left bidirectional buffer outputs data to the main bit line MBL, and the main bit line MBL makes a transition to high level by the time the control signal $REN_L$ falls. The column processing section 250 reads out the left pixel data via that main bit line MBL in synchronism with the master clock MCK.

The readout of the left pixel data is complete by time t53. The drive circuit 212 supplies the low-level control signal xWORD_1[15] for a time period from time t54, a time following time t53, to time t55. In accordance with the control signal xWORD_1[15], the right data storage section 370 shifts the local bit line $LBL_R[15]$, for example, from high to low level.

As described above, in the comparative example, unless the readout of the left pixel data (i.e., transfer of the time-of-day code with the control signal REN) is complete, the low-level control signal xWORD_1[15] for transferring pixel data to the right bidirectional buffer cannot be supplied. The reason for this is that there is only the single local bit line LBL and that it is necessary to transfer the left pixel data and the right pixel data in sequence via that local bit line LBL.

In contrast, the time-of-day code transfer section 500 has the local bit line $LBL_L[k]$ for transferring the left pixel data and the local bit line $LBL_R[k]$ for transferring the right pixel data arranged individually for each bit. This makes it possible initiate the transfer of the right pixel data to the bidirectional buffer before the readout of the left pixel data is complete. In other words, it is possible to hide the transition of the right local bit line $LBL_R[k]$ during the readout period of the left pixel data. This allows for faster pixel data readout than in the comparative example. Also, the capacitance visible during the readout diminishes, thus reducing the power consumption of the solid-state imaging element 200.

As described above, in the third embodiment of the present technology, circuits are arranged in a distributed manner on the pixel chip 306 and the circuit chip 307 that are stacked one on top of the other, thus expanding the light receiving surface as compared to the case where circuits are arranged on a single semiconductor chip. Also, the local bit line LBL[k] and the local bit line $LBL_R[k]$ are arranged individually, thus allowing for fast readout of data.

4. Application Example to Mobile Body

The technology according to the present disclosure (the present technology) is applicable to a variety of products.

For example, the technology according to the present disclosure may be realized as an apparatus mounted to any kind of mobile bodies such as automobile, electric vehicle, hybrid electric vehicle, two-wheeled motor vehicle, bicycle, personal mobility, airplane, drone, ship, and robot.

Figure 43:
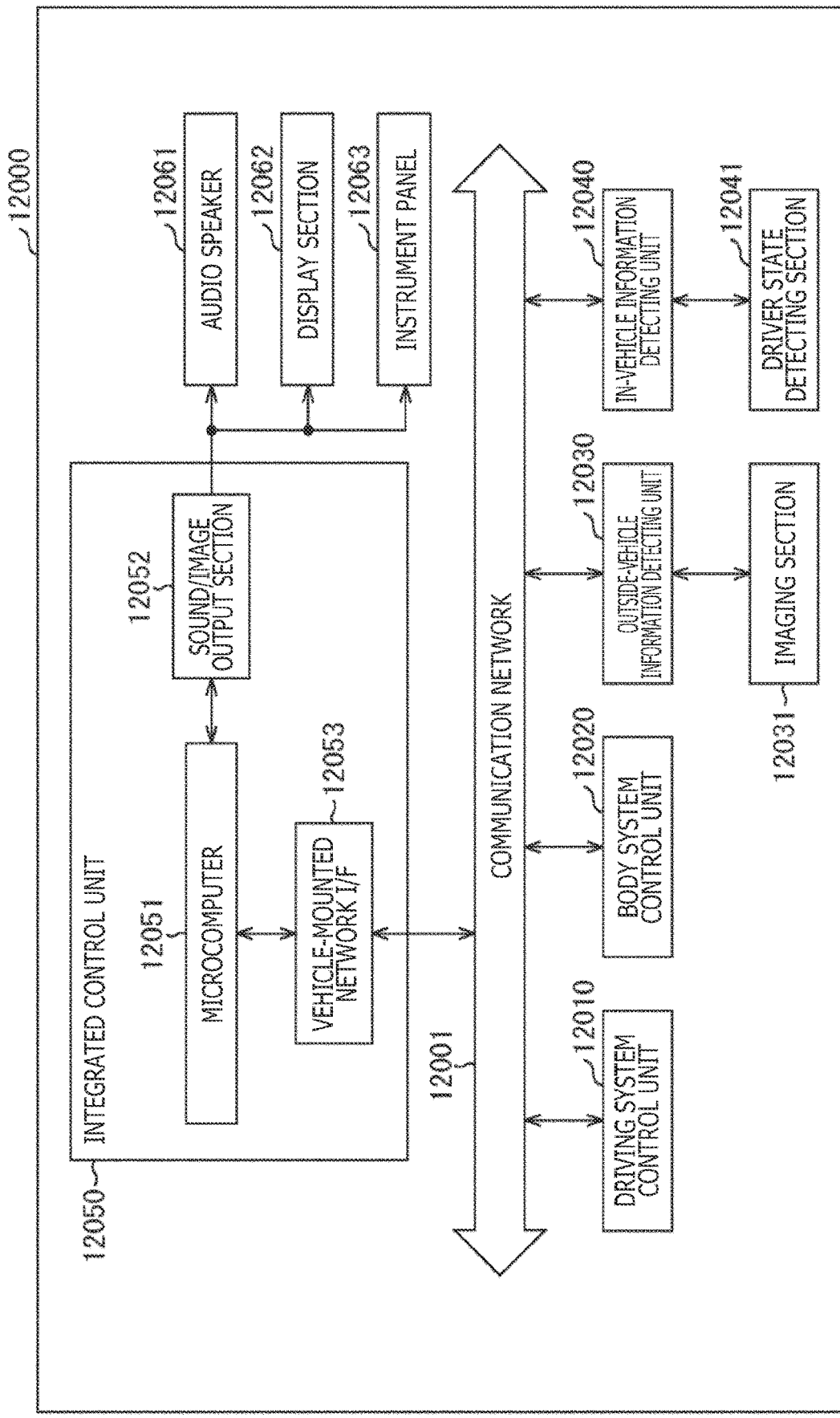
FIG. 43 is a block diagram illustrating an example of a schematic configuration of a vehicle control system.

FIG. 43 is a block diagram illustrating an example of a schematic configuration of a vehicle control system which is an example of a mobile body control system to which the technology according to the present disclosure is applicable.

A vehicle control system 12000 includes a plurality of electronic control units connected to each other via a communication network 12001. In the example illustrated in FIG. 43, the vehicle control system 12000 includes a driving system control unit 12010, a body system control unit 12020, an outside-vehicle information detecting unit 12030, an in-vehicle information detecting unit 12040, and an integrated control unit 12050. Also, a microcomputer 12051, a sound/image output section 12052, and a vehicle-mounted network I/F (interface) 12053 are illustrated as functional components of the integrated control unit 12050.

The driving system control unit 12010 controls the operation of apparatuses related to a vehicle driving system in accordance with various programs. For example, the driving system control unit 12010 functions as a control apparatus for a driving force generation apparatus for generating a driving force of the vehicle such as internal combustion engine or driving motor, a driving force transmission mechanism for transmitting a driving force to wheels, a steering mechanism for adjusting a rudder angle of the vehicle, and a braking apparatus for generating a braking force of the vehicle, and so on.

The body system control unit 12020 controls the operation of various apparatuses with which the vehicle is equipped. For example, the body system control unit 12020 functions as a control apparatus for a keyless entry system, a smart key system, or various lights such as headlights, backlights, brake lights, turn signal lights, and fog lights. In this case, radio waves or various switch signals can be input to the body system control unit 12020 from a transmitter that replaces the key. The body system control unit 12020 accepts such a radio wave or signal input and controls a door locking apparatus, a power window apparatus, lights, and other apparatuses of the vehicle.

The outside-vehicle information detecting unit 12030 detects outside information of the vehicle that incorporates the vehicle control system 12000. For example, an imaging section 12031 is connected to the outside-vehicle information detecting unit 12030. The outside-vehicle information detecting unit 12030 not only causes the imaging section 12031 to capture an image of outside the vehicle but also receives the captured image. The outside-vehicle information detecting unit 12030 may perform an object detection process for detecting humans, vehicles, obstacles, signs, or characters on the road surface or a distance detection process on the basis of the received image.

The imaging section 12031 is an optical sensor that receives light and outputs an electric signal proportional to the amount of light received. The imaging section 12031 can output an electric signal as an image or as distance measurement information. Also, light received by the imaging section 12031 may be not only visible light but also invisible light such as infrared radiation.

The in-vehicle information detecting unit 12040 detects information inside the vehicle. A driver state detecting section 12041 that detects the state of the vehicle driver, for example, is connected to the in-vehicle information detecting unit 12040. The driver state detecting section 12041 may include, for example, a camera for capturing an image of the vehicle driver and calculate a fatigue level or a concentration level of the vehicle driver or decide whether the vehicle driver is not asleep.

The microcomputer 12051 can calculate a control target value for the driving force generation apparatus, the steering mechanism, or the braking apparatus on the basis of in- or outside-vehicle information acquired by the outside-vehicle information detecting unit 12030 or the in-vehicle information detecting unit 12040 and output a control instruction to the driving system control unit 12010. For example, the microcomputer 12051 can carry out coordinated control with an aim of realizing ADAS (Advanced Driver Assistance System) functions including vehicle collision avoidance, impact mitigation, follow-up cruise on the basis of a vehicle-to-vehicle distance, speed-keeping cruise, vehicle collision warning, or vehicle lane departure warning.

Also, the microcomputer 12051 can carry out coordinated control aimed at achieving automatic driving that enables autonomous driving irrespective of the vehicle driver's manipulation or other type of driving by controlling the driving force generation apparatus, the steering mechanism, the braking apparatus, or other apparatus on the basis of information surrounding the vehicle acquired by the outside-vehicle information detecting unit 12030 or the in-vehicle information detecting unit 12040.

Also, the microcomputer 12051 can output a control instruction to the body system control unit 12020 on the basis of outside-vehicle information acquired by the outside-vehicle information detecting unit 12030. For example, the microcomputer 12051 can carry out coordinated control with an aim of, for example, switching from high- to low-beam headlights and preventing glaring by controlling the headlights in accordance with the positions of preceding or oncoming vehicles detected by the outside-vehicle information detecting unit 12030.

The sound/image output section 12052 sends at least one of two output signals, sound and image, to an output apparatus capable of notifying information to vehicle's passengers and outside the vehicle in a visual or auditory manner. In the example illustrated in FIG. 43, an audio speaker 12061, a display section 12062, and an instrument panel 12063 are illustrated as output apparatuses. The display section 12062 may include, for example, at least one of an on-board display or a head-up display.

Figure 44:
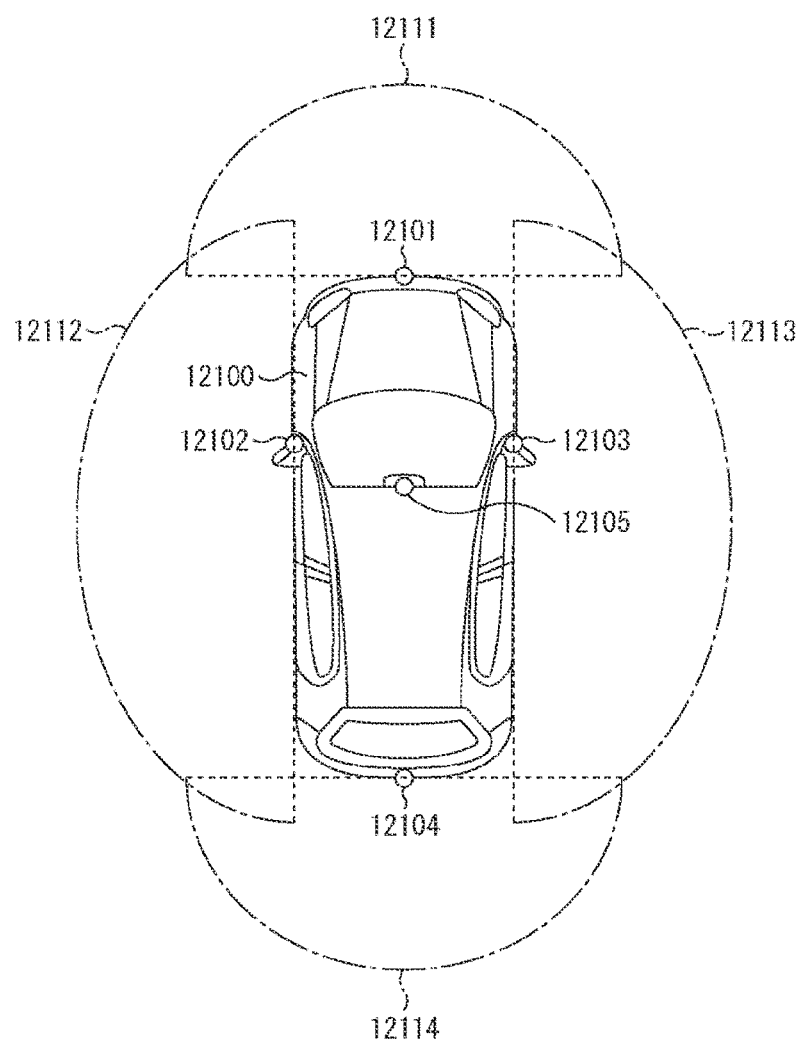
FIG. 44 is an explanatory diagram illustrating examples of installation positions of an outside-vehicle information detection section and an imaging section.

FIG. 44 is a diagram illustrating examples of installation positions of the imaging sections 12031.

In FIG. 44, the vehicle has imaging sections 12101, 12102, 12103, 12104, and 12105 as the imaging sections 12031.

The imaging sections 12101, 12102, 12103, 12104, and 12105 are provided at positions of the vehicle 12100 such as front nose, side mirrors, rear bumper, back door, and upper portion of a windshield inside a vehicle's compartment. The imaging section 12101 installed to the front nose and the imaging section 12105 installed to the upper portion of the windshield primarily acquire images in front of the vehicle 12100. The imaging sections 12102 and 12103 installed to the side mirrors primarily acquire images on the sides of the vehicle 12100. The imaging section 12104 installed to the rear bumper or the back door primarily captures images in the back of the vehicle 12100. The imaging section 12105 installed to the upper portion of the windshield primarily is used primarily to detect preceding vehicles or pedestrians, obstacles, traffic lights, traffic signs, lanes, and so on.

It should be noted that FIG. 44 illustrates examples of shooting ranges of the imaging sections 12101 to 12104. A shooting range 12111 represents the shooting range of the imaging section 12101 provided on the front nose. Shooting ranges 12112 and 12113 represent the shooting ranges of the imaging sections 12102 and 12103 provided on the side mirrors. A shooting range 12114 represents the shooting range of the imaging section 12104 provided on the rear bumper or the back door. It is possible to acquire, for example, a bird's eye image as seen from above the vehicle 12100 by superimposing the image data captured by the imaging sections 12101 to 12104.

At least one of the imaging sections 12101 to 12104 may have a function to acquire distance information. For example, at least one of the imaging sections 12101 to 12104 may be a stereo camera that includes a plurality of imaging elements or an imaging element having pixels for phase difference detection.

For example, the microcomputer 12051 can extract, in particular, the closest stereoscopic object on the traveling path of the vehicle 12100 that travels at a given speed (e.g., 0 km/h or more) in approximately the same direction as the vehicle 12100 as a preceding vehicle by finding a distance to each stereoscopic object in each of the shooting ranges 12111 to 12114 and a change in this distance over time (speed relative to the vehicle 12100) on the basis of distance information acquired from the imaging sections 12101 to 12104. Further, the microcomputer 12051 sets a vehicle-to-vehicle distance to be secured in front of the preceding vehicle and carry out automatic brake control (including follow-up stop control), automatic acceleration control (including follow-up start control), and so on. As described above, it is possible to perform coordinated control aimed at achieving automatic driving that enables autonomous driving irrespective of the vehicle driver's manipulation or other type of driving.

For example, the microcomputer 12051 extracts stereoscopic object data regarding stereoscopic objects in a manner classified into two-wheeled motor vehicle, ordinary vehicle, large-size vehicle, pedestrian, electric pole, and other stereoscopic objects for use in automatically avoiding obstacles on the basis of distance information acquired from the imaging sections 12101 to 12104. For example, the microcomputer 12051 differentiates obstacles around the vehicle 12100 into those visually identifiable by the vehicle driver of the vehicle 12100 and those not visually identifiable by the vehicle driver of the vehicle 12100. Then, the microcomputer 12051 can determine a risk of collision indicating a danger level of collision with each obstacle and support driving to avoid collision by outputting a warning to the vehicle driver via the audio speaker 12061 or the display section 12062, forcefully decelerating the vehicle or steering the vehicle to avoid a collision via the driving system control unit 12010 when the collision risk is equal to or higher than a set value and, therefore, a collision is likely.

At least one of the imaging sections 12101 to 12104 may be an infrared camera that detects infrared radiation. For example, the microcomputer 12051 can recognize a pedestrian by determining whether or not the pedestrian is present in the images captured by the imaging sections 12101 to 12104. Such recognition of a pedestrian is carried out, for example, by a processing step of extracting feature points in the images captured by the imaging sections 12101 to 12104 as infrared cameras and a processing step of performing a pattern matching process on the series of feature points indicating an object outline and determining whether or not the object is a pedestrian. If the microcomputer 12051 determines that there is a pedestrian in the images captured by the imaging sections 12101 to 12104 followed by recognition of the pedestrian, the sound/image output section 12052 controls the display section 12062 in such a manner as to superimpose a square outline for highlighting purpose on the recognized pedestrian. Also, the sound/image output section 12052 may control the display section 12062 in such a manner as to display an icon or other indicator that represents a pedestrian at a desired position.

An example of the vehicle control system to which the technology according to the present disclosure is applicable has been described above. The technology according to the present disclosure is applicable to the solid-state imaging elements in the imaging sections 12101 to 12104 of the components described above. By applying the technology according to the present disclosure to the solid-state imaging elements in the imaging sections 12101 to 12104, it is possible to capture high-quality image data while detecting address events.

It should be noted that the above embodiments illustrate examples for realizing the present technology and that there is a correspondence between matters of the embodiments and matters specifying the invention in claims. Similarly, there is a correspondence between the matters specifying the invention and the matters of the embodiments of the present technology denoted by the same names. It should be noted, however, that the present technology is not limited to the embodiments and can be realized by modifying the embodiments in various ways without departing from the gist thereof.

Also, the processing steps described in the above embodiments may be construed as a method having this series of steps or a program for causing a computer to perform this series of steps and a recording medium that stores the program. As this recording medium, a CD (Compact Disc), an MD (MiniDisc), a DVD (Digital Versatile Disc), a memory card, a Blu-ray (registered trademark) disc, or other media can be used.

It should be noted that the effects described in the present specification are merely illustrative and not restrictive, and there may be other effects.

It should be noted that the present technology can also have the following configurations:

(1)

A solid-state imaging element including:
a pixel array section having a plurality of pixels including
  a specific pixel arranged in a two-dimensional lattice pattern, the specific pixel including
    a pixel circuit adapted to output two analog signals proportional to an amount of charge produced by photoelectric conversion, and
    two analog-digital converters adapted to convert the respective two analog signals into digital signals with different resolutions.

(2)

The solid-state imaging element of feature (1), in which
the analog-digital converter with a lower resolution of the two analog-digital converters may detect, as an address event, that a variation in the above amount of charge has exceeded a given threshold on the basis of the analog signals.

(3)

The solid-state imaging element of feature (1) or (2), in which
only one analog-digital converter is provided in each of the pixels of the pixel array section not corresponding to the specific pixel.

(4)

The solid-state imaging element of any one of features (1) to (3), in which
the pixel circuit includes:
  a photoelectric conversion section adapted to convert light into the charge;
  a current-voltage conversion section adapted to generate one of the two analog signals through current-voltage conversion on the above photocurrent flowing through the photoelectric conversion section;
  a charge accumulation section adapted to accumulate the charge;
  a discharge transistor adapted to discharge the charge from the photoelectric conversion section when the exposure period starts;
  a transfer transistor adapted to transfer the charge from the photoelectric conversion section to the charge accumulation section when the exposure period ends; and
  an amplifying transistor adapted to amplify a voltage in the floating diffusion layer and output the amplified voltage as an other of the two analog signals.

(5)

The solid-state imaging element of feature (4), in which
the analog-digital conversion section is connected to a terminal having a given ground potential, and
a potential lower than the given ground potential is applied to a board having the floating diffusion layer and the photoelectric conversion section.

(6)

The solid-state imaging element of feature (4) or (5), in which
the pixel circuit further includes:
  a reset transistor adapted to initialize the voltage of the charge accumulation section to a reset level before the end time,
the pixel signal includes a signal level when the reset level and the charge are transferred, and
the digital signals include reset data acquired by converting the reset level and signal data acquired by converting the signal level.

(7)

The solid-state imaging element of feature (6), further including:
  a correlated double sampling circuit adapted to find a difference between the reset data and the signal data and output the difference as pixel data.

(8)

The solid-state imaging element of feature (7), in which
the analog-digital converters hold the reset data and output, when the signal level is converted, the reset data and the signal data in sequence to the correlated double sampling circuit.

(9)

The solid-state imaging element of feature (7) or (8), in which
the pixel signal includes first and second reset levels and first and second signal levels,
each of the analog-digital converters includes:
  a comparison section adapted to compare a given reference signal having a slope and the pixel signal and output a comparison result; and
  a data storage section adapted to store data including each of the comparison results as the digital signal, and
an inclination of the slope for comparing each set of the second reset level and the first signal level is flatter than the inclination of the slope for comparing each set of the first reset level and the second signal level.

(10)
The solid-state imaging element of feature (9), further including:
a drive circuit adapted to cause the pixel circuit to generate the first reset level and the second signal level at a given sensitivity and cause the pixel circuit to generate the second reset level and the first signal level at a sensitivity different from the given sensitivity.

(11)
The solid-state imaging element of any one of features (1) to (10), in which
the analog-digital converter with a lower resolution of the two analog-digital converters includes:
a differential circuit adapted to hold the voltage signal;
a comparator adapted to compare the held voltage signal and the threshold in the given range and output a result of the comparison; and
a handshake circuit adapted to send a request on a basis of the comparison result and initialize the differential circuit when an acknowledgement to the request is received.

(12)
The solid-state imaging element of feature (11), further including:
an arbiter adapted to arbitrate the requests and return an acknowledgement on a basis of a result of the arbitration.

(13)
The solid-state imaging element of any one of features (1) to (12), further including:
a test circuit adapted to output a time-of-day code having a given number of bits to one of the two analog-digital converters and detect whether or not there is any fault in each bit of the time-of-day code; and
a redundant circuit adapted to connect a spare signal line in place of a bit line corresponding to the faulty bit in the time-of-day code, in which
the analog-digital converter converts the pixel signal into the digital signal by using the time-of-day code.

(14)
The solid-state imaging element of any one of features (1) to (13), further including:
first and second data storage sections adapted to hold the different digital signals;
a first bidirectional buffer adapted to output the digital signal, transferred from the first data storage section via a first local bit line, to a main bit line in accordance with a first control signal;
a second bidirectional buffer adapted to output the digital signal, transferred from the second data storage section via a second local bit line, to the main bit line in accordance with a second control signal;
a column processing section adapted to read out the digital signals via the main bit line; and
a drive circuit adapted to control the first data storage section to transfer the digital signal to the first bidirectional buffer via the first local bit line as a first digital signal and control the second data storage section to transfer the digital signal to the second bidirectional buffer via the second local bit line as a second digital signal before the readout of the first digital signal is complete.

(15)
An imaging apparatus including:
a pixel array section having a plurality of pixels including a specific pixel arranged in a two-dimensional lattice pattern, the specific pixel including
a pixel circuit adapted to output two analog signals proportional to an amount of charge produced by photoelectric conversion, and
two analog-digital converters adapted to convert the respective two analog signals into digital signals with different resolutions; and
a digital signal processing section adapted to process image data that includes the digital signals.

(16)
A control method of a solid-state imaging element including:
an output step in which a pixel circuit outputs two analog signals proportional to an amount of charge produced by photoelectric conversion; and
two analog-digital conversion steps in which the respective two analog signals are converted into digital signals with different resolutions.

REFERENCE SIGNS LIST

100 Imaging apparatus
110 Optical section
120 DSP circuit
130 Display section
140 Operation section
150 Bus
160 Frame memory
170 Storage section
180 Power supply section
200 Solid-state imaging element
211 DAC
212 Drive circuit
213 Column arbiter
214 Column address encoder
215 State machine
216 Row address encoder
220 Column AER circuit
221 Column AER block
222 H-side column AER block
223 L-side column AER block
224 OR gate
230 Time-of-day code generation section
231 Test circuit
232 Binary-gray conversion section
233 Binary counter
234, 550, 573 Flip-flops
235 Receiver
236 Driver
240, 251 Redundant circuits
241, 391 Switches
250 Column processing section
252 CDS circuit
260 Row AER circuit
270 Row AER block
271, 341, 344, 346, 361, 362, 365, 366, 421, 441, 442, 452, 454, 461, 463, 474, 479, 523, 528, 534, 536, 537, 551, 553, 554, 556, 559, 611, 614, 615 to 617, 620, 622, 625, 626, 722 PMOS transistors
272, 273, 342, 343, 345, 351, 363, 364, 367, 416, 417, 420, 423 to 425, 455, 462, 464, 471 to 473, 475 to 478, 480, 481, 535, 538, 539, 552, 555, 557, 558, 560, 561, 612, 613, 618, 619, 623, 624, 627, 721 NMOS transistors
276, 381, 533 NOR gates
274, 275, 371, 382, 383, 392, 393, 511 to 517, 521, 522, 524, 527, 531, 540, 571, 572, 601, 602, 621, 711 to 714, 723 to 725 Inverters
300 Pixel array section
305, 406 Pixel wafers
306 Pixel chip
307 Circuit chip
310 R pixel
311 G pixel
312 B pixel
320, 405 ADCs
321 Comparison circuit
330, 410 Pixel circuits
331, 411 Reset transistors
332, 412, 451, 453, 482 Capacitances
333, 413 Gain control transistors
334, 414 FDs
335, 415 Transfer transistors
336, 418 Photodiodes
337, 419 Discharge transistors
340 Differential input circuit
350 Voltage conversion circuit
360 Positive feedback circuit
370 Data storage section
380, 385 Latch control circuits
386 Composite gate
387, 532 NAND gates
390 Latch circuit
400 W pixel
422 Logarithmic response section
430 Address event detection section
440 Buffer
450 Differential circuit
460 Comparator
470 AER logic circuit
500 Time-of-day code transfer section
510 Cluster
520 Unit block
525, 526 Buffers
530 Buffer circuit
600 Row arbiter
610, 650 to 654 Arbiter block
710 Previous stage latch circuit
720 Succeeding stage latch circuit
12101 to 12104 Imaging sections

What is claimed is:

1. A light detecting device, comprising:
a pixel array including:
a first pixel that includes a photoelectric conversion section, wherein the first pixel is configured to output a first analog signal and a second analog signal;
a first analog-digital converter configured to convert the first analog signal into a first digital signal;
a second analog-digital converter configured to convert the second analog signal into a second digital signal, wherein a resolution of the first digital signal is different from a resolution of the second digital signal; and
a second pixel different from the first pixel, wherein the second pixel includes only one analog-digital converter.

2. The light detecting device of claim 1, wherein
the photoelectric conversion section is configured to convert light into charge,
the first analog-digital converter has a lower resolution than the second analog-digital converter,
the first analog-digital converter is further configured to detect, as an address event, that a variation in an amount of the charge has exceeded a threshold value, and
the detection is based on the first analog signal.

3. The light detecting device of claim 1, wherein
the photoelectric conversion section is configured to convert light into charge, and
the first pixel further includes:
a current-voltage conversion section configured to generate the first analog signal by current-voltage conversion of a photocurrent that flows through the photoelectric conversion section;
a discharge transistor configured to discharge the charge from the photoelectric conversion section based on a start of an exposure period;
a floating diffusion layer;
a transfer transistor configured to transfer the charge from the photoelectric conversion section to the floating diffusion layer based on an end of the exposure period, wherein the floating diffusion layer is configured to accumulate the transferred charge; and
an amplifying transistor configured to amplify a voltage in the floating diffusion layer and output the amplified voltage as the second analog signal.

4. The light detecting device of claim 3, wherein
one of the first analog-digital converter or the second analog-digital converter is further configured to connect to a terminal having a ground potential,
the first pixel further includes a board that includes the floating diffusion layer and the photoelectric conversion section, and
the board is at a potential lower than the ground potential.

5. The light detecting device of claim 3, wherein
the first pixel further includes a reset transistor configured to initialize the voltage of the floating diffusion layer to a reset level before the end of the exposure period,
the first pixel is further configured to output, as a pixel signal, one of a signal level or the reset level,
the signal level is based on the transferred charge,
the first digital signal and the second digital signal include reset data and signal data,
the reset data is based on analog-digital conversion of the reset level, and
the signal data is based on the analog-digital conversion of the signal level.

6. The light detecting device of claim 5, further comprising a correlated double sampling circuit configured to:
detect a difference between the reset data and the signal data; and
output the difference as pixel data.

7. The light detecting device of claim 6, wherein the first analog-digital converter and the second analog-digital converter are further configured to:
hold the reset data; and
output the reset data and the signal data in sequence to the correlated double sampling circuit based on the analog-digital conversion of the signal level.

8. The light detecting device of claim 6, wherein
the pixel signal includes a first reset level, a second reset level, a first signal level, and a second signal level, each of the first analog-digital converter and the second analog-digital converter includes:
a comparison section configured to:
compare a reference signal having a slope and the pixel signal, and
output a result of the comparison; and
a data storage section configured to store data including the result of the comparison as one of the first digital signal or the second digital signal, and
an inclination of the slope for comparison of a set of the second reset level and the first signal level is flatter than an inclination of the slope for comparison of a set of the first reset level and the second signal level.

9. The light detecting device of claim 8, further comprising a drive circuit configured to:
cause the first pixel to generate the first reset level and the second signal level at a first sensitivity; and
cause the first pixel to generate the second reset level and the first signal level at a second sensitivity different from the first sensitivity.

10. The light detecting device of claim 1, wherein
the first analog-digital converter has a lower resolution than the second analog-digital converter, and
the first analog-digital converter includes:
a differential circuit configured to hold a voltage;
a comparator configured to:
compare the held voltage and a threshold value that is in a specific range; and
output a result of the comparison; and
a handshake circuit configured to:
send a request based on the result of the comparison; and
initialize the differential circuit based on reception of a first acknowledgement to the request.

11. The light detecting device of claim 10, further comprising an arbiter configured to:
arbitrate the request; and
return a second acknowledgement based on a result of the arbitration.

12. The light detecting device of claim 1, further comprising:
a test circuit configured to:
output a time-of-day code having a specific number of bits to one of the first analog-digital converter or the second analog-digital converter; and
detect a fault in each bit of the time-of-day code; and
a redundant circuit configured to connect a spare signal line in place of a bit line, wherein
the bit line corresponds to a faulty bit in the time-of-day code, and
the first analog-digital converter is further configured to convert the first analog signal into the first digital signal based on the time-of-day code.

13. The light detecting device of claim 1, further comprising:
a first data storage section configured to hold the first digital signal;
a second data storage section configured to hold the second digital signal;
a first bidirectional buffer configured to output the first digital signal, transferred from the first data storage section via a first local bit line, to a main bit line based on a first control signal;
a second bidirectional buffer configured to output the second digital signal, transferred from the second data storage section via a second local bit line, to the main bit line based on a second control signal;
a column processing section configured to read out the first digital signal and the second digital signal via the main bit line; and
a drive circuit configured to:
control the first data storage section to transfer the first digital signal to the first bidirectional buffer via the first local bit line; and
control the second data storage section to transfer the second digital signal to the second bidirectional buffer via the second local bit line before completion of the readout of the first digital signal.

14. An imaging apparatus, comprising:
a pixel array including:
a first pixel that includes a photoelectric conversion section, wherein the first pixel is configured to output a first analog signal and a second analog signal;
a first analog-digital converter configured to convert the first analog signal into a first digital signal;
a second analog-digital converter configured to convert the second analog signal into a second digital signal, wherein a resolution of the first digital signal is different from a resolution of the second digital signal; and
a second pixel different from the first pixel, wherein the second pixel includes only one analog-digital converter; and
a digital signal processing section configured to process image data that includes the first digital signal and the second digital signal.

15. A control method, comprising:
in a light detecting device that includes a pixel array, wherein the pixel array includes a first pixel, a second pixel different from the first pixel, a first analog-digital converter, and a second analog-digital converter, the second pixel includes only one analog-digital converter, and the first pixel includes a photoelectric conversion section:
outputting, by the first pixel, a first analog signal and a second analog signal;
converting, by the first analog-digital converter, the first analog signal into a first digital signal; and
converting, by the second analog-digital converter, the second analog signal into a second digital signal, wherein a resolution of the first digital signal is different from a resolution of the second digital signal.

* * * * *